(12) United States Patent
Ganguli et al.

(10) Patent No.: US 8,815,724 B2
(45) Date of Patent: Aug. 26, 2014

(54) PROCESS FOR FORMING COBALT-CONTAINING MATERIALS

(75) Inventors: Seshadri Ganguli, Sunnyvale, CA (US); Schubert S. Chu, San Francisco, CA (US); Mei Chang, Saratoga, CA (US); Sang-ho Yu, Cupertino, CA (US); Kevin Moraes, Fremont, CA (US); See-Eng Phan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/452,237

(22) Filed: Apr. 20, 2012

(65) Prior Publication Data

US 2012/0264291 A1   Oct. 18, 2012

Related U.S. Application Data

(63) Continuation of application No. 11/733,929, filed on Apr. 11, 2007, now Pat. No. 8,110,489, and a continuation of application No. 13/014,656, filed on Jan. 26, 2011, now abandoned.

(60) Provisional application No. 60/791,366, filed on Apr. 11, 2006, provisional application No. 60/863,939, filed on Nov. 1, 2006.

(51) Int. Cl.
*H01L 21/28* (2006.01)
*H01L 21/44* (2006.01)

(52) U.S. Cl.
USPC .................... 438/583; 438/582; 257/762

(58) Field of Classification Search
USPC .......... 257/761, 774, 762; 438/575, 622, 637, 438/649, 664, 680, 710, 583
See application file for complete search history.

(56) References Cited

U.S. PATENT DOCUMENTS 6,346,477 B1    2/2002   Kaloyeros et al.
6,444,263 B1 *  9/2002   Paranjpe et al. ............. 427/250
(Continued)

FOREIGN PATENT DOCUMENTS

| CN | 1314225 | 9/2001 |
| CN | 101159253 A | 4/2008 |
| TW | 200746268 | 12/2007 |

OTHER PUBLICATIONS

Notice of First Office Action dated Jan. 3, 2011 for Korean Patent Application No. 10-2008-7027610.

(Continued)

*Primary Examiner* — Errol Fernandes
(74) *Attorney, Agent, or Firm* — Patterson & Sheridan, LLP

(57) ABSTRACT

Embodiments of the invention described herein generally provide methods and apparatuses for forming cobalt silicide layers, metallic cobalt layers, and other cobalt-containing materials. In one embodiment, a method for forming a cobalt silicide containing material on a substrate is provided which includes exposing a substrate to at least one preclean process to expose a silicon-containing surface, depositing a cobalt silicide material on the silicon-containing surface, depositing a metallic cobalt material on the cobalt silicide material, and depositing a metallic contact material on the substrate. In another embodiment, a method includes exposing a substrate to at least one preclean process to expose a silicon-containing surface, depositing a cobalt silicide material on the silicon-containing surface, expose the substrate to an annealing process, depositing a barrier material on the cobalt silicide material, and depositing a metallic contact material on the barrier material.

10 Claims, 24 Drawing Sheets

(56) References Cited

U.S. PATENT DOCUMENTS

| | | | |
|---|---|---|---|
| 7,202,162 B2* | 4/2007 | Lin et al. | 438/637 |
| 2002/0009892 A1* | 1/2002 | Cohen et al. | 438/710 |
| 2003/0022487 A1 | 1/2003 | Yoon et al. | |
| 2003/0029715 A1 | 2/2003 | Yu et al. | |
| 2003/0228745 A1 | 12/2003 | Lur et al. | |
| 2004/0203233 A1 | 10/2004 | Kang et al. | |
| 2004/0211665 A1 | 10/2004 | Yoon et al. | |
| 2005/0014365 A1* | 1/2005 | Moon et al. | 438/680 |
| 2005/0064703 A1 | 3/2005 | Kondo et al. | |
| 2006/0006542 A1* | 1/2006 | Lee | 257/761 |
| 2006/0033678 A1 | 2/2006 | Lubomirsky et al. | |
| 2006/0211228 A1* | 9/2006 | Matsuda | 438/575 |
| 2006/0276020 A1 | 12/2006 | Yoon et al. | |
| 2007/0202254 A1 | 8/2007 | Ganguli et al. | |
| 2008/0268635 A1 | 10/2008 | Yu et al. | |
| 2008/0268636 A1 | 10/2008 | Yoon et al. | |
| 2009/0004850 A1 | 1/2009 | Ganguli et al. | |
| 2009/0053426 A1 | 2/2009 | Lu et al. | |

OTHER PUBLICATIONS

Booyong S. Lim et al., "Atomic Layer Deposition of Transition Metals", Nature Publishing Group, Oct. 26, 2003, pp. 749-754.

Notice of First Office Action dated Dec. 5, 2013 for Chinese Patent Application No. 200980134172.5.

* cited by examiner

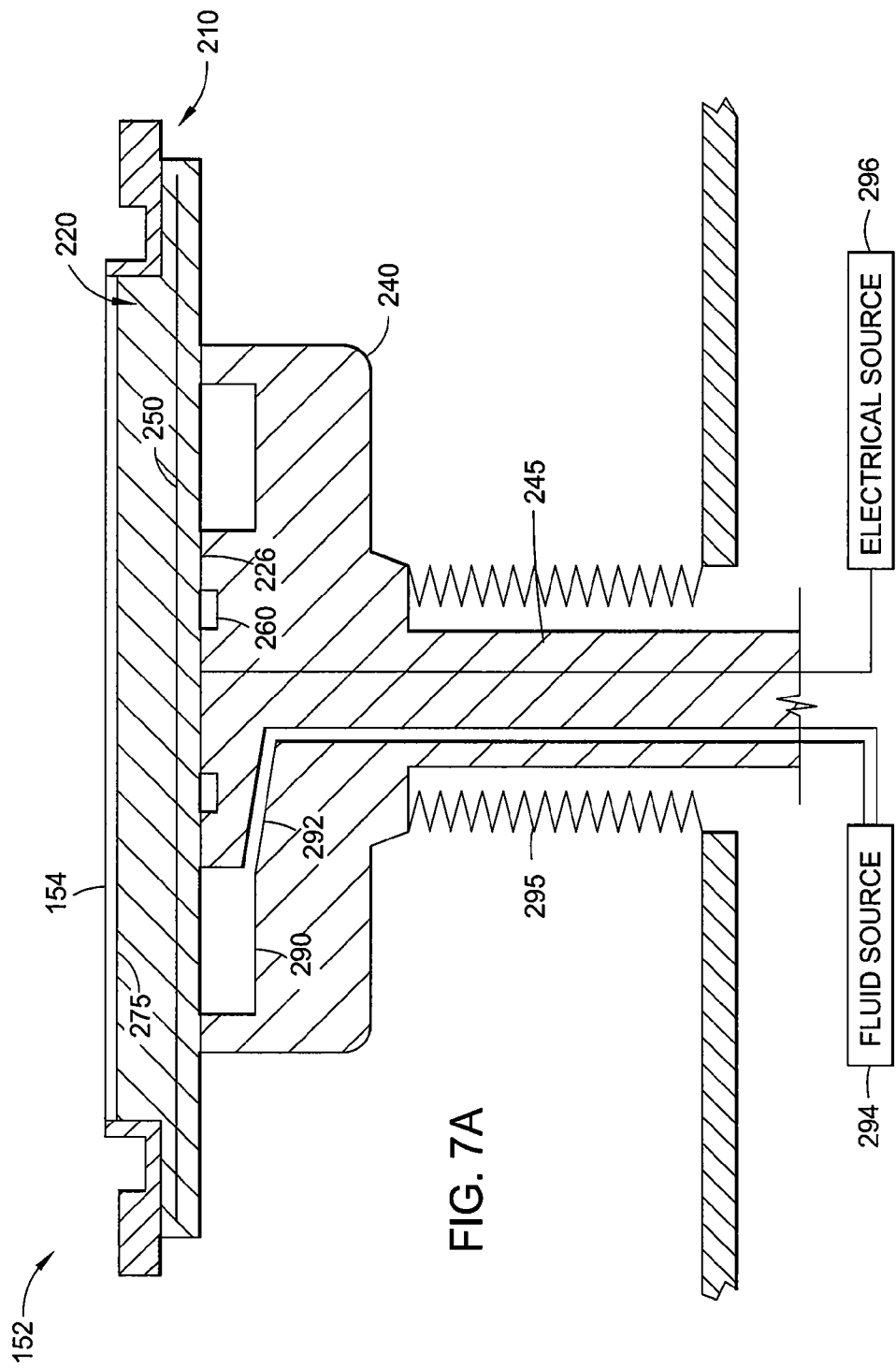

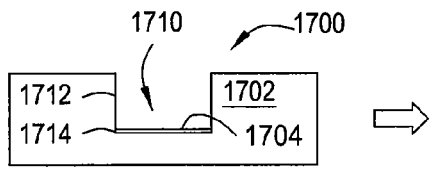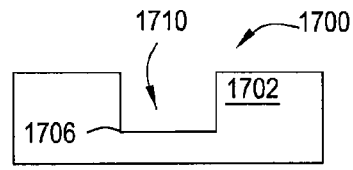
FIG. 17A    FIG. 17B
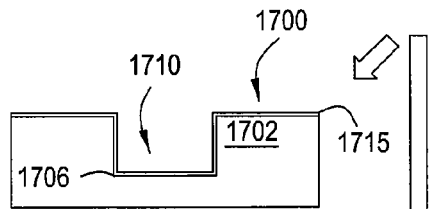
FIG. 17C
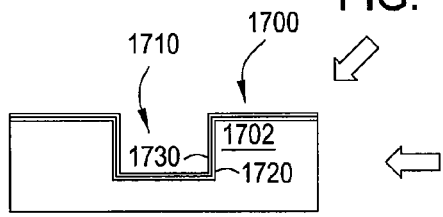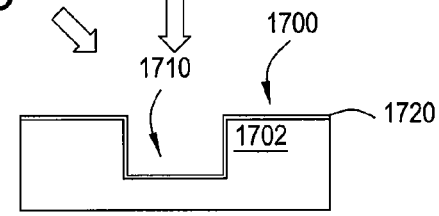
FIG. 17E    FIG. 17D
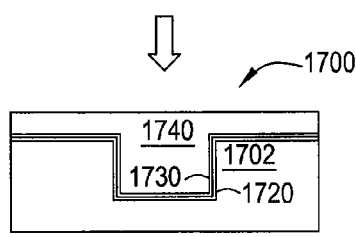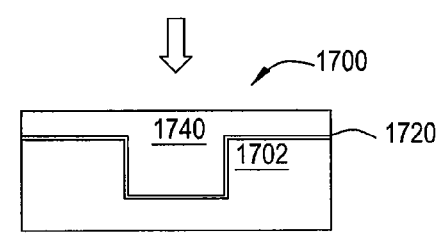
FIG. 17F    FIG. 17H
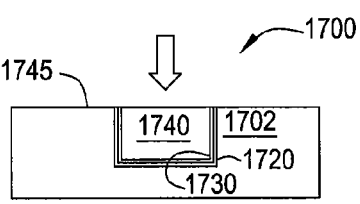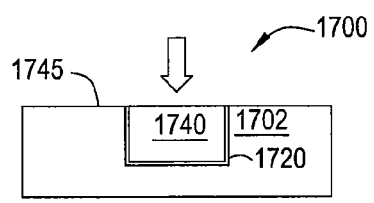
FIG. 17G    FIG. 17I

PROCESS FOR FORMING COBALT-CONTAINING MATERIALS

CROSS-REFERENCE TO RELATED APPLICATIONS

This application is a continuation of U.S. patent application Ser. No. 13/014,656 filed Jan. 26, 2011, which is a continuation of U.S. patent application Ser. No. 11/733,929, filed Apr. 11, 2007, which claims benefit of U.S. Patent Application No. 60/791,366, filed Apr. 11, 2006, and U.S. Patent Application No. 60/863,939, filed Nov. 1, 2006. The above-referenced patent applications are herein incorporated by reference.

This application is related to U.S. patent application Ser. No. 11/456,073, filed Jul. 6, 2006, now issued as U.S. Pat. No. 7,416,979, which is a continuation of U.S. patent application Ser. No. 10/845,970, filed May 14, 2004, and now abandoned, which is a continuation of U.S. patent application Ser. No. 10/044,412, filed Jan. 9, 2002, and issued as U.S. Pat. No. 6,740,585, which is a continuation-in part of U.S. patent application Ser. No. 09/916,234, filed Jul. 25, 2001, and now abandoned.

BACKGROUND OF THE INVENTION

1. Field of the Invention

The invention relates to the fabrication of semiconductor and other electronic devices and to methods for the deposition of materials (e.g., cobalt containing) on a substrate.

2. Description of the Related Art

Recent improvements in circuitry of ultra-large scale integration (ULSI) on semiconductor substrates indicate that future generations of semiconductor devices will require sub-quarter micron multi-level metallization. The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die as features decrease below 0.13 µm in size.

ULSI circuits include metal oxide semiconductor (MOS) devices, such as complementary metal oxide semiconductor (CMOS) field effect transistors (FETs). The transistors can include semiconductor gates disposed between source and drain regions. In the formation of integrated circuit structures, and particularly in the formation of MOS devices using polysilicon gate electrodes, it has become the practice to provide a metal silicide layer over the polysilicon gate electrode, and over the source and drain regions of the silicon substrate, to facilitate lower resistance and improve device performance by electrically connecting the source and drain regions to metal interconnects.

One important processing technique currently used in CMOS processing technology is the Self-Aligned Silicidation (salicide) process of refractory metals such as titanium and cobalt. In a salicide process using cobalt, for example, the source and drain and polysilicon gate resistances are reduced by forming a high conductivity overlayer and the contact resistance is reduced by increasing the effective contact area of the source and drain with subsequently formed metal interconnects. Salicide processing technology seeks to exploit the principle that a refractory metal such as cobalt deposited on a patterned silicon substrate will selectively react with exposed silicon under specific processing conditions, and will not react with adjacent materials, such as silicon oxide material.

For example, a layer of cobalt is sputtered onto silicon, typically patterned on a substrate surface, and then subjected to a thermal annealing process to form cobalt silicide. Unreacted cobalt, such as cobalt deposited outside the patterned silicon or on a protective layer of silicon oxide, can thereafter be selectively etched away. The selective etching of cobalt silicide will result in maskless, self-aligned formation of a low-resistivity refractory metal silicide in source, drain, and polysilicon gate regions formed on the substrate surface and in interconnecting conductors of the semiconductor device. After the etch process, further processing of the substrate may occur, such as additional thermal annealing, which may be used to further reduce the sheet resistance of the silicide material and complete formation of cobalt silicide.

However, it has been difficult to integrate cobalt silicide processes into conventional manufacturing equipment. Current processing systems performing cobalt silicide processes require transfer of the substrate between separate chambers for the deposition and annealing process steps. Transfer between chambers may expose the substrate to contamination and potential oxidation of silicon or cobalt deposited on the substrate surface.

Oxide formation on the surface of the substrate can result in increasing the resistance of silicide layers as well as reducing the reliability of the overall circuit. For example, oxidation of the deposited cobalt material may result in cobalt agglomeration and irregular growth of the cobalt silicide layer. The agglomeration and irregular growth of the cobalt silicide layer may result in device malformation, such as source and drain electrodes having different thicknesses and surface areas. Additionally, excess cobalt silicide growth on substrate surface may form conductive paths between devices, which may result in short circuits and device failure.

One solution to limiting cobalt and silicon contamination has been to sputter a capping film of titanium and/or titanium nitride on the cobalt and silicon film prior to transferring the substrate between processing systems. The capping film is then removed after annealing the substrate and prior to further processing of the substrate. However, the addition of titanium and titanium nitride deposition and removal processes increases the number of processing steps required for silicide formation, thereby reducing process efficiency, increasing processing complexity, and reducing substrate throughput.

ULSI circuits also include the formation of interconnects or contacts between conductive layers, such as the cobalt silicide layer described above and a copper feature. Interconnects or contacts generally comprise a feature definition formed in a dielectric material, such as silicon oxide, a barrier layer deposited on the feature definition, and a metal layer fill or "plug" of the feature definition. Titanium and titanium nitride films have been used as barrier layer material for the metal layer, such as tungsten, and the films are generally deposited by a physical vapor deposition technique. However, deposition of titanium over silicon surfaces presents the problem of titanium silicide formation.

Titanium silicide has been observed to agglomerate, which detrimentally affects subsequently deposited materials. Also, titanium silicide exhibits a radical increase in sheet resistance as feature sizes decrease below 0.17 µm, which detrimentally affects the conductance of the feature being formed. Further, titanium silicide has an insufficient thermal stability during processing of the substrate at temperatures of about 400° C. or higher, which can result in interlayer diffusion and detrimentally affect device performance.

Additionally, titanium and titanium nitride PVD deposition often occur at extremely low processing pressures, i.e., less than about $5\times10^{-3}$ Torr, compared with CVD deposition of materials such as tungsten, which may be deposited as high as about 300 Torr. This results in difficult integration of PVD and CVD processes in the same system. This has resulted in many manufactures using separate systems for the PVD titanium and titanium nitride deposition and the CVD tungsten deposition. The increase in the number of systems results in increased production costs, increased production times, and exposes the processed substrate to contamination when transferred between systems.

Therefore, there is a need for a method and apparatus for forming barrier layers and silicide materials on a substrate while reducing processing complexity and improving processing efficiency and throughput.

SUMMARY OF THE INVENTION

Embodiments of the invention described herein generally provide methods and apparatuses for forming cobalt silicide layers, metallic cobalt layers, and other cobalt-containing layers using deposition processes, annealing processes, or combinations thereof. In one embodiment, a method for forming a cobalt silicide containing material on a substrate is provided which includes exposing a substrate to at least one preclean process to expose a silicon-containing surface, depositing a cobalt silicide material on the silicon-containing surface, depositing a metallic cobalt material on the cobalt silicide material, and depositing a metallic contact material on the substrate. In another embodiment, a method for forming a cobalt silicide containing material on a substrate is provided which includes exposing a substrate to at least one preclean process to expose a silicon-containing surface, depositing a cobalt silicide material on the silicon-containing surface, expose the substrate to an annealing process, depositing a barrier material on the cobalt silicide material, and depositing a metallic contact material on the barrier material.

The cobalt silicide material may be deposited by exposing the substrate to a cobalt precursor and a silicon precursor during a chemical vapor deposition process or an atomic layer deposition process. The cobalt silicide material may contain a silicon/cobalt atomic ratio of greater than 0.5, such as within a range from about 1 to about 2. The metallic contact material may contain tungsten, copper, aluminum, alloys thereof, or combinations thereof. In one example, the deposition of the metallic contact material includes forming a seed layer and forming a bulk layer thereon. The seed layer and the bulk layer may each contain tungsten. In other examples, a barrier material may be deposited on the metallic cobalt material and the metallic contact material is deposited on the barrier layer. The barrier material may contain cobalt, tantalum, tantalum nitride, titanium, titanium nitride, tungsten, tungsten nitride, alloys thereof, or derivatives thereof.

In another embodiment, the cobalt precursor may be tricarbonyl allyl cobalt, cyclopentadienyl cobalt bis(carbonyl), methylcyclopentadienyl cobalt bis(carbonyl), ethylcyclopentadienyl cobalt bis(carbonyl), pentmethylcyclopentadienyl cobalt bis(carbonyl), dicobalt octa(carbonyl), nitrosyl cobalt tris(carbonyl), bis(cyclopentadienyl)cobalt, (cyclopentadienyl)cobalt (cyclohexadienyl), cyclopentadienyl cobalt (1,3-hexadienyl), (cyclobutadienyl)cobalt (cyclopentadienyl), bis(methylcyclopentadienyl)cobalt, (cyclopentadienyl)cobalt (5-methylcyclopentadienyl), bis(ethylene)cobalt (pentamethylcyclopentadienyl), derivatives thereof, complexes thereof, plasmas thereof, or combinations thereof. In one example, the cobalt precursor is cyclopentadienyl cobalt bis(carbonyl). In other examples, the cobalt precursor may have the general chemical formula $(CO)_xCo_yL_z$, wherein X is 1, 2, 3, 4, 5, 6, 7, 8, 9, 10, 11, or 12; Y is 1, 2, 3, 4, or 5; Z is 1, 2, 3, 4, 5, 6, 7, or 8; and L is a ligand independently selected from the group consisting of cyclopentadienyl, alkylcyclopentadienyl, methylcyclopentadienyl, pentamethylcyclopentadienyl, pentadienyl, alkylpentadienyl, cyclobutadienyl, butadienyl, allyl, ethylene, propylene, alkenes, dialkenes, alkynes, nitrosyl, ammonia, derivatives thereof, or combinations thereof. The silicon precursor may be silane, disilane, derivatives thereof, plasmas thereof, or combinations thereof.

In another example, the substrate is heated to a temperature of at least 100° C. during the chemical vapor deposition process or the atomic layer deposition process, preferably, to a temperature within a range from about 300° C. to about 400° C. The substrate may be heated to a temperature of at least about 600° C. within an annealing chamber during the annealing process. The cobalt silicide material may be exposed to a plasma process prior to depositing the metallic cobalt material. In other example, the plasma process may contain hydrogen gas and the plasma may be ignited by a radio frequency of about 13.56 MHz.

In another embodiment, the cobalt silicide material may be deposited during the atomic layer deposition process by conducting a deposition cycle to deposit a cobalt silicide layer, and repeating the deposition cycle to form a plurality of the cobalt silicide layers, wherein the deposition cycle contains exposing the substrate to a silicon-containing reducing gas comprising the silicon precursor while sequentially exposing the substrate to the cobalt precursor and a plasma (e.g., hydrogen plasma). In some examples, the substrate, the cobalt silicide material, the metallic cobalt material, or the barrier material may be exposed to the silicon-containing reducing gas during a pre-soak process or a post-soak process. The substrate may be exposed to a plasma treatment during the pre-soak process or the post-soak process. In some examples, the cobalt silicide material and the metallic cobalt material may be deposited in the same processing chamber.

In another embodiment, a method for forming a metallic silicide containing material on a substrate is provided which includes exposing a substrate to at least one preclean process to expose a silicon-containing surface, depositing a metallic silicide material on the silicon-containing surface during a chemical vapor deposition process or an atomic layer deposition process, expose the substrate to an annealing process, depositing a barrier material on the metallic silicide material, and depositing a tungsten contact material on the barrier material. The metallic silicide material may contain at least one element of cobalt, nickel, platinum, palladium, rhodium, alloys thereof, or combinations thereof. The examples provide that the substrate, the metallic silicide material, or the barrier material may be exposed to a silicon-containing reducing gas during a pre-soak process or a post-soak process. In some examples, the substrate may be exposed to a plasma treatment during the pre-soak process or the post-soak process.

In another embodiment, a cobalt silicide layer is deposited on a silicon-containing substrate surface during a vapor deposition process and a metallic cobalt layer is deposited thereon by another vapor deposition process. In one aspect, the cobalt silicide layer is deposited by co-flowing a cobalt precursor and a silicon precursor during a CVD process. Thereafter, the flow of silicon precursor into the CVD chamber is stopped while the flow of the cobalt precursor is continued and a metallic cobalt material is deposited on the cobalt silicide material. A reductant, such as hydrogen, may be co-flowed with the cobalt precursor. Alternatively, the cobalt precursor may be reduced by a thermal decomposition process or a plasma process during the CVD process.

In another embodiment, a metallic cobalt layer is deposited on the silicon-containing substrate surface, the substrate is exposed to an annealing process to form a cobalt silicide layer by a salicide process, and a second metallic cobalt layer is deposited thereon.

A substrate may be exposed to at least one preclean process during embodiments described herein. In one example, the preclean process includes exposing the substrate to a preclean gas containing an argon plasma, such as a Ar+ PC. In another example, the preclean process includes exposing the substrate to a plasma etch process for removing native oxides on the substrate surface using an ammonia ($NH_3$) and nitrogen trifluoride ($NF_3$) gas mixture performed within a plasma etch processing chamber, such as the SICONI™ preclean process, available from Applied Materials, Inc., located in Santa Clara, Calif. In another example, the substrate is exposed to a wet clean process, such as a buffered oxide etch (BOE) process, a SC1 process, a SC2 process, or a HF-last process.

In one embodiment, a cobalt silicide material is deposited on the substrate during an ALD process or a CVD process and a metallic cobalt material is deposited on the cobalt silicide material during another ALD process or another CVD process. The substrate may be exposed to an annealing process in the deposition chamber or in an annealing chamber. A metallic contact material (e.g., W, Cu, Al, or alloys thereof) is deposited on the substrate and the substrate may be exposed to a planarization process. The metallic contact material may be deposited in a single deposition process or in several deposition processes, such as to form a seed layer, a bulk layer, a fill layer, or combinations thereof. In another embodiment, a barrier layer may be deposited on the metallic cobalt material prior to depositing the metallic contact material.

In one example, the cobalt silicide material and the metallic cobalt material are deposited in the same ALD chamber or CVD chamber. In another example, the cobalt silicide material and the metallic cobalt material are deposited and the substrate is annealed in the same ALD chamber or CVD chamber. In another example, the cobalt silicide material and the metallic cobalt material are deposited in the same ALD chamber or CVD chamber and the substrate is annealed in an annealing chamber. In another example, the cobalt silicide material and the metallic cobalt material are deposited in different ALD chambers or CVD chambers and the substrate is annealed in an annealing chamber. In another example, the cobalt silicide material is deposited in an ALD chamber or a CVD chamber, the substrate is annealed in an annealing chamber, and the metallic cobalt material is deposited in another ALD chamber or CVD chamber. In another example, the cobalt silicide material is deposited in an ALD chamber or a CVD chamber, the metallic cobalt material is deposited in another ALD chamber or CVD chamber, and the substrate is annealed in an annealing chamber.

In other embodiments, the cobalt silicide material and the metallic cobalt material are deposited in the same ALD chamber or CVD chamber, the metallic contact material is deposited on the metallic cobalt material, the substrate is exposed to a planarization process, and the substrate is annealed in an annealing chamber. In another example, the cobalt silicide material and the metallic cobalt material are deposited in the same ALD chamber or CVD chamber, the metallic contact material is deposited on the metallic cobalt material, the substrate is annealed in an annealing chamber, and the substrate is exposed to a planarization process.

In another embodiment, a first metallic cobalt material is deposited on a silicon-containing surface of the substrate within an ALD chamber or a CVD chamber. The substrate is exposed to an annealing process within the ALD or CVD chamber to form a cobalt silicide material by a salicide process. Subsequently, a second metallic cobalt material is deposited on the cobalt silicide material within a different ALD or CVD chamber.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7A illustrates a cross-sectional view of one embodiment of a pedestal for annealing a substrate;

FIGS. 17A-17I depict schematic cross-sectional views of a substrate during different stages of fabrication as described by embodiments herein;

DETAILED DESCRIPTION OF THE PREFERRED EMBODIMENT

Embodiments of the invention described herein provide methods and apparatus for forming cobalt silicide materials, metallic cobalt materials, and other cobalt-containing materials within a deposition chamber. A processing system for depositing and forming material on a substrate may contain at least one preclean chamber, at least one deposition chamber, and at least one annealing chamber. Generally, the system contains at least one CVD chamber and/or at least one ALD chamber. A silicon-containing surface is exposed on the substrate during a preclean process. Subsequently, in one embodiment, a cobalt silicide material is deposited, a metallic cobalt material is deposited, an optional barrier layer may be deposited, and a metallic contact material is deposited on the substrate. The substrate is exposed to at least one annealing process prior to, during, subsequently to any of the deposition processes, as well as, subsequent a planarization process.

Figure 1:
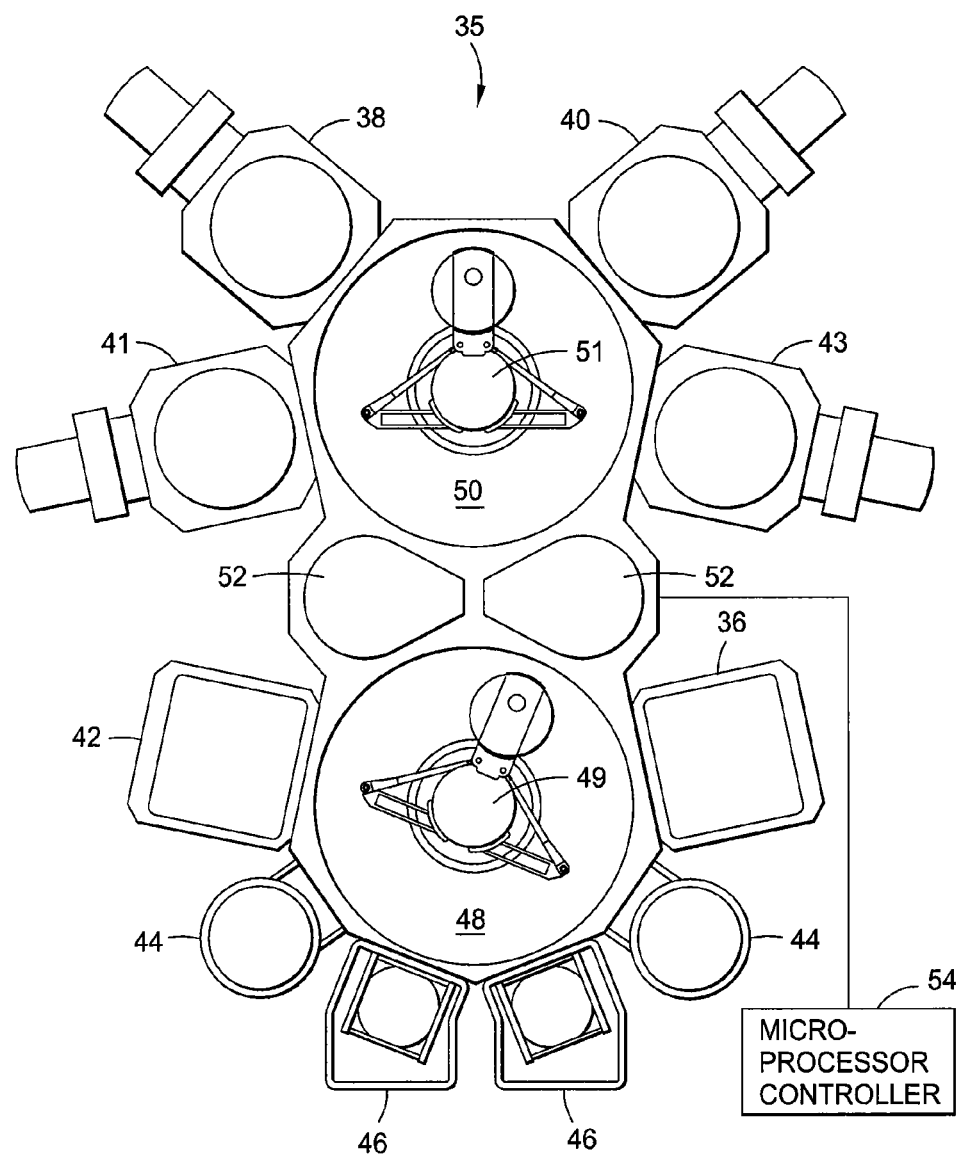
FIG. 1 illustrates a schematic top view of an integrated multi-chamber apparatus as described by embodiments herein.

FIG. 1 shows an integrated multi-chamber substrate processing system suitable for performing at least one embodiment of the deposition and annealing processes described herein. The deposition and annealing processes may be performed in a multi-chamber processing system or cluster tool having at least one ALD chamber, at least one CVD chamber, at least one PVD chamber, or at least one annealing chamber disposed thereon. A processing platform that may be used to during processes described herein is an ENDURA® processing platform commercially available from Applied Materials, Inc., located in Santa Clara, Calif.

FIG. 1 is a schematic top view of one embodiment of a processing platform system 35 including two transfer chambers 48, 50, transfer robots 49, 51, disposed within transfer chambers 48, 50 respectfully, and a plurality of processing chambers 36, 38, 40, 41, 42 and 43, disposed on the two transfer chambers 48, 50. The first transfer chamber 48 and the second transfer chamber 50 are separated by pass-through chambers 52, which may comprise cool-down or pre-heating chambers. Pass-through chambers 52 also may be pumped down or ventilated during substrate handling when the first transfer chamber 48 and the second transfer chamber 50 operate at different pressures. For example, the first transfer chamber 48 may operate at a pressure within a range from about 100 milliTorr to about 5 Torr, such as about 400 milliTorr, and the second transfer chamber 50 may operate at a pressure within a range from about $1\times10^{-5}$ Torr to about $1\times10^{-8}$ Torr, such as about $1\times10^{-7}$ Torr. Processing platform system 35 is automated by programming a microprocessor controller 54.

The first transfer chamber 48 is coupled with two degas chambers 44, two load lock chambers 46, a reactive preclean chamber 42 and chamber 36, such as an ALD process chamber or a PVD chamber, preferably a long throw physical vapor deposition (PVD) chamber and the pass-through chambers 52. The preclean chamber 42 may be a PreClean II chamber, commercially available from Applied Materials, Inc., of Santa Clara, Calif. Substrates (not shown) are loaded into processing platform system 35 through load-lock chambers 46. Thereafter, the substrates are sequentially degassed and cleaned in degas chambers 44 and the preclean chamber 42, respectively. The transfer robot 49 moves the substrate between the degas chambers 44 and the preclean chamber 42. The substrate may then be transferred into chamber 36, such as the ALD chamber or the long throw PVD chamber for deposition of a material thereon.

The second transfer chamber 50 is coupled to a cluster of process chambers 38, 40, 41, and 43. In one example, chambers 38 and 40 may be ALD chambers for depositing materials, such as cobalt silicide, metallic cobalt, or tungsten, as desired by the operator. In another example, chambers 38 and 40 may be CVD chambers for depositing materials, such as tungsten, as desired by the operator. An example of a suitable CVD chamber includes WXZ™ chambers, commercially available from Applied Materials, Inc., located in Santa Clara, Calif. The CVD chambers may be adapted to deposit materials by ALD techniques as well as by conventional CVD techniques. Chambers 41 and 43 may be Rapid Thermal Annealing (RTA) chambers, or Rapid Thermal Process (RTP) chambers, that can anneal substrates at low or extremely low pressures. An example of an RTA chamber is a RADIANCE® chamber, commercially available from Applied Materials, Inc., Santa Clara, Calif. Alternatively, the chambers 41 and 43 may be WXZ™ deposition chambers capable of performing high temperature CVD deposition, annealing processes, or in situ deposition and annealing processes. The PVD processed substrates are moved from transfer chamber 48 into transfer chamber 50 via pass-through chambers 52. Thereafter, transfer robot 51 moves the substrates between one or more of the process chambers 38, 40, 41, and 43 for material deposition and annealing as required for processing.

RTA chambers (not shown) may also be disposed on the first transfer chamber 48 of processing platform system 35 to provide post deposition annealing processes prior to substrate removal from processing platform system 35 or transfer to the second transfer chamber 50.

While not shown, a plurality of vacuum pumps is disposed in fluid communication with each transfer chamber and each of the processing chambers to independently regulate pressures in the respective chambers. The pumps may establish a vacuum gradient of increasing pressure across the apparatus from the load lock chamber to the processing chambers.

Alternatively, a plasma etch chamber, such as a DPS® (decoupled plasma source) chamber manufactured by Applied Materials, Inc., of Santa Clara, Calif., may be coupled to processing platform system 35 or in a separate processing system for etching the substrate surface to remove unreacted metal after PVD metal deposition and/or annealing of the deposited metal. For example in forming cobalt silicide from cobalt and silicon material by an annealing process, the etch chamber may be used to remove unreacted cobalt material from the substrate surface. The invention also contemplates the use of other etch processes and apparatus, such as a wet etch chamber, used in conjunction with the process and apparatus described herein.

Figure 2:
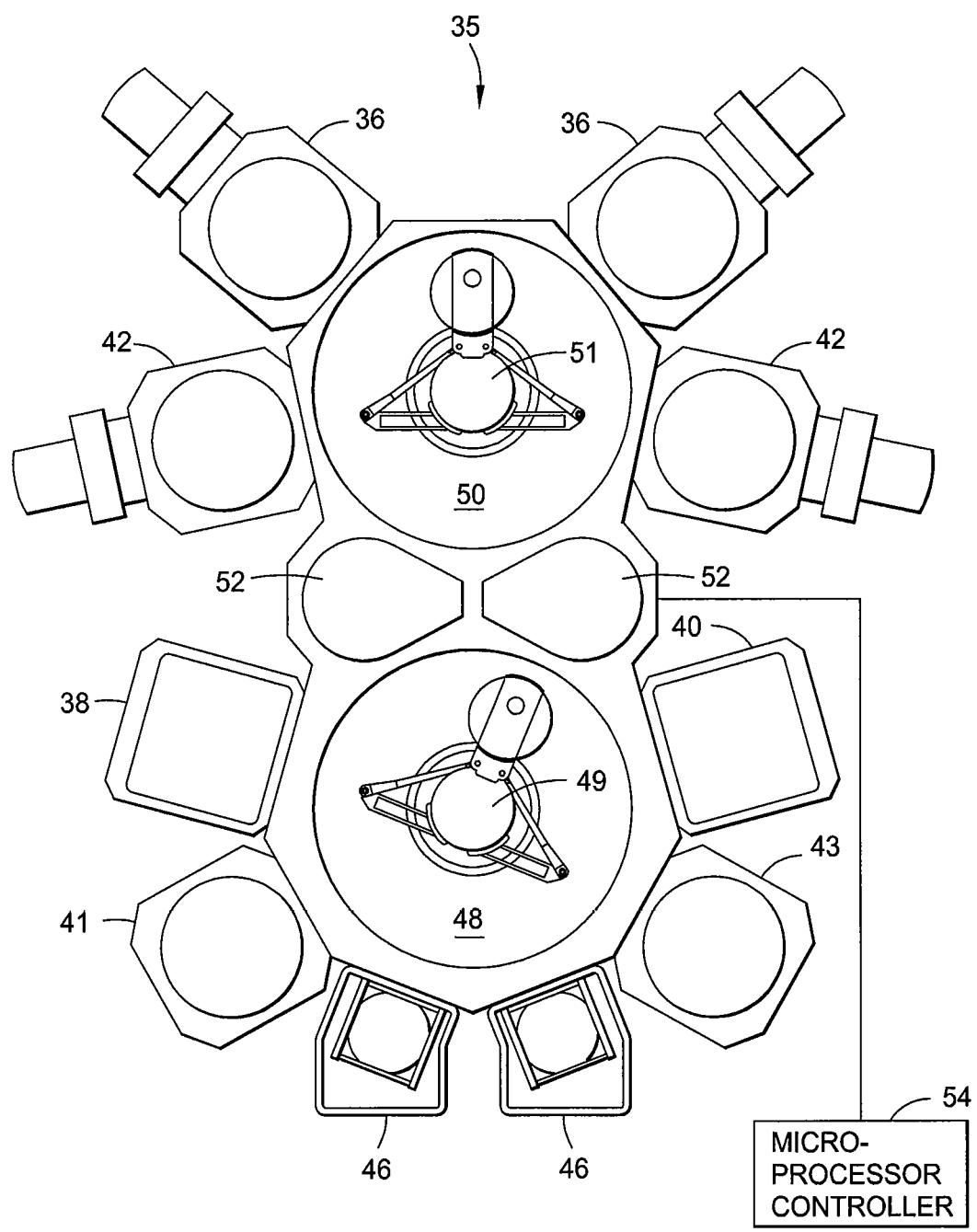
FIG. 2 illustrates a schematic top view of another integrated multi-chamber apparatus as described by embodiments herein.

FIG. 2 is a schematic top view of another embodiment of an integrated multi-chamber substrate processing system 35 suitable for performing at least one embodiment of the ALD, CVD, PVD, or annealing processes described herein. In one embodiment, the first transfer chamber 48 is coupled to a cluster of process chambers 38, 40, 41, and 43, two load lock chambers 46, and pass-through chambers 52. Chambers 41 and 43 may be a RTA chambers that can anneal substrates at low or extremely low pressures, such as the RADIANCE® chamber, and chambers 38 and 40 are ALD chambers or CVD chambers, such as WXZ™ chambers. The first transfer chamber 48 may operate at a pressure within a range from about $1 \times 10^{-5}$ Torr to about $1 \times 10^{-8}$ Torr, such as about $1 \times 10^{-7}$ Torr, and the second transfer chamber 50 may operate at a pressure within a range from about 100 milliTorr to about 5 Torr, such as about 400 milliTorr.

Alternatively, chambers 41 and 43 may be WXZ™ chambers capable of performing high temperature CVD deposition, annealing processes, or in situ deposition and annealing processes. The pass-through chambers 52 may additionally perform as degas chambers in addition to performing heating, cooling, and transporting functions.

The second transfer chamber 50 is coupled to reactive preclean chambers 42, one or more long throw physical vapor deposition (PVD) chambers 36, and pass-through chambers 52. The second transfer chamber 50 configuration allows for substrate precleaning, such as by a plasma clean method, and PVD deposition at a vacuum pressure of $1 \times 10^{-8}$ Torr prior to transfer to a higher pressure transfer chamber 48. The first transfer configuration allows higher pressure processing, such as annealing, compared to PVD processing, to be performed in the transfer chamber adjacent loadlocks 46 and prior to substrate removal. The higher pressure first transfer chamber 48 in this embodiment allows for reduced pump down times and reduced equipment costs compared to configuration of processing platform system 35 using a near vacuum pressure, such as at a pressure within a range from about $1 \times 10^{-5}$ Torr to about $1 \times 10^{-8}$ Torr, at the first transfer chamber 48.

Figure 3:
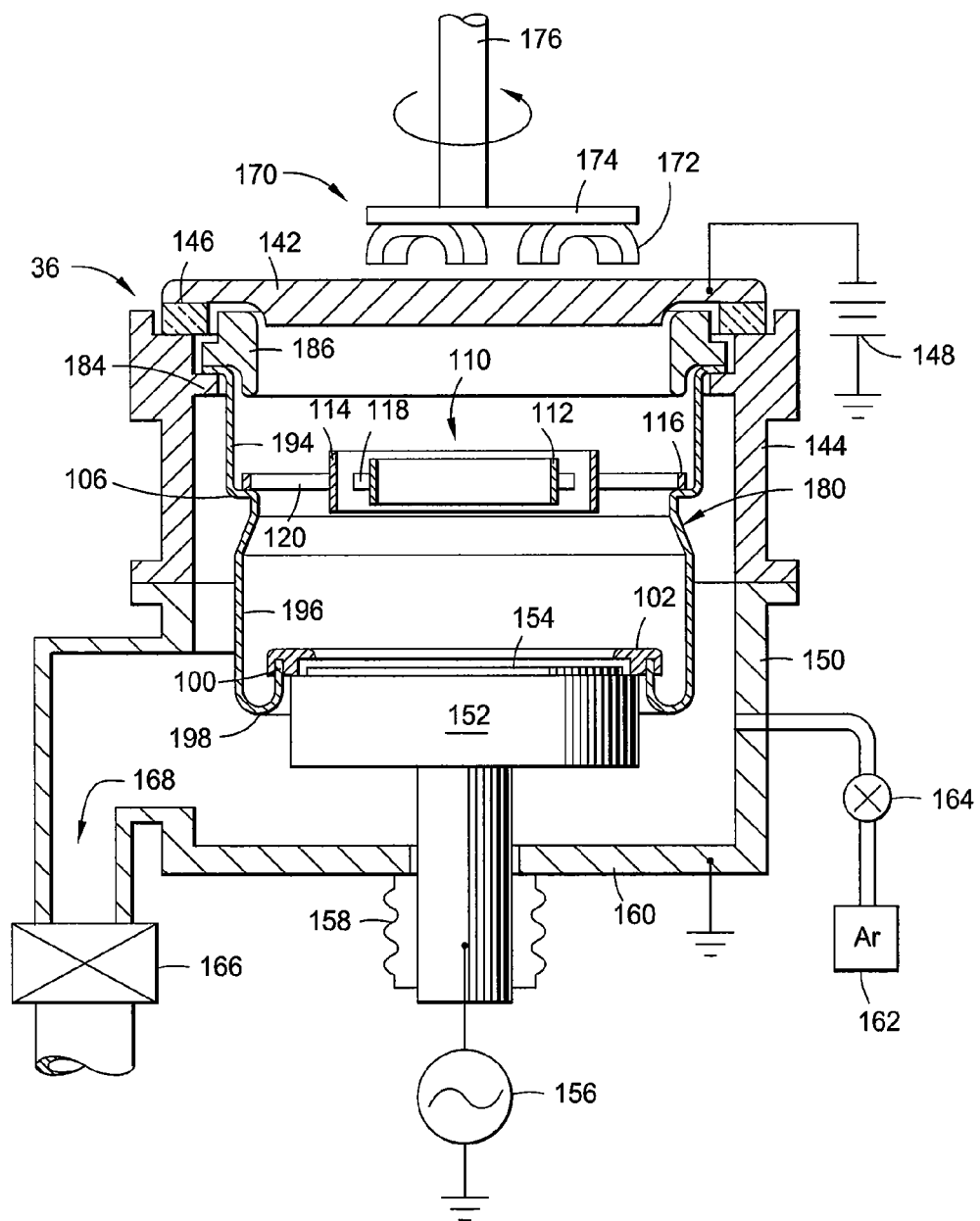
FIG. 3 illustrates a cross-sectional view of one embodiment of a sputtering chamber included within the invention.

FIG. 3 illustrates one embodiment of a long throw physical vapor deposition chamber 36. Example of suitable long throw PVD chambers are ALPS® Plus and SIP ENCORE® PVD processing chambers, both commercially available from Applied Materials, Inc., Santa Clara, Calif.

Generally, the long throw PVD chamber 36 contains a sputtering source, such as a target 142, and a substrate support pedestal 152 for receiving a semiconductor substrate 154 thereon and located within a grounded enclosure wall 150, which may be a chamber wall as shown or a grounded shield.

The chamber 36 includes a target 142 supported on and sealed, as by O-rings (not shown), to a grounded conductive aluminum adapter 144 through a dielectric isolator 146. The target 142 comprises the material to be deposited on the substrate 154 surface during sputtering, and may include cobalt, cobalt silicide, ruthenium, rhodium, titanium, tantalum, tungsten, molybdenum, platinum, nickel, iron, niobium, palladium, alloys thereof, combinations thereof, which are used in forming metal silicide layers. For example, elemental cobalt, cobalt silicide, nickel cobalt alloys, cobalt tungsten alloys, cobalt nickel tungsten alloys, doped cobalt and nickel alloys, or nickel iron alloys may be deposited by using alloy targets or multiple targets in the chamber. The target 142 may also include a bonded composite of a metallic surface layer and a backing plate of a more workable metal.

A pedestal 152 supports a substrate 154 to be sputter coated in planar opposition to the principal face of the target 142. The substrate support pedestal 152 has a planar substrate-receiving surface disposed generally parallel to the sputtering surface of the target 142. The pedestal 152 is vertically movable through a bellows 158 connected to a bottom chamber wall 160 to allow the substrate 154 to be transferred onto the pedestal 152 through a load lock valve (not shown) in the lower portion of the chamber 36 and thereafter raised to a deposition position. Processing gas is supplied from a gas source 162 through a mass flow controller 164 into the lower part of the chamber 36.

A controllable DC power source 148 coupled to the chamber 36 may be used to apply a negative voltage or bias to the target 142. An RF power supply 156 may be connected to the pedestal 152 in order to induce a negative DC self-bias on the substrate 154, but in other applications the pedestal 152 is grounded or left electrically floating.

A rotatable magnetron 170 is positioned in back of the target 142 and includes a plurality of horseshoe magnets 172 supported by a base plate 174 connected to a rotation shaft 176 coincident with the central axis of the chamber 36 and the substrate 154. The horseshoe magnets 172 are arranged in closed pattern typically having a kidney shape. The magnets 172 produce a magnetic field within the chamber 36, generally parallel and close to the front face of the target 142 to trap electrons and thereby increase the local plasma density, which in turn increases the sputtering rate. The magnets 172 produce an electromagnetic field around the top of the chamber 36, and magnets 172 are rotated to rotate the electromagnetic field which influences the plasma density of the process to more uniformly sputter the target 142.

Figure 4:
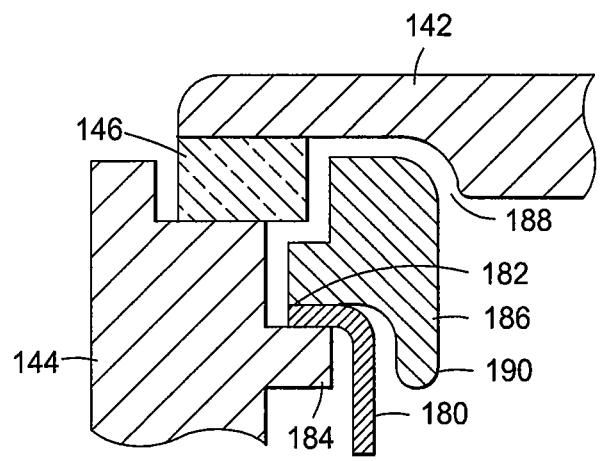
FIG. 4 depicts an expanded view of FIG. 3 including the upper area of the shields near the target.

The chamber 36 of the invention includes a grounded bottom shield 180 having, as is more clearly illustrated in the exploded cross-sectional view of FIG. 4, an upper flange 182 supported on and electrically connected to a ledge 184 of the adapter 144. A dark space shield 186 is supported on the flange 182 of the bottom shield 180, and fasteners (not shown), such as screws recessed in the upper surface of the dark space shield 186 fix it and the flange 182 to the adapter ledge 184 having tapped holes receiving the screws. This metallic threaded connection allows the two shields 180, 186 to be grounded to the adapter 144. The adapter 144 in turn is sealed and grounded to an aluminum chamber sidewall 150. Both shields 180, 186 are typically formed from hard, non-magnetic stainless steel.

The dark space shield 186 has an upper portion that closely fits an annular side recess of the target 142 with a narrow gap 188 between the dark space shield 186 and the target 142 which is sufficiently narrow to prevent the plasma from penetrating, hence protecting the dielectric isolator 146 from being sputter coated with a metal layer, which would electrically short the target 142. The dark space shield 186 also includes a downwardly projecting tip 190, which prevents the interface between the bottom shield 180 and dark space shield 186 from becoming bonded by sputter deposited metal.

Returning to the overall view of FIG. 3, the bottom shield 180 extends downwardly in an upper generally tubular portion 194 of a first diameter and a lower generally tubular portion 196 of a smaller second diameter to extend generally along the walls of the adapter 144 and the chamber wall 150 to below the top surface of the pedestal 152. It also has a bowl-shaped bottom including a radially extending bottom portion 198 and an upwardly extending inner portion 100 just outside of the pedestal 152. A cover ring 102 rests on the top of the upwardly extending inner portion 100 of the bottom shield 180 when the pedestal 152 is in its lower, loading position but rests on the outer periphery of the pedestal 152 when it is in its upper, deposition position to protect the pedestal 152 from sputter deposition. An additional deposition ring (not shown) may be used to shield the periphery of the substrate 154 from deposition.

The chamber 36 may also be adapted to provide a more directional sputtering of material onto a substrate. In one aspect, directional sputtering may be achieved by positioning a collimator 110 between the target 142 and the substrate support pedestal 152 to provide a more uniform and symmetrical flux of deposition material on the substrate 154.

Figure 5:
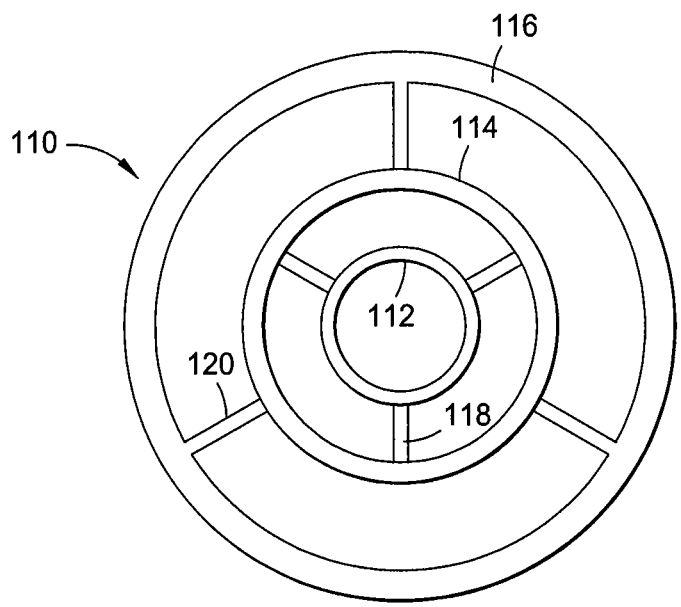
FIG. 5 illustrates a plan view of one embodiment of a ring collimator.

A metallic ring collimator 110, such as the Grounded Ring collimator, rests on the ledge portion 106 of the bottom shield 180, thereby grounding the collimator 110. The ring collimator 110 includes an outer tubular section and at least one inner concentric tubular sections, for example, three concentric tubular sections 112, 114, 116 linked by cross struts 118, 120 as shown in FIG. 5. The outer tubular section 116 rests on the ledge portion 106 of the bottom shield 180. The use of the bottom shield 180 to support the collimator 110 simplifies the design and maintenance of the chamber 36. At least the two inner tubular sections 112, 114 are of sufficient height to define high aspect-ratio apertures that partially collimate the sputtered particles. Further, the upper surface of the collimator 110 acts as a ground plane in opposition to the biased target 142, particularly keeping plasma electrons away from the substrate 154.

Figure 6:
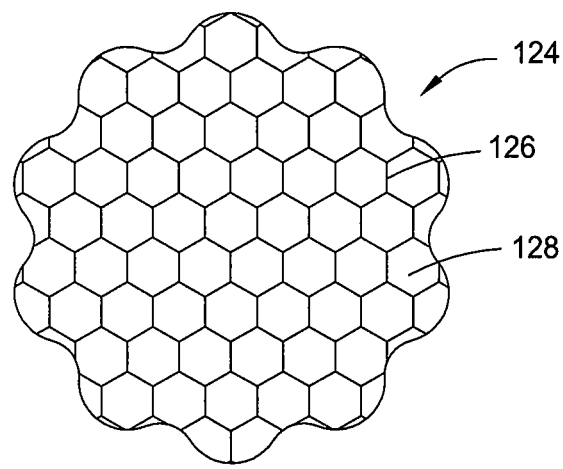
FIG. 6 illustrates a partial plan view of one embodiment of a honeycomb collimator.

Another type of collimator usable with the invention is a honeycomb collimator 124, partially illustrated in the plan view of FIG. 6 having a mesh structure with hexagonal walls 126 separating hexagonal apertures 128 in a close-packed arrangement. An advantage of the honeycomb collimator 124 is, if desired, the thickness of the collimator 124 can be varied from the center to the periphery of the collimator 124, usually in a convex shape, so that the apertures 128 have aspect ratios that are likewise varying across the collimator 124. The collimator may have one or more convex sides. This allows the sputter flux density to be tailored across the substrate, permitting increased uniformity of deposition. Collimators that may be used in the PVD chamber are described in U.S. Pat. No. 5,650,052, which is hereby incorporated by reference herein to the extent not inconsistent with aspects of the invention and claims described herein.

One embodiment of a substrate support pedestal 152 is shown in FIG. 7A. The substrate support pedestal 152 is suitable for use in a high temperature high vacuum annealing process. Generally, the substrate support pedestal 152 includes a heating portion 210 disposed on a base 240 coupled to a shaft 245.

The heating portion 210 generally includes heating elements 250 disposed in a thermally conducting material 220 and a substrate support surface 275. The thermally conducting material 220 may be any material that has sufficient thermal conductance at operating temperatures for efficient heat transfer between the heating elements 250 and substrate support surface 275. An example of the conducting material is steel. The substrate support surface 275 may include a dielectric material and typically includes a substantially planar receiving surface for a substrate 154 disposed thereon.

The heating elements 250 may be resistive heating elements, such as electrically conducting wires having leads embedded within the conducting material 220, and are provided to complete an electrical circuit by which electricity is passed through the conducting material 220. An example of a heating element 250 includes a discrete heating coil disposed in the thermally conducting material 220. Electrical wires connect an electrical source (not shown), such as a voltage source, to the ends of the electrically resistive heating coil to provide energy sufficient to heat the coil. The coil may take any shape that covers the area of the substrate support pedestal 152. More than one coil may be used to provide additional heating capability, if needed.

Fluid channels 290 may be coupled to a surface 226 of the heating portion 210 and may provide for either heating or cooling of the substrate support pedestal 152. The fluid channels 290 may include a concentric ring or series of rings (not shown), or other desired configuration, having fluid inlets and outlets for circulating a liquid from a remotely located fluid source 294. The fluid channels 290 are connected to the fluid source 294 by fluid passage 292 formed in the shaft 245 of substrate support pedestal 152. Embodiments of the substrate support pedestal 152 including both heating elements 250 coupled to an electrical source 296 and fluid channels 290 cooled by a thermal medium passing through fluid passage 292 connected to the fluid source 294, i.e., a liquid heat exchanger, generally achieve temperature control of substrate support surface 275.

Temperature sensors 260, such as a thermocouple, may be attached to or embedded in the substrate support pedestal 152, such as adjacent the heating portion 210, to monitor temperature in a conventional manner. For example, measured temperature may be used in a feedback loop to control electric current applied to the heating elements 250 from the electrical source 296, such that substrate temperature can be maintained or controlled at a desired temperature or within a desired temperature range. A control unit (not shown) may be used to receive a signal from temperature sensor 260 and control the heat electrical source 296 or a fluid source 294 in response.

The electrical source 296 and the fluid source 294 of the heating and cooling components are generally located external of the chamber 36. The utility passages, including the fluid passage 292, are disposed axially along the base 240 and shaft 245 of the substrate support pedestal 152. A protective, flexible sheath 295 is disposed around the shaft 245 and extends from the substrate support pedestal 152 to the chamber wall (not shown) to prevent contamination between the substrate support pedestal 152 and the inside of the chamber 36.

The substrate support pedestal 152 may further contain gas channels (not shown) fluidly connecting with substrate support surface 275 of the heating portion 210 to a source of backside gas (not shown). The gas channels define a backside gas passage of a heat transfer gas or masking gas between the heating portion 210 and the substrate 154.

Figure 7B:
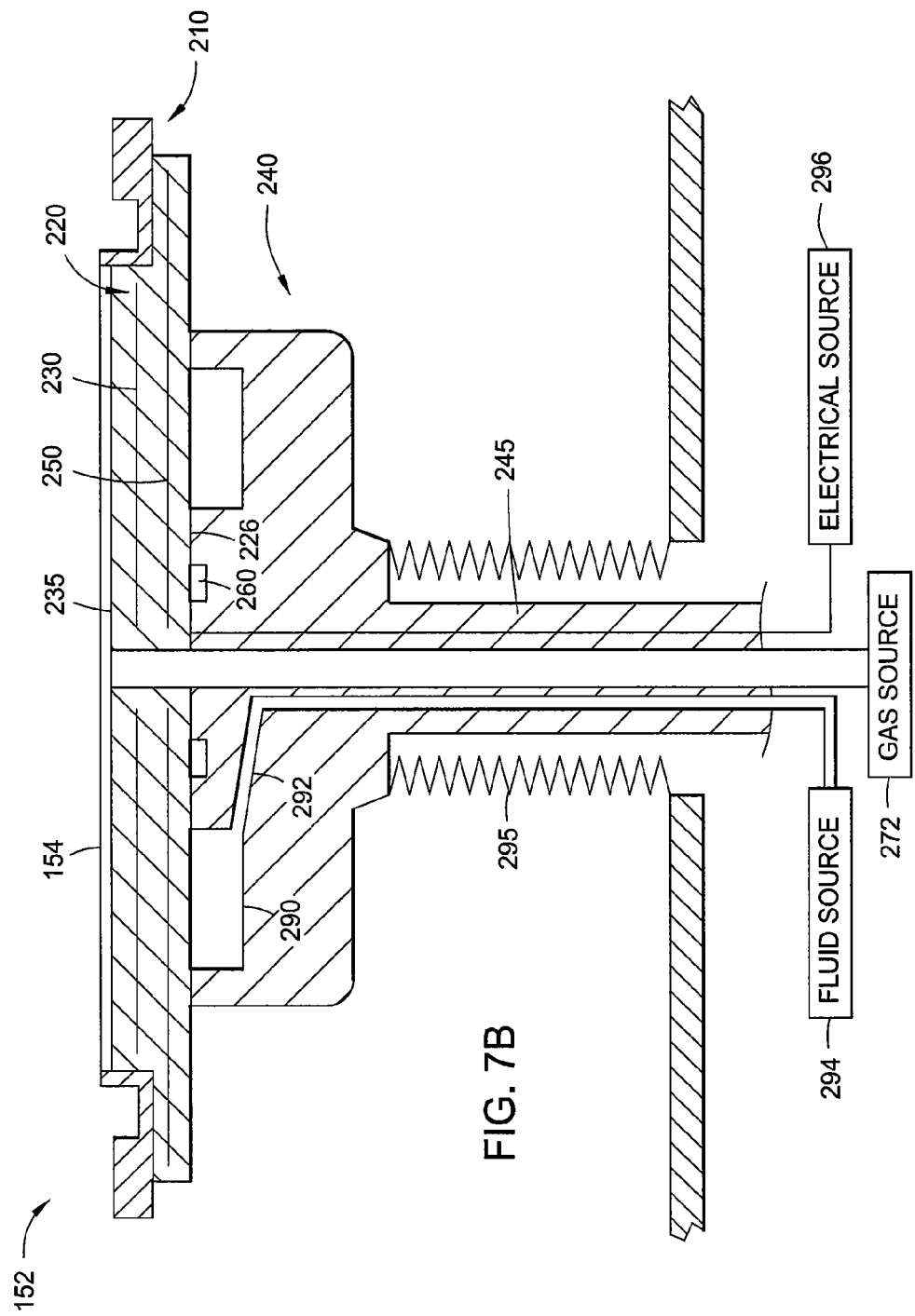
FIG. 7B illustrates a cross-sectional view of another embodiment of a pedestal for annealing a substrate.

FIG. 7B illustrates another embodiment of the substrate support pedestal 152 having an electrostatic chuck mounted to or forming the heating portion 210 of the substrate support pedestal 152. The heating portion 210 includes an electrode 230 and substrate support surface 275 coated with a dielectric material 235. Electrically conducting wires (not shown) couple the electrodes 230 to a voltage source (not shown). A substrate 154 may be placed in contact with the dielectric material 235, and a direct current voltage is placed on the electrode 230 to create the electrostatic attractive force to grip the substrate.

Generally, the electrodes 230 are disposed in the thermally conducting material 220 in a spaced relationship with the heating elements 250 disposed therein. The heating elements 250 are generally disposed in a vertically spaced and parallel manner from the electrodes 230 in the thermally conducting material 220. Typically, the electrodes are disposed between the heating elements 250 and substrate support surface 275 though other configurations may be used.

The embodiments of the substrate support pedestals 152 described above may be used to support a substrate in a high vacuum annealing chamber. The high vacuum annealing chamber may include substrate support pedestals 152 disposed in a PVD chamber, such as the long throw chamber 36 described herein, with a blank target disposed therein or without a target and without bias coupled to either the target or substrate support pedestal.

Embodiments of the substrate support pedestal 152 are described above and are provided for illustrative purposes and should not be construed or interpreted as limiting the scope of the invention. For example, suitable electrostatic chucks that may be used for the support pedestal include MCA™ Electrostatic E-chuck or Pyrolytic Boron Nitride Electrostatic E-Chuck, both available from Applied Materials, Inc., of Santa Clara, Calif.

While the embodiments of substrate support pedestal 152 described herein may be used to anneal the substrate, commercially available annealing chambers, such as rapid thermal anneal (RTA) chambers may also be used to anneal the substrate to form the silicide films. The invention contemplates utilizing a variety of thermal annealing chamber designs, including hot plate designs and heated lamp designs, to enhance the electroplating results. One particular thermal annealing chamber useful for the invention is the WXZ™ chamber available from Applied Materials, Inc., located in Santa Clara, Calif. One particular hot plate thermal annealing chamber useful for the invention is the RTP XEplus CENTURA® thermal processing chamber available from Applied Materials, Inc., located in Santa Clara, Calif. One particular lamp annealing chamber is the RADIANCE® thermal processing chamber available from Applied Materials, Inc., located in Santa Clara, Calif.

Referring to FIGS. 1 and 2, the processing chambers 36, 38, 40, 41, 42 and 43, are each controlled by a microprocessor controller 54. The microprocessor controller 54 may be one of any form of general purpose computer processor (CPU) that can be used in an industrial setting for controlling process chambers as well as sub-processors. The computer may use any suitable memory, such as random access memory, read only memory, floppy disk drive, hard drive, or any other form of digital storage, local or remote. Various support circuits may be coupled to the CPU for supporting the processor in a conventional manner. Software routines as required may be stored in the memory or executed by a second CPU that is remotely located.

The process sequence routines are executed after the substrate 154 is positioned on the pedestal 152. The software routines, when executed, transform the general purpose computer into a specific process computer that controls the chamber operation so that a chamber process is performed. Alternatively, the software routines may be performed in hardware, as an application specific integrated circuit or other type of hardware implementation, or a combination of software and hardware.

In operation, the substrate 154 is positioned on the substrate support pedestal 152 and plasma is generated in the chamber 36. A long throw distance of at least about 90 mm separates the target 142 and the substrate 154. The substrate support pedestal 152 and the target 142 may be separated by a distance within a range from about 100 mm to about 300 mm for a 200 mm substrate. The substrate support pedestal 152 and the target 142 may be separated by a distance within a range from about 150 mm to about 400 mm for a 300 mm substrate. Any separation between the substrate 154 and target 142 that is greater than 50% of the substrate diameter is considered a long throw processing chamber.

The sputtering process is performed by applying a negative voltage, typically between about 0 V and about 2,400 V, to the target 142 to excite the gas into a plasma state. The direct current (DC) power supply 148 or another power supply may be used to apply a negative bias, for example, between about 0 V and about 700 V, to the substrate support pedestal 152. Ions from the plasma bombard the target 142 to sputter atoms and larger particles onto the substrate 154 disposed below. While the power supplied is expressed in voltage, power may also be expressed as a unit of power (e.g., kilowatts) or a unit of power density (e.g., w/cm$^2$). The amount of power supplied to the chamber 36 may be varied depending upon the amount of sputtering and the size of the substrate 154 being processed.

Processing gas used for the sputtering process is introduced into the processing chamber 36 via the mass flow controller 164. The processing gas includes non-reactive or inert species such as argon, xenon, helium, or combinations thereof. A vacuum pumping system 166 connected through a pumping port 168 in the lower chamber is used to maintain the chamber 36 at a base pressure of less than about $1\times10^{-6}$ Torr, such as about $1\times10^{-8}$ Torr, but the processing pressure within the chamber 36 is typically maintained at between 0.2 milliTorr and 2 milliTorr, preferably less than 1 milliTorr, for cobalt sputtering.

In operation, a substrate 154 is disposed on the substrate support pedestal 152, and the substrate 154 is heated, with or without the presence of a backside gas source 272, by the heating elements 250 to the desired processing temperature, processed for sufficient time to anneal the substrate 154 for the desired anneal results, and then removed from the chamber 36. The heating elements 250 of the substrate support pedestal 152 may heat the substrate 154 from room temperature, i.e., about 20° C. to about 900° C. and the fluid channels 290 may cool the substrate 154 to a temperature of about 0° C. The combination of heating elements 250 and the fluid channels 290 are generally used to control the temperature of a substrate 154 between about 10° C. and about 900° C., subject to properties of materials used in substrate support pedestal 152 and the process parameters used for processing a substrate in the chamber 36.

Metal and Metal Silicide Barrier Deposition Processes

Embodiments of the processes described herein relate to depositing metal and cobalt silicide barrier layers for feature definitions. In one embodiment, a metallic cobalt layer is deposited on a silicon-containing material and annealed to form a cobalt silicide layer. A second metallic cobalt layer is deposited onto the cobalt silicide layer. At least one metallic contact material is subsequently deposited to fill the feature. The annealing process for forming the metal silicide layer may be performed in multiple annealing steps. The deposition of the first metal layer, the second metal layer, and any required annealing steps are preferably performed without breaking vacuum in one vacuum processing system.

In one embodiment, a cobalt silicide layer is deposited on a silicon-containing material. A metallic cobalt layer is deposited on the cobalt silicide layer. Subsequently, at least one metallic contact material may be deposited to fill the feature. An annealing process may be performed prior to, during, or after each of the deposition process and are preferably performed without breaking vacuum in one vacuum processing system.

The first annealing step may be performed in the same chamber as the deposition of the first metal, an annealing chamber, such as a vacuum annealing chamber, or during deposition of subsequent materials, such as during a CVD of the second metal. The second annealing step may be performed before or after the deposition of the second metal. The second annealing process generally has a higher annealing temperature than the first annealing process.

Preferably, the metal silicide layer may be formed in situ, such as in a deposition chamber or in a processing system without breaking vacuum, prior to or concurrently with depositing a metal layer by a CVD technique. In situ is broadly defined herein as performing two or more processes in the same chamber or in the same processing system without breaking vacuum (e.g., opening the chamber) or transfer to a separate apparatus or system.

For example, in situ annealing may be performed in the same processing chamber as the metal deposition and in situ deposition may performed in a processing chamber adjacent to the deposition chamber, both of which are coupled to a transfer chamber, and the vacuum on the transfer chamber is not broken during processing.

In a further example, in situ processing may be performed on the same processing system at separate processing pressures, such as processing a substrate in processing chambers and annealing chambers disposed on the first and second transfer chambers 48, 50, respectfully, in processing platform system 35 without breaking the vacuum on processing platform system 35 or transfer of the substrate to another processing system.

While the following material describes the formation of a metal silicide layer from a cobalt or nickel layer film, the invention contemplates the use of other materials, including titanium, tantalum, tungsten, molybdenum, platinum, iron, niobium, palladium, and combinations thereof, and other alloys including nickel cobalt alloys, cobalt tungsten alloys, cobalt nickel tungsten alloys, doped cobalt and nickel alloys, or nickel iron alloys, to form the metal silicide material as described herein.

Reactive Preclean

Prior to metal deposition on a substrate, the surface of the substrate 154 may be cleaned to remove contaminants, such as oxides formed on exposed. The cleaning process may be performed by a wet etch process, such as exposure to a hydrofluoric acid solution, or by a plasma cleaning process, such as exposure to a plasma of an inert gas, a reducing gas, such as hydrogen or ammonia, or combinations thereof. The cleaning process may also be performed between processing steps to minimize contamination of the substrate surface during processing.

The plasma clean process may be performed in the Pre-Clean II processing chamber and the RPC+ processing chamber described herein, of which both are commercially available form Applied Materials, Inc., of Santa Clara Calif. In one aspect, the reactive preclean process forms radicals from a plasma of one or more gases such as argon, helium, hydrogen, nitrogen, fluorine-containing compounds, and combinations thereof. For example, a preclean gas may include a mixture of carbon tetrafluoride ($CF_4$) and oxygen ($O_2$), or a mixture of helium and nitrogen trifluoride ($NF_3$). In a preferred example, the preclean gas is an argon plasma. In another example, the preclean gas contains a hydrogen plasma. In another example, the preclean gas contains a mixture of helium and nitrogen trifluoride.

The plasma is typically generated by applying a power between about 500 watts and about 2,000 watts RF at a frequency between about 200 kHz and about 114 MHz. The flow of helium may be within a range from about 100 sccm to about 500 sccm and the flow of nitrogen trifluoride typically may be within a range from about 100 sccm to about 500 sccm for 200 mm substrates. The plasma treatment lasts between about 10 seconds and about 150 seconds. Preferably, the plasma is generated in one or more treatment cycles and purged between cycles. For example, four treatment cycles lasting about 35 seconds each is effective.

In another aspect, the substrate 154 may be precleaned using an argon plasma first and then a hydrogen plasma. A first preclean gas comprising greater than about 50% argon by number of atoms may be introduced at a pressure of about 0.8 milliTorr. A plasma of the argon gas is struck to subject the substrate 154 to an argon sputter cleaning environment. The argon plasma is preferably generated by applying between about 50 watts and about 500 watts of RF power. The argon plasma is maintained for a time period within a range from about 10 seconds to about 300 seconds to provide sufficient cleaning time for the deposits that are not readily removed by a reactive hydrogen plasma.

Following the argon plasma, the chamber pressure may be increased to about 140 milliTorr, and a second preclean gas consisting essentially of hydrogen and helium is introduced into the processing region. Preferably, the processing gas comprises about 5% hydrogen and about 95% helium. The hydrogen plasma is generated by applying between about 50 watts and about 500 watts of power. The hydrogen plasma is maintained for about 10 seconds to about 300 seconds.

Metal Deposition

A first metal layer may be deposited on a substrate 154 disposed in chamber 36 as a barrier layer for a second metal layer "plug" or may be deposited and annealed on the substrate pedestal 152 to form the metal silicide layer without breaking vacuum. The substrate 154 includes dielectric materials, such as silicon or silicon oxide materials, disposed thereon and is generally patterned to define features into which metal films may be deposited or metal silicide films will be formed. The first metal layer may be deposited by a physical vapor deposition technique, a CVD technique, or an atomic layer deposition technique.

In a PVD process, the metal is deposited using the PVD chamber 36 described above. The target 142 of material, such as cobalt, to be deposited is disposed in the upper portion of the chamber 36. A substrate 154 is provided to the chamber 36 and disposed on the substrate support pedestal 152. A processing gas is introduced into the chamber 36 at a flow rate of between about 5 sccm and about 30 sccm. The chamber pressure is maintained below about 5 milliTorr to promote deposition of conformal PVD metal layers. Preferably, a chamber pressure between about 0.2 milliTorr and about 2 milliTorr may be used during deposition. More preferably, a chamber pressure between about 0.2 milliTorr and about 1.0 milliTorr has been observed to be sufficient for sputtering cobalt onto a substrate.

Plasma is generated by applying a negative voltage to the target 142 between about 0 volts (V) and about −2,400 V. For example, negative voltage is applied to the target 142 at between about 0 V and about −1,000 V to sputter material on a 200 mm substrate. A negative voltage between about 0 V and about −700 V may be applied to the substrate support pedestal 152 to improve directionality of the sputtered material to the substrate surface. The substrate 154 is maintained at a temperature within a range from about 10° C. to about 600° C. during the deposition process.

An example of a deposition process includes introducing an inert gas, such as argon, into the chamber 36 at a flow rate between about 5 sccm and about 30 sccm, maintaining a chamber pressure between about 0.2 milliTorr and about 1.0 milliTorr, applying a negative bias of between about 0 volts and about 1,000 volts to the target 142 to excite the gas into a plasma state, maintaining the substrate 154 at a temperature within a range from about 10° C. to about 600° C., preferably about 50° C. and about 300° C., and more preferably, between about 50° C. and about 100° C. during the sputtering process, and spacing the target 142 between about 100 mm and about 300 mm from the substrate surface for a 200 mm substrate. Cobalt may be deposited on the silicon material at a rate between about 300 Å/min and about 2000 Å/min using this process. A collimator 110 or 124 may be used with the process described herein with minimal detrimental affect on deposition rate.

While not shown, the barrier material, such as cobalt silicide, cobalt or nickel described above, may be deposited by another method using the apparatus shown in FIGS. 1 and 2. The cobalt material may be deposited by a CVD technique, an ALD technique, an ionized magnetic plasma PVD (IMP-PVD) technique, a self-ionized plasma PVD (SIP-PVD) technique, an electroless deposition process, or combinations thereof. For example, the cobalt material may be deposited by CVD in a CVD chamber, such as chamber 38 of processing platform system 35 as shown in FIG. 1, or by ALD in an ALD chamber or CVD chamber disposed at position 38, as shown in FIG. 1. The substrates may be transferred between various chambers within processing platform system 35 without breaking a vacuum or exposing the substrates to other external environmental conditions.

Alternatively, prior to second metal deposition, such as tungsten, a layer of a barrier material, such as titanium or titanium nitride, may be deposited on the first metal layer. The layer of barrier material improves resistance to interlayer diffusion of the second metal layer into the underlying substrate or silicon material. Additionally, the layer of barrier material may improve interlayer adhesion between the first and second metal layers. Suitable barrier layer materials include titanium, titanium nitride, tantalum, tantalum nitride, tungsten, tungsten nitride, titanium-tungsten alloy, derivatives thereof, and combinations thereof. The layer of barrier materials may be deposited by a CVD technique, an ALD technique, an IMP-PVD technique, a SIP-PVD technique, or combinations thereof.

Tungsten Deposition

In one aspect, the substrate is then transferred to a CVD chamber for the deposition of a second metal layer, such as tungsten, on the first metal layer, such as cobalt or nickel. Tungsten may be deposited by CVD technique. Tungsten may be deposited at a sufficient temperature, such as between about 300° C. and about 500° C., to initiate the formation of a metal silicide, such as cobalt silicide. The metal silicide may be formed from part or all of the first metal layer.

An annealing step may be performed in the processing chamber, such as the WXZ™, prior to material deposition. Such an annealing step is performed at a temperature within a range from about 300° C. to about 900° C., such as from about 300° C. to about 400° C. A thin layer of silicon, or "silicon soak" may be deposited on the barrier layer prior to deposition of any tungsten material. The silicon deposition may be performed in situ with the same chamber as the tungsten material deposition. Additionally, a tungsten nucleation step may be performed prior to a main tungsten deposition. The tungsten nucleation step may be performed in situ by an ALD technique or CVD process in the same CVD chamber as the main tungsten deposition or subsequent tungsten deposition.

An example of a tungsten CVD process includes depositing a silicon layer, also known as a silicon soak layer, a tungsten nucleation layer deposition, and a main, or bulk, tungsten deposition. The silicon layer is deposited by introducing a silane gas (e.g., $SiH_4$, $Si_2H_6$, or derivatives thereof) into the chamber 36 at a flow rate between about 50 sccm and about 100 sccm, a reactive gas, such as hydrogen ($H_2$), into the chamber at a flow rate between about 500 sccm and about 5,000 sccm, and an inert gas, such as argon or nitrogen, into the chamber 36 at a flow rate between about 500 sccm and about 5,000 sccm, maintaining the chamber pressure between about 100 milliTorr and about 300 Torr, and maintaining the substrate temperature within a range from about 300° C. to about 500° C. The process may be performed for a time period within a range from about 5 seconds to about 30 seconds. The silicon layer is usually deposited at a thickness of about 1,000 Å or less.

The tungsten nucleation layer is deposited by a process including introducing a tungsten precursor gas, such as tungsten hexafluoride ($WF_6$) or derivative thereof, into the chamber 36 at a flow rate between about 5 sccm and about 60 sccm, a silane gas (e.g., $SiH_4$, $Si_2H_6$, or derivatives thereof) into the chamber 36 at a flow rate between about 5 sccm and about 60 sccm, a reactive gas, such as hydrogen ($H_2$), into the chamber 36 at a flow rate between about 500 sccm and about 5,000 sccm, and an inert gas, such as argon or nitrogen, into the chamber 36 at a flow rate between about 500 sccm and about 5,000 sccm, and maintaining a chamber pressure between about 100 milliTorr and about 300 Torr, and maintaining the substrate temperature within a range from about 300° C. to about 500° C. The process may be performed for a time period within a range from about 5 seconds to about 30 seconds. The nucleation layer is usually deposited at a thickness of about 1,000 Å or less.

The tungsten layer is then deposited on the tungsten nucleation layer by a process including introducing a tungsten precursor gas, such as tungsten hexafluoride or derivative thereof, into the chamber 36 at a flow rate between about 25 sccm and about 250 sccm, a reactive gas, such as hydrogen ($H_2$), into the chamber 36 at a flow rate between about 500 sccm and about 5,000 sccm, and an inert gas, such as argon or nitrogen, into the chamber 36 at a flow rate between about 500 sccm and about 5,000 sccm, and maintaining a chamber pressure between about 100 milliTorr and about 300 Torr, and maintaining the substrate temperature within a range from about 300° C. to about 900° C. The process may be performed for a time period within a range from about 5 seconds to about 300 seconds or until a desired thickness is reached. The deposition rate for tungsten is between about 1,000 Å/min and about 3,000 Å/min.

The substrate temperature during the main tungsten deposition process is maintained at sufficient temperature to initiate the formation of a metal silicide layer from silicon material on the substrate 154 and the first metal layer disposed thereon. For example, a substrate temperature within a range from about 300° C. to about 900° C., such as between about 300° C. and about 400° C., may be maintained to form the silicide layer with diffusion barrier properties simultaneously with tungsten deposition.

An example of the tungsten deposition process includes a silicon soak layer formed by introducing a silane gas at a flow rate of about 75 sccm, introducing hydrogen ($H_2$) at a flow rate of about 1,000 sccm, introducing argon or nitrogen at a flow rate of about 1,500 sccm, maintaining the chamber pressure at about 90 Torr, and maintaining the substrate temperature at about 425° C. The process may be performed for a time period within a range from about 10 seconds to about 20 seconds. The nucleation layer is deposited by introducing tungsten hexafluoride at a flow rate of about 20 sccm, silane gas at a flow of about 10 sccm, hydrogen gas at a flow rate of about 3,000 sccm, and argon at a flow rate of about 3,000 sccm, and maintaining a chamber pressure at about 30 Torr, and maintaining the substrate temperature at about 425° C. This process may be performed for about 15 seconds. The tungsten layer is deposited by introducing tungsten hexafluoride at a flow rate of about 250 sccm, hydrogen gas at a flow rate of about 1,000 sccm, and argon at a flow rate of about 3,000 sccm, and maintaining a chamber pressure at about 300 Torr, and maintaining the substrate temperature at about 425° C. This process may be performed for a time period within a range from about 40 seconds to about 45 seconds.

General In-Situ Annealing Process

Alternatively, the first metal layer may be annealed in situ by one or more annealing steps at an annealing temperature within a range from about 300° C. to about 900° C. to form the metal silicide layer prior to the deposition of the second metal layer. The one or more annealing steps may be performed for a time period within a range from about 10 seconds to about 600 seconds. A selective etch of the first metal layer and metal silicide layer to remove unreacted first metal material may be performed between two or more annealing steps. Deposition of materials, such as a layer of barrier material or the second metal layer, may be performed between two or more annealing steps.

In one example of the annealing process, the substrate 154 may be annealed under an inert gas environment in the deposition chamber by first introducing an inert gas into the chamber 36 at a flow rate between about 0 sccm (i.e., no backside gas) and about 15 sccm, maintaining a chamber pressure of about 2 milliTorr or less, and heating the substrate 154 to a temperature within a range from about 300° C. to about 900° C. for a time period within a range from about 5 seconds to about 600 seconds to form the metal silicide layer.

Low Temperature Deposition and Two-Step In-Situ Annealing Process in Two Chambers In another embodiment, the metal layer may be physical vapor deposited on a silicon substrate in chamber 36, annealed at a first temperature for a first period of time, transferred to a second chamber, for example chamber 41, in processing platform system 35, and annealed at a second temperature for a second period of time to form the metal silicide layer without breaking vacuum.

The physical vapor deposition of the metal is performed as described above at a temperature of about 200° C. or less, preferably between about 0° C. and about 100° C. The first step of the two step in situ annealing process described above may be performed under an inert gas environment in the deposition chamber by first introducing an inert gas into the chamber at a flow rate between about 0 sccm and about 15 sccm or less, maintaining a chamber pressure of about 2 milliTorr or less, heating the substrate 154 to a temperature within a range from about 400° C. to about 600° C. for a time period within a range from about 5 seconds to about 300 seconds. Preferably, the substrate 154 is annealed in the deposition chamber at about 500° C. for a time period within a range from about 60 seconds to about 120 seconds. Performing the first annealing the substrate in the same chamber as the deposition process is preferred over other annealing processes described herein.

The substrate 154 may be removed from the deposition chamber and transferred to a vacuum annealing chamber disposed on the same transfer chamber, such as transfer chamber 48 described above in FIG. 1. The high vacuum annealing chamber may include a PVD chamber having a blank target and substrate support pedestal 152 described above or a commercial high vacuum anneal pedestal, such as the High Temperature High Uniformity (HTHU) substrate support commercially available from Applied Materials Inc., of Santa Clara Calif.

The second annealing step may then be performed by maintaining a chamber pressure of about 2 milliTorr or less and heating the substrate 154 to a temperature within a range from about 600° C. to about 900° C. for a period of time between about 5 seconds and about 300 seconds to form the metal silicide layer. Preferably, the substrate is annealed in the annealing chamber at 800° C. for a time period within a range from about 60 seconds to about 120 seconds.

Low Temperature Deposition and Two-Step Annealing Process in Two Chambers

In an alternative embodiment of the two chamber deposition and annealing process, the metal layer is deposited according to the process described herein at about 200° C. or less, preferably between about 0° C. and about 100° C., in the deposition chamber. Substrate 154 may be annealed in the deposition chamber according to the annealing process described above. Subsequently, substrate 154 may be transferred to an RTA chamber disposed on transfer chamber 50 in FIG. 1 for a second annealing process.

Annealing in an RTA chamber may be performed by introducing a process gas including nitrogen ($N_2$), argon, helium, and combinations thereof, with less than about 4% hydrogen ($H_2$), at a process gas flow rate greater than 20 liters/min to control the oxygen content to less than 100 ppm, maintaining a chamber pressure of about ambient, and heating the substrate 154 to a temperature within a range from about 600° C. to about 900° C. for a time period within a range from about 5 seconds to about 300 seconds to form the metal silicide layer. Preferably, the substrate 154 is annealed in the RTA annealing chamber at 800° C. for about 30 seconds.

Low Temperature Deposition and Two-Step Annealing Process in Three Chambers

In another embodiment, the metal layer may be deposited on a silicon substrate in chamber 36, transferred to a first annealing chamber, such as a vacuum annealing chamber disposed on the same transfer chamber 48 on processing platform system 35, annealed at a first temperature for a first period of time, transferred to a second annealing chamber, for example chamber 41, in processing platform system 35, and annealed at a second temperature for a second period of time to form the metal silicide layer without breaking vacuum.

The metal deposition is performed in the deposition chamber according to the process described above at a substrate temperature of about 200° C. or less, preferably between about 0° C. and about 100° C. The first step of this embodiment of the annealing process may be performed in situ in a first high vacuum annealing chamber disposed on a processing system by introducing an inert gas into the annealing chamber at a flow rate of 0 sccm and about 15 sccm, maintaining a chamber pressure about 2 milliTorr or less, heating the substrate 154 to a temperature within a range from about 400° C. to about 600° C. for a time period within a range from about 5 seconds to about 300 seconds. Preferably, the substrate 154 is annealed in the deposition chamber at about 500° C. for a time period within a range from about 60 seconds to about 120 seconds. The first annealing step is believed to form an oxygen resistant film such as CoSi.

The substrate 154 may be annealed in situ by transfer to a second high vacuum annealing chamber in processing platform system 35. The second annealing step may then be performed by maintaining a chamber pressure of about 2 milliTorr or less and heating the substrate to a temperature within a range from about 600° C. to about 900° C. for a period of time between about 5 seconds and about 300 seconds to form the metal silicide layer. Preferably, the substrate 154 is annealed in the annealing chamber at 800° C. for a time period within a range from about 60 seconds to about 120 seconds.

Alternatively, the substrate 154 may be transferred to a second annealing chamber located outside the transfer chamber 48, 50 or processing platform system 35, such as an atmospheric pressure RTA chamber. Annealing in an atmospheric pressure RTA chamber may be performed by introducing a process gas including nitrogen ($N_2$), argon, helium, and combinations thereof, with less than about 4% hydrogen ($H_2$), at a process gas flow rate greater than 20 liters/min to control the oxygen content to less than 100 ppm, maintaining a chamber pressure of about ambient, and heating the substrate 154 to a temperature within a range from about 400° C.

to about 900° C. for a time period within a range from about 5 seconds to about 300 seconds to form the metal silicide layer. Preferably, the substrate 154 is annealed in the RTA chamber at 800° C. for about 30 seconds.

High Temperature Deposition and Annealing Process

The metal may be deposited at a high deposition temperature. An example of a deposition process includes introducing an inert gas, such as argon, into the chamber 36 at a flow rate between about 5 sccm and about 30 sccm, maintaining a chamber pressure between about 0.2 milliTorr and about 1.0 milliTorr, applying a negative bias of between about 0 volts and about 1,000 volts to the target 142 to excite the gas into a plasma state, maintaining the substrate 154 at an annealing temperature, i.e., between about 400° C. and about 600° C., by applying a backside gas, and spacing the target 142 between about 100 mm and about 300 mm from the substrate surface for a 200 mm substrate. The temperature may be maintained at about 200° C. by heating the substrate in the absence of a backside gas. Cobalt may be deposited on the silicon material at a rate between about 100 Å/min and about 2,000 Å/min using this process.

The annealing process can then be performed in the deposition chamber by ending the plasma and heating of the substrate 154 to a temperature within a range from about 400° C. to about 600° C. at the same heating levels used for the deposition process. The annealing process is performed at a temperature within a range from about 400° C. to about 600° C. for a time period within a range from about 5 seconds to about 300 seconds. Preferably, the substrate 154 is annealed in the deposition chamber at about 500° C. for a time period within a range from about 60 seconds to about 120 seconds.

The second annealing step may then be formed in an annealing chamber without breaking vacuum or in an annealing chamber located on a separate transfer chamber or processing system. The second annealing step includes heating the substrate 154 to a temperature within a range from about 600° C. to about 900° C. for a period of time between about 5 seconds and about 300 seconds to form the metal silicide layer. Preferably, the substrate 154 is annealed at 800° C. for a time period within a range from about 60 seconds to about 120 seconds.

Interlayer Deposition and Annealing Process

In one aspect of the invention, the two-step annealing process described herein may be separated by one or more processing steps, such as deposition processes. For example, a first metal layer, such as a cobalt or nickel layer, may be deposited in a first chamber, in situ annealed in the first transfer chamber or transferred to a second chamber for subsequent deposition and annealed therein. A second metal layer, such as tungsten is then deposited on the annealed substrate 154, and the substrate 154 is exposed to a second anneal in the second chamber or transferred to a third chamber for the completion of the annealing process.

In another example, a first metal layer, such as a cobalt or nickel layer may be deposited in a first chamber, in situ annealed in processing platform system 35, transferred to a second deposition chamber for deposition of a barrier material thereon, such as titanium nitride, transferred to a third deposition chamber for deposition of a second metal, and then further annealed in the third chamber or transferred to a fourth chamber for the completion of the annealing process. The substrate may be transferred between any of the four chambers without a vacuum break. Alternatively, the in situ anneal of the first metal layer may be performed after the deposition of the barrier material and prior to the deposition of the second metal layer, such as tungsten.

Examples of Metal and Metal Silicide Deposition

Figure 8A:
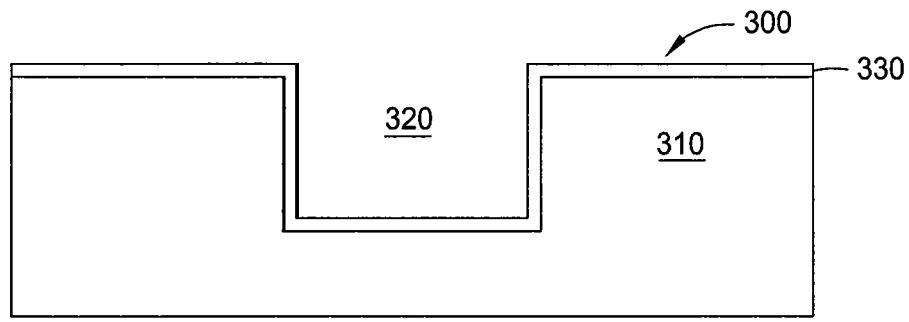
FIGS. 8A-8C depict schematic cross-sectional views of a substrate during different stages of fabrication as described by an embodiment herein.
Figure 8B:
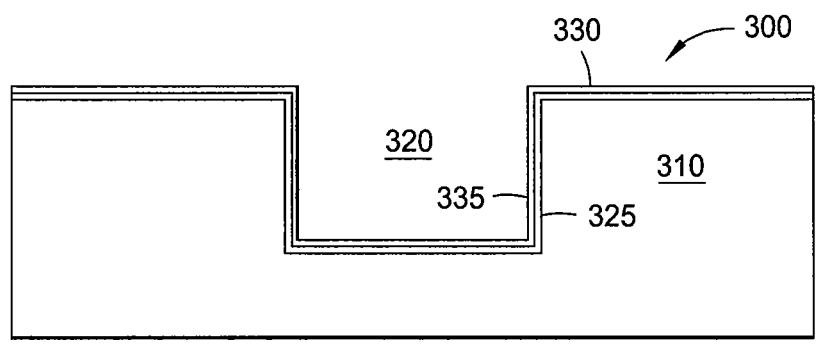

An example of a deposition process of a metal silicide layer as a barrier layer for a tungsten plug in a feature definition is as follows and shown in FIGS. 8A-8C. A substrate 300 having a silicon-containing material 310 formed thereon with feature definitions 320 formed therein is provided to processing platform system 35. The silicon-containing material 310 may be a dielectric material including silicon, silicon oxide, a doped silicon or silicon oxide layer, or other silicon-containing dielectric material used in substrate processing, which may be deposited by an atomic layer epitaxy (ALE) process or a CVD process. Embodiments of the invention also contemplates that layer 310 may include semi-conductive silicon-containing materials including polysilicon, doped polysilicon, or combinations thereof, deposited by methods known or unknown in the art.

Feature definitions 320 are formed in the silicon-containing material 310 by conventional method known in the art. For example, the feature definitions 320 may be formed by depositing and patterning a photoresist material to define the feature openings, a silicon etch process is then used to define the feature definitions 320, and any remaining photoresist material is removed, such as by an oxygen stripping method. The feature definitions 320 may then be treated with a plasma clean process to remove any contaminants, such as oxide formed on the silicon-containing material, prior to deposition of subsequent materials as described herein. A layer of cobalt silicide or metallic cobalt is deposited as a barrier layer 330 by an ALD process, a CVD process, or a PVD process described herein over the bottom and sidewalls of the feature definitions 320 as shown in FIG. 8A.

The cobalt barrier layer 330 may be annealed to form cobalt silicide at the interface 325 of the cobalt layer and the silicon containing material 310. Depending on the annealing process used, substantially all or only a portion of the cobalt barrier layer 330 may be converted to cobalt silicide. When the cobalt material is not substantially converted to the cobalt silicide material, a surface 335 of unreacted cobalt is formed which is exposed to subsequently deposited materials as shown in FIG. 8B. This cobalt surface 335 may be maintained to further act as additional barrier layer material for subsequent metal deposition, such as tungsten, or may be removed from the substrate 300 surface by an etch process.

Figure 8C:
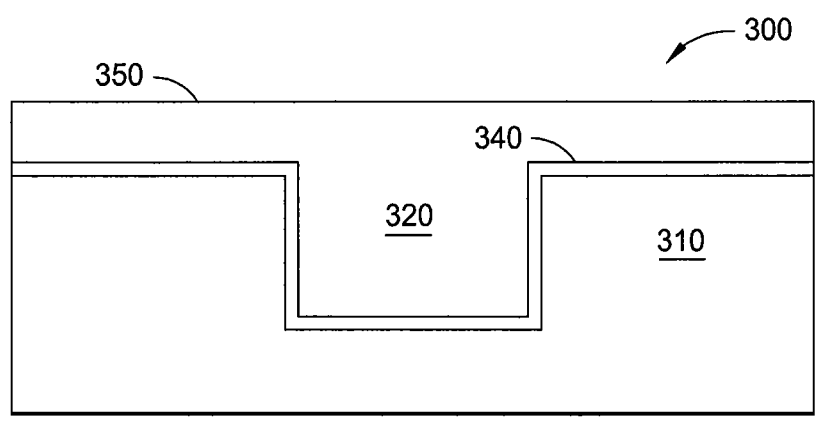

A layer of tungsten 350 is deposited to fill the feature definition 320 as shown in FIG. 8C. The tungsten deposition may be at a high enough temperature to completely convert any unreacted cobalt material to cobalt silicide, in effect annealing the cobalt material, while depositing to fill the feature definition 320. Alternatively, a second annealing step is performed to substantially convert the cobalt barrier layer 330 to a cobalt silicide layer 340.

Such a cobalt silicide barrier and tungsten fill of the feature definition 320 may be processed in processing platform system 35 as follows. Referring to FIG. 2, the substrate 300 is introduced into the first transfer chamber 48 of processing platform system 35 via the loadlock 46. The first transfer chamber 48 is operating at about 400 milliTorr. Transfer robot 49 retrieves the substrate 300 from the loadlock 46 and transfers it to pass-through chamber 52. Transfer robot 51 in the second transfer chamber 50 retrieves the substrate 300 from the pass-through chamber 52 and positions the substrate 300 in PVD chamber 38 for cobalt deposition. The second transfer chamber 50 is operated at about $1 \times 10^{-8}$ Torr. Alternatively, the transfer robot 51 positions the substrate 300 in one of the preclean chambers prior to cobalt deposition in the PVD chamber 38. Following PVD deposition, the substrate 300 is transferred back to the first transfer chamber 48 and disposed in a WXZ™ CVD chamber 38 for CVD tungsten deposition. The substrate may then be annealed as necessary.

Alternatively, following PVD deposition, the substrate 300 is disposed in chamber 41, which is a WXZ™ chamber capable of in situ annealing, where the cobalt material is first annealed to form a silicide material or to improve barrier properties prior to CVD deposition. A layer of tungsten may then be deposited in the WXZ™ chamber following the anneal step. However, the substrate 300 may be transferred after the first anneal in the WXZ™ chamber to a plasma etch chamber, such as a DPS® chamber, for etching to remove cobalt and then annealed a second time in the WXZ™ chamber or another annealing chamber prior to tungsten deposition. Following deposition, and annealing if necessary, the substrate 300 is transferred to the loadlock chamber 46 via the transfer robot 49. The substrate 300 may then be transferred to a separate apparatus, such as a chemical-mechanical polishing apparatus, for further processing.

Figure 9:
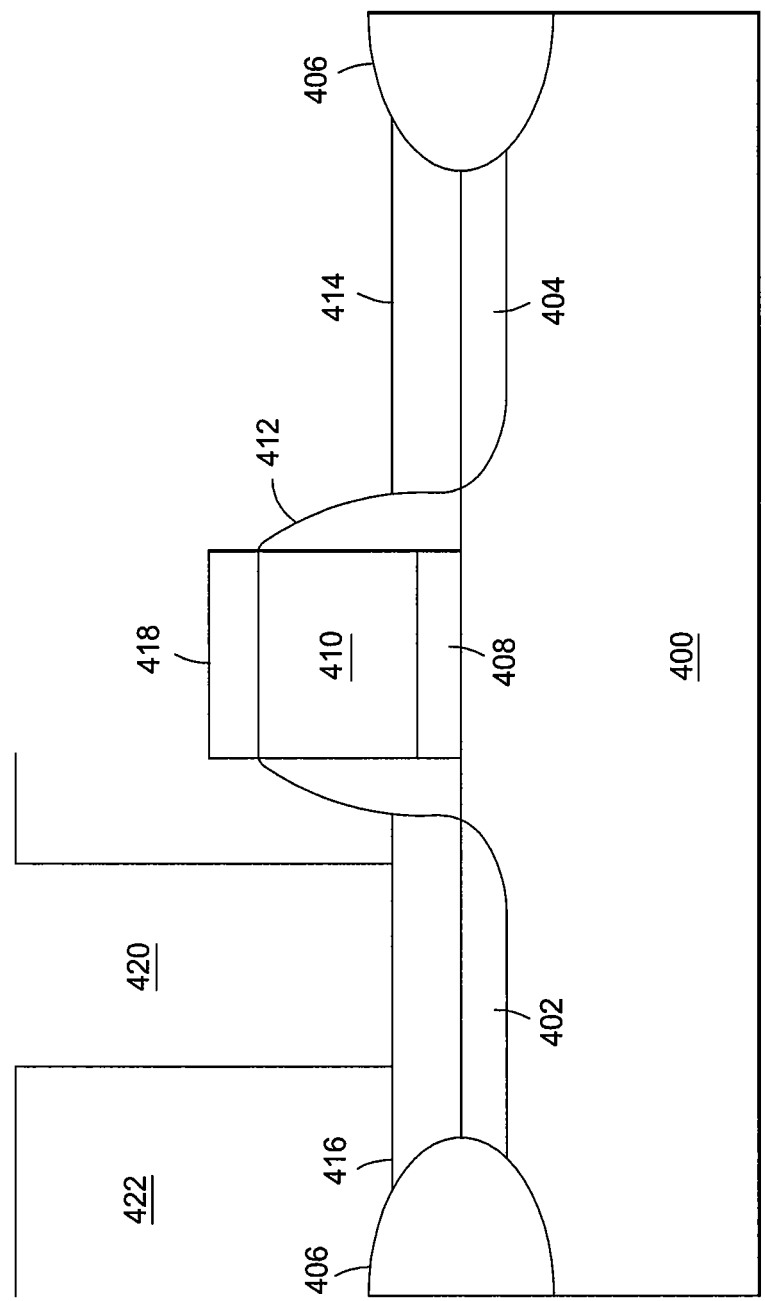
FIG. 9 depicts a schematic cross-sectional of another substrate containing a silicide material used as a contact with a transistor as described by an embodiment herein.
Figure 10:
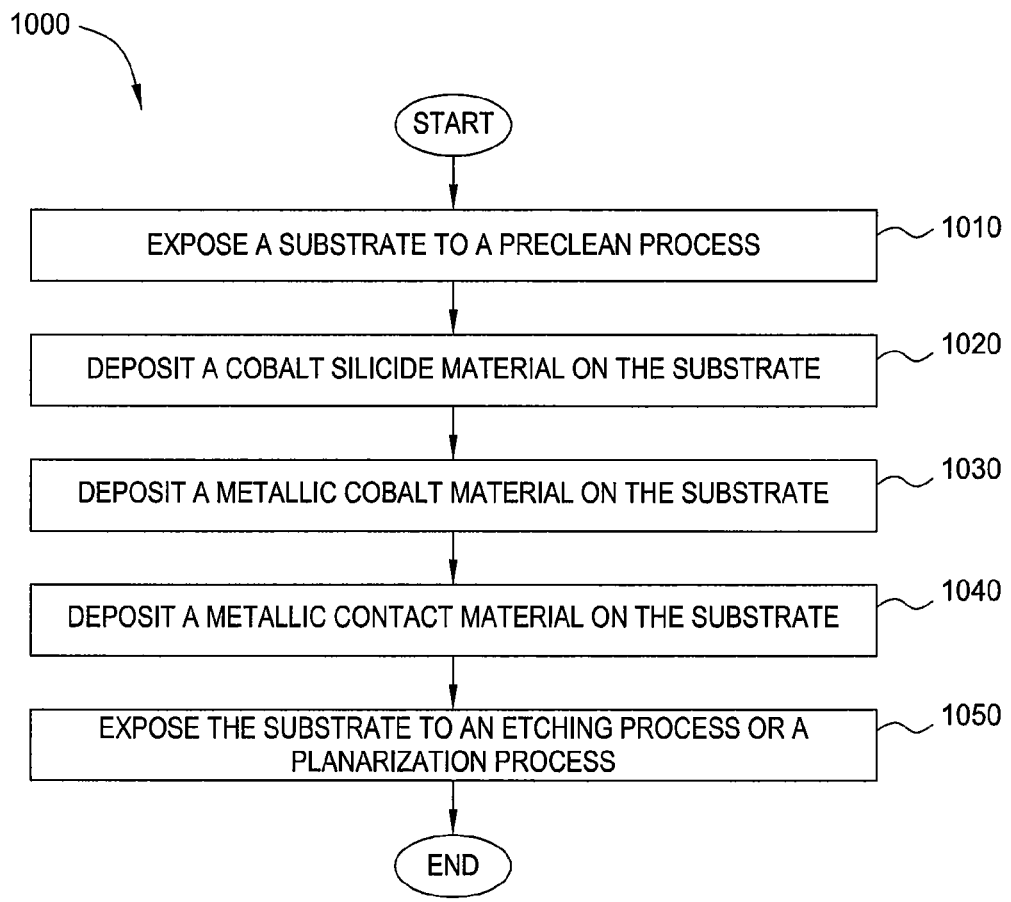
FIG. 10 shows a flow-chart of an integrated process described by an embodiment herein.
Figure 11:
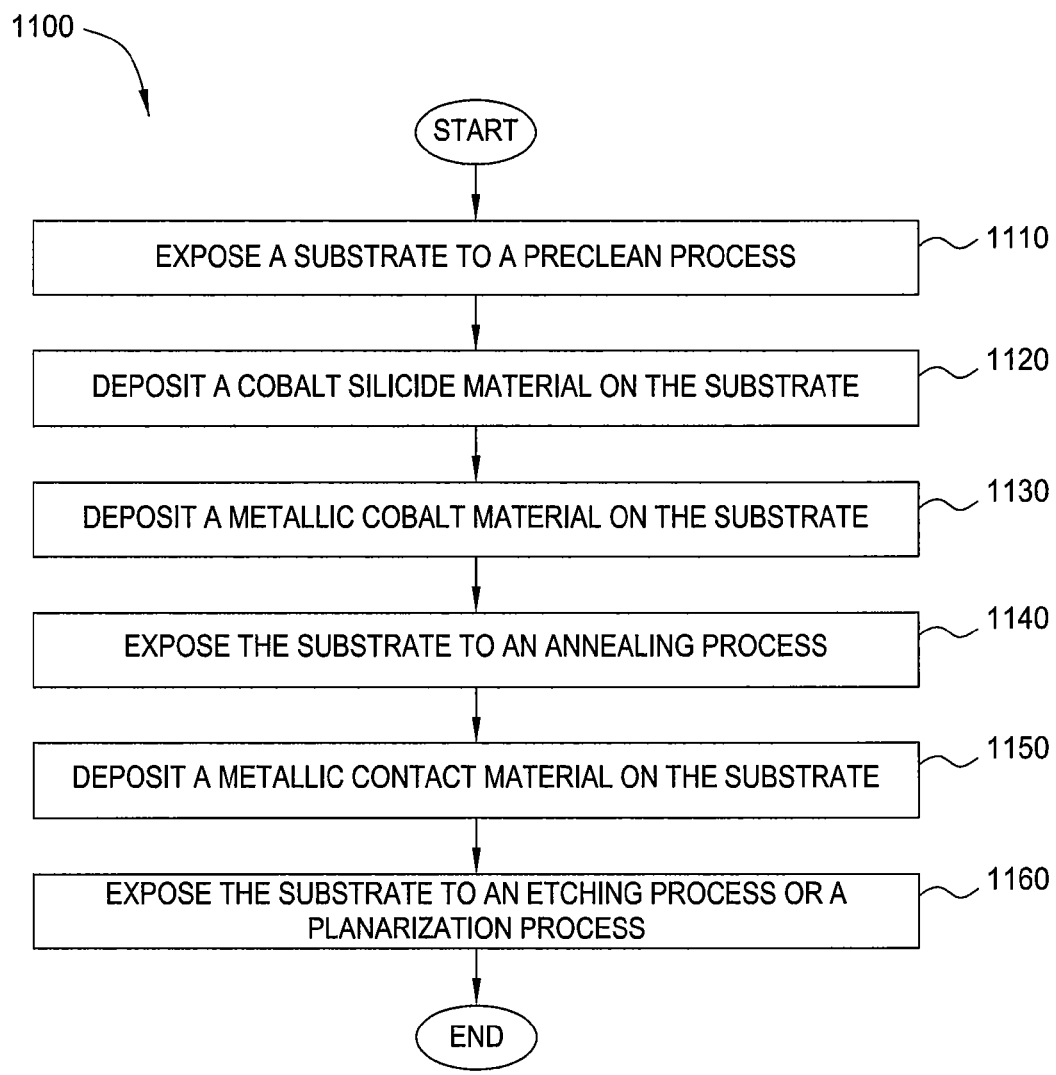
FIG. 11 shows a flow-chart of another integrated process described by embodiments herein.
Figure 12:
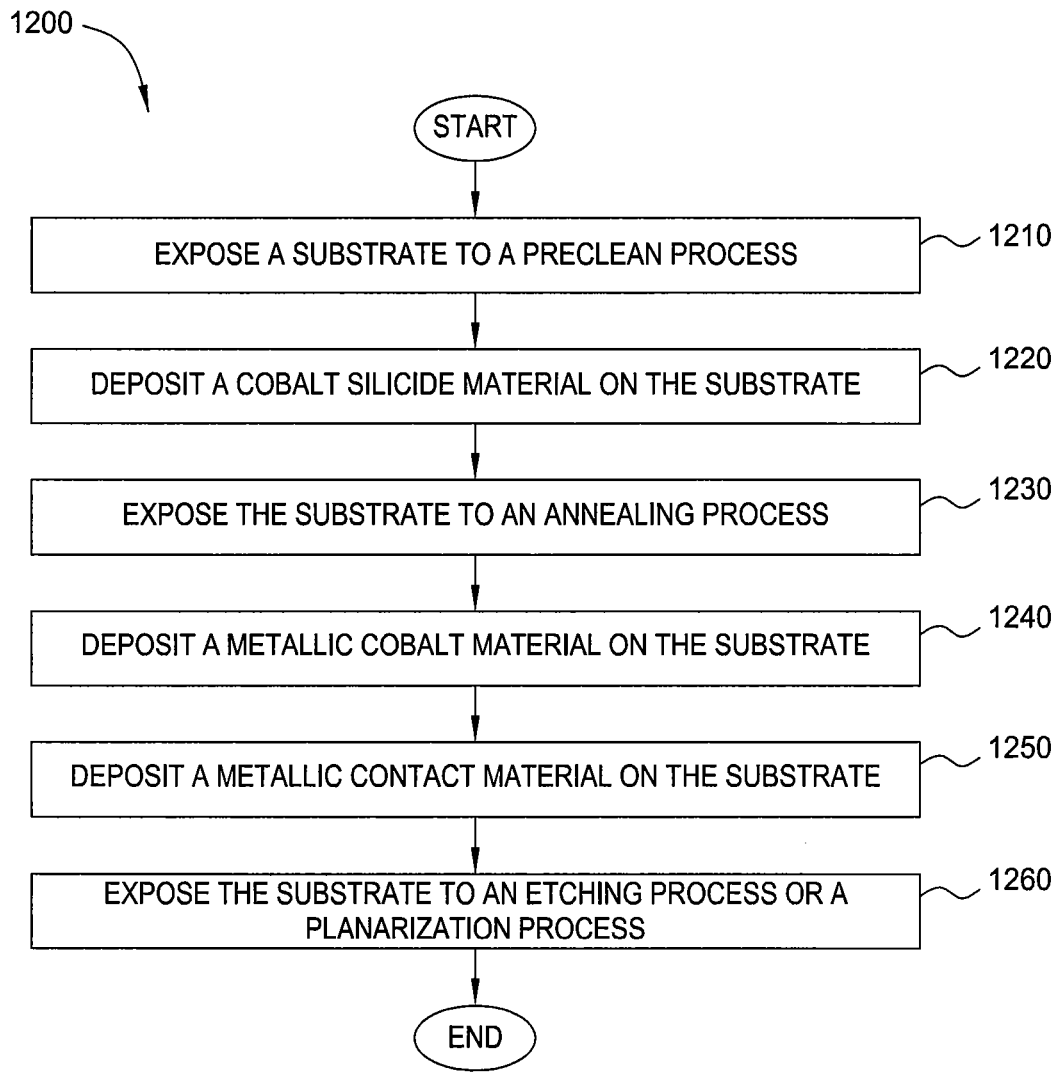
FIG. 12 shows a flow-chart of another integrated process described by embodiments herein.
Figure 13:
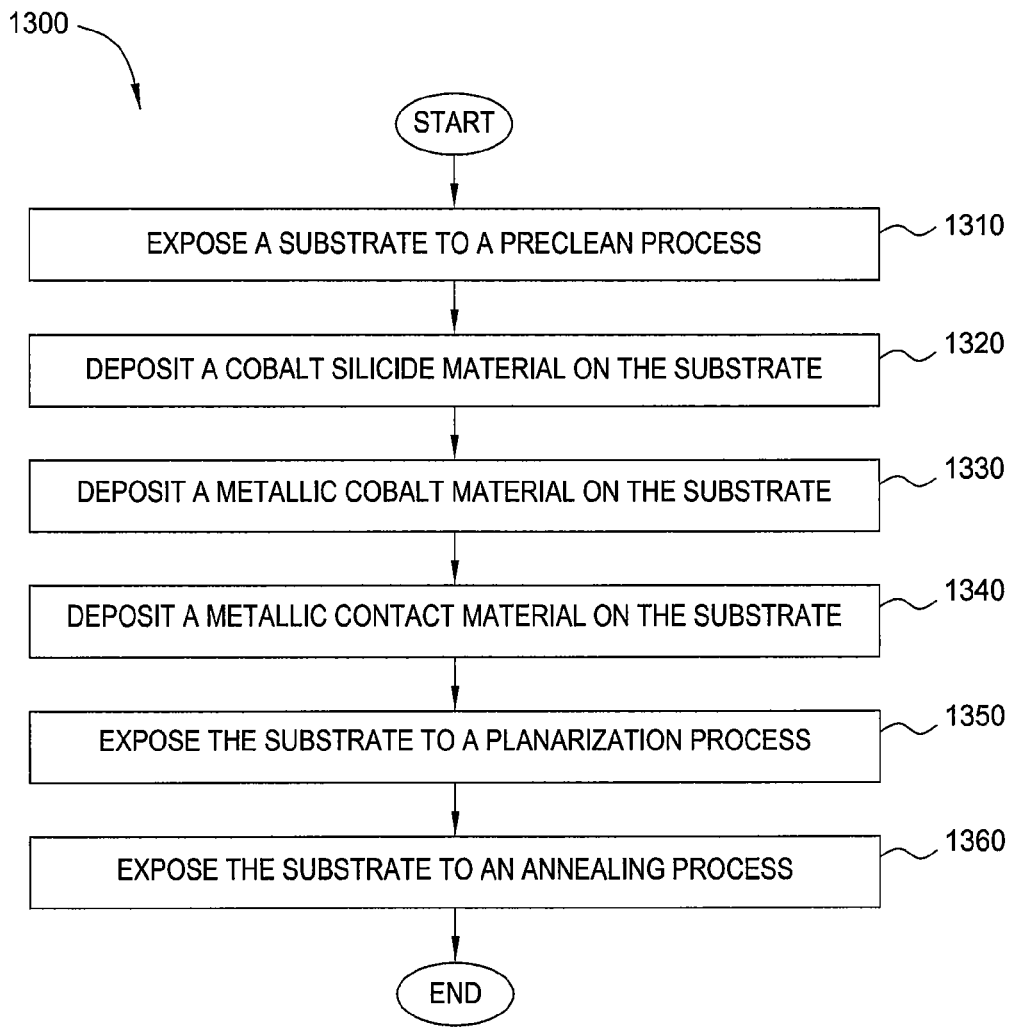
FIG. 13 shows a flow-chart of another integrated process described by embodiments herein.
Figure 14:
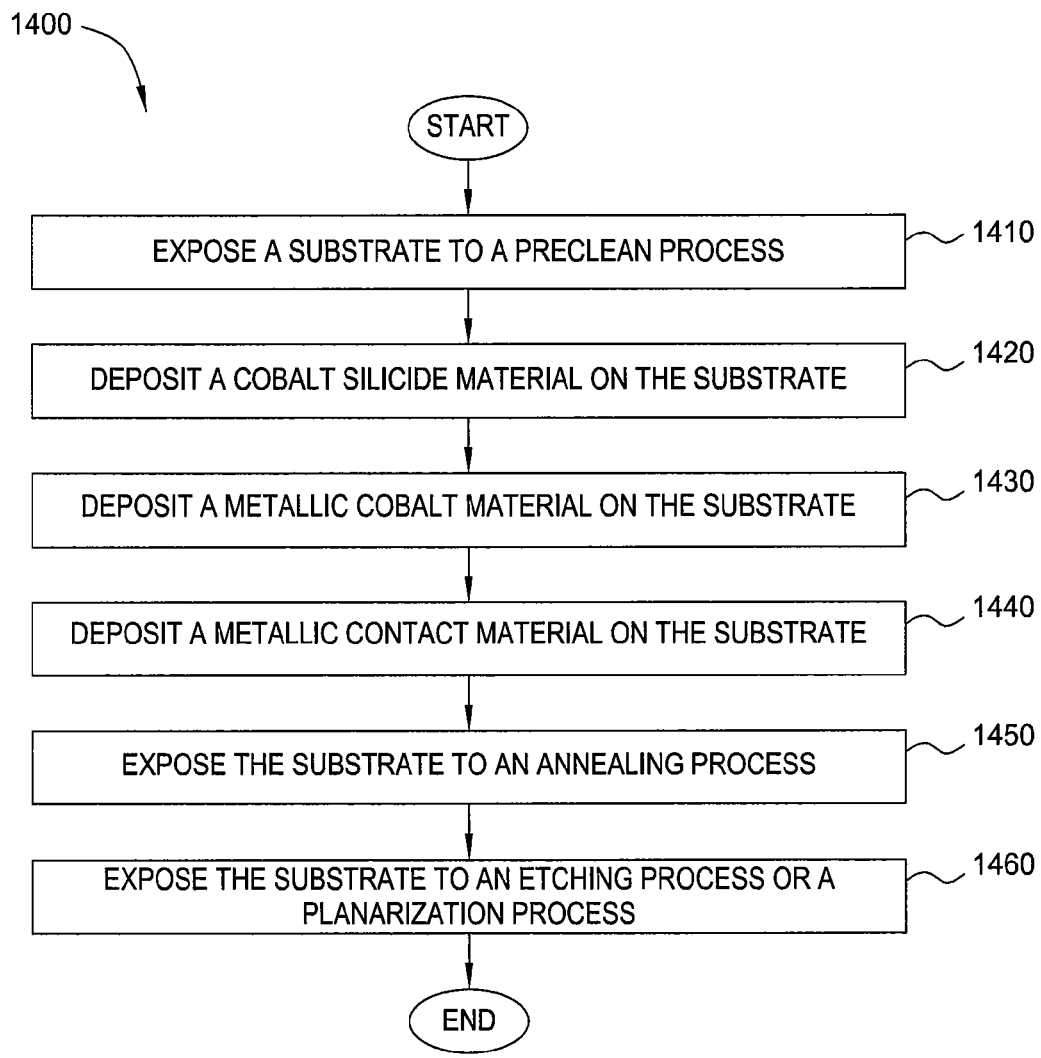
FIG. 14 shows a flow-chart of another integrated process described by embodiments herein.
Figure 15:
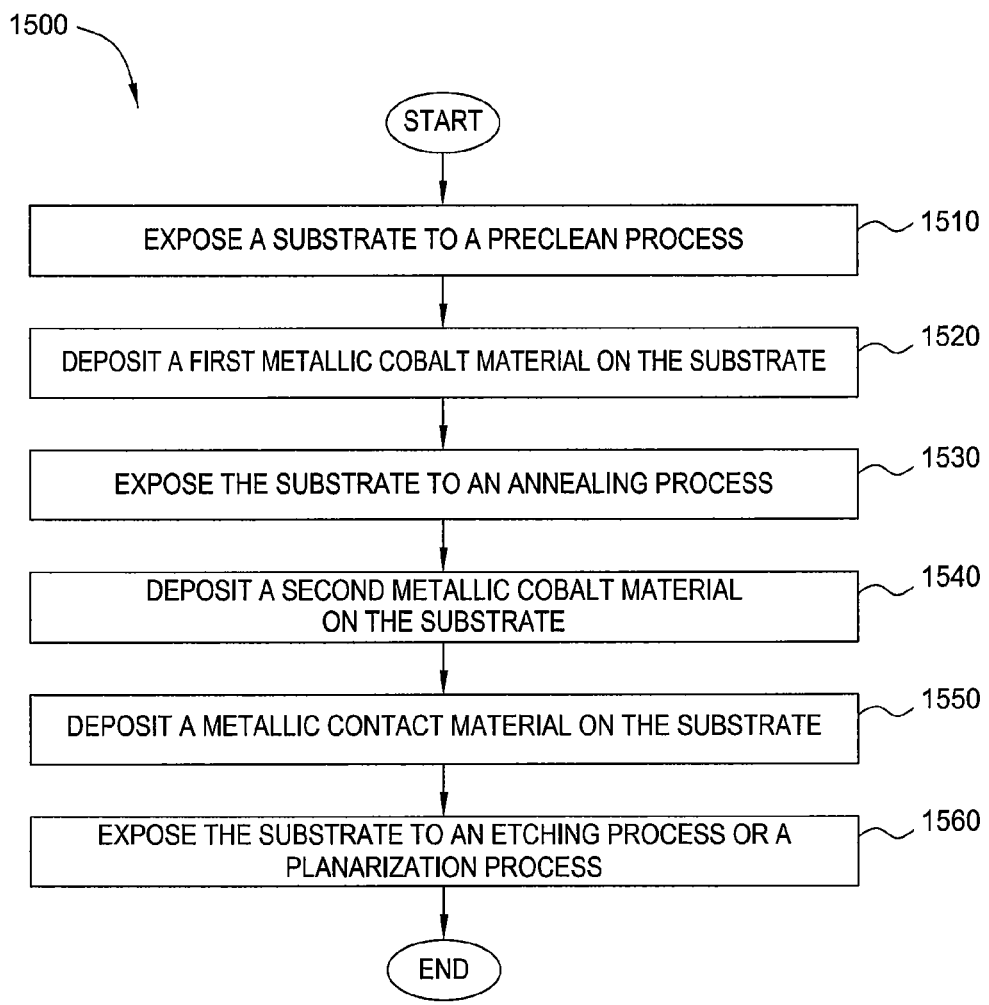
FIG. 15 shows a flow-chart of another integrated process described by embodiments herein.
Figure 16:
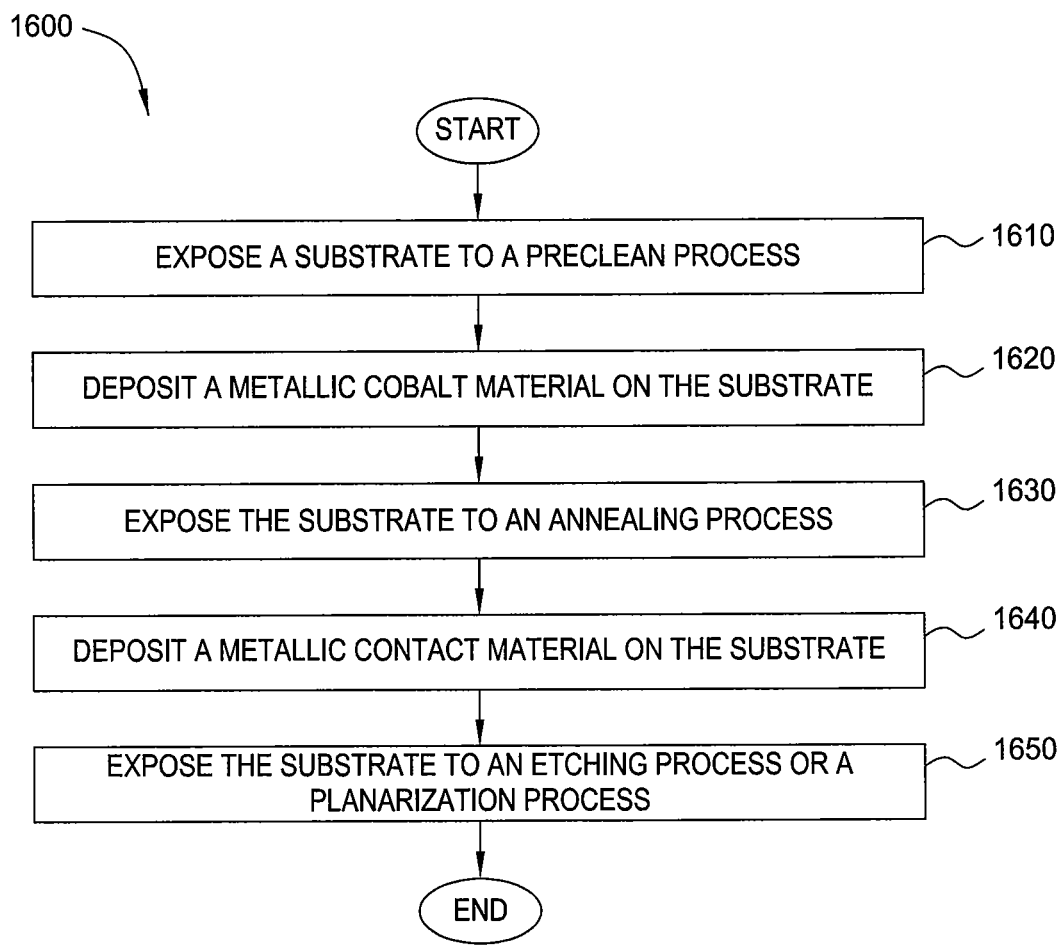
FIG. 16 shows a flow-chart of another integrated process described by embodiments herein.

Another metal silicide application includes the formation of a MOS device shown in FIG. 9. The metal silicide includes silicides of cobalt, titanium, tantalum, tungsten, molybdenum, platinum, nickel, iron, niobium, palladium, or combinations thereof, for use in an MOS device.

In the illustrated MOS structure, N+ source and drain regions 402 and 404 are formed in a P type silicon substrate 400 adjacent field oxide portions 406. A gate oxide layer 408 and a polysilicon gate electrode 410 are formed over silicon substrate 400 in between source and drain regions 402 and 404 with oxide spacers 412 formed on the sidewalls of polysilicon gate electrode 410.

A cobalt layer is deposited over the MOS structure, and in particular over the exposed silicon surfaces of source and drain regions 402 and 404 and the exposed top surface of polysilicon gate electrode 410 by the process described herein. The cobalt material is deposited to a thickness of at about 1,000 Å or less to provide a sufficient amount of cobalt for the subsequent reaction with the underlying silicon at drain regions 402 and 404. Cobalt may be deposited to a thickness within a range from about 50 Å to about 500 Å on the silicon material. In one aspect, the cobalt layer is then annealed in situ as described herein to form cobalt silicide.

While not shown, a barrier or liner layer of a material, such as titanium nitride, may be deposited on the cobalt material to further enhance the barrier properties of the cobalt layer. The deposition of the titanium nitride layer may replace the step of removing unreacted cobalt as described above. However, the unreacted cobalt and titanium may be removed by the etch process after annealing of the substrate surface according to the annealing processes described herein.

The substrate 400 may then be annealed again according to one of the two-step annealing processes described herein. Dielectric materials 422 may be deposited over the formed structure and etched to provide contact definitions 420 in the device. The contact definitions 420 may then be filled with a contact material, such as tungsten, aluminum, copper, or alloy thereof, by an ALD process, a CVD process, or combinations thereof, such as described herein.

In one aspect, any unreacted cobalt from the annealing processes may be removed from the substrate surface, typically by a wet etch process or plasma etch process, and the cobalt silicide remains as cobalt silicide ($CoSi_2$) portions 414, 416, and 418 of uniform thickness respectively formed over polysilicon gate electrode 410 and over source and drain regions 402 and 404 in silicon substrate 400. Unreacted cobalt may be removed by a plasma process in a DPS® chamber located on the same vacuum processing system, or may be transferred to another processing system for processing. Wet etch process are typically performed in a second processing system.

Cobalt Silicide and Metallic Cobalt Materials by ALD or CVD Processes

In other embodiments, a substrate may be exposed to a series of process sequences to form cobalt-containing contact materials. Generally, the substrate is exposed to at least one preclean process prior to performing at least one deposition process to form and/or deposit a cobalt silicide material, a metallic cobalt material, or combinations thereof on the substrate. The at least one deposition process for forming the cobalt-containing materials preferably an ALD process, a CVD process, or combinations thereof, but may also include a PVD process or an electroless deposition process. The ALD and CVD processes include plasma-enhanced (PE) processes, such as PE-ALD or PE-CVD processes, as well as pulsed processes, such as a pulsed CVD process or a pulsed PE-CVD process. A metallic contact material is deposited or formed on the substrate in one or multiple steps (e.g., seed layer, bulk layer, or fill layer). Subsequently, the substrate is exposed to a planarization process to remove any excess metallic contact material on the substrate surface. The substrate may be exposed to at least one annealing process prior to, during, or subsequent to any of the deposition processes.

FIGS. 10-16 and 19 depict flow charts of multiple processes that may be used to fabricate substrate 1700, illustrated in FIGS. 17A-17I, as described in embodiments herein. FIGS. 17A-17I illustrate cross-sectional views of electronic devices disposed on substrate 1700 at different stages of interconnect fabrication sequences incorporating multiple embodiments herein. FIGS. 10-16 provide flow charts of processes 1000, 1100, 1200, 1300, 1400, 1500, 1600, and 1900 that may be used to form substrate 1700. In other embodiments, processes 2000, 2100, 2200, 2400, and 2600 or steps thereof, as depicted in FIGS. 20-22, 24, and 26, may be used completely or in-part to form substrate 1700 or on other substrates not illustrated herein.

In one embodiment, process 1000 includes exposing substrate 1700 to a preclean process (step 1010), depositing cobalt silicide material 1720 on substrate 1700 (step 1020), depositing metallic cobalt material 1730 on substrate 1700 (step 1030), depositing metallic contact material 1740 on substrate 1700 (step 1040), and exposing substrate 1700 to a planarization process (step 1050).

In another embodiment, process 1100 includes exposing substrate 1700 to a preclean process (step 1110), depositing cobalt silicide material 1720 on substrate 1700 (step 1120), depositing metallic cobalt material 1730 on substrate 1700 (step 1130), exposing substrate 1700 to an annealing process (step 1140), depositing metallic contact material 1740 on substrate 1700 (step 1150), and exposing substrate 1700 to a planarization process (step 1160).

In another embodiment, process 1200 includes exposing substrate 1700 to a preclean process (step 1210), depositing cobalt silicide material 1720 on substrate 1700 (step 1220), exposing substrate 1700 to an annealing process (step 1230), depositing metallic cobalt material 1730 on substrate 1700 (step 1240), depositing metallic contact material 1740 on substrate 1700 (step 1250), and exposing substrate 1700 to a planarization process (step 1260).

In another embodiment, process 1300 includes exposing substrate 1700 to a preclean process (step 1310), depositing cobalt silicide material 1720 on substrate 1700 (step 1320), depositing metallic cobalt material 1730 on substrate 1700 (step 1330), depositing metallic contact material 1740 on substrate 1700 (step 1340), exposing substrate 1700 to a planarization process (step 1350), and exposing substrate 1700 to an annealing process (step 1360).

In another embodiment, process 1400 includes exposing substrate 1700 to a preclean process (step 1410), depositing cobalt silicide material 1720 on substrate 1700 (step 1420), depositing metallic cobalt material 1730 on substrate 1700 (step 1430), depositing metallic contact material 1740 on substrate 1700 (step 1440), exposing substrate 1700 to an annealing process (step 1450), and exposing substrate 1700 to a planarization process (step 1460).

In another embodiment, process 1500 includes exposing substrate 1700 to a preclean process (step 1510), depositing metallic cobalt material 1715 on substrate 1700 (step 1520), exposing substrate 1700 to an annealing process to form cobalt silicide material 1720 (step 1530), depositing metallic cobalt material 1730 on substrate 1700 (step 1540), depositing metallic contact material 1740 on substrate 1700 (step 1550), and exposing substrate 1700 to a planarization process (step 1560).

In another embodiment, process 1600 includes exposing substrate 1700 to a preclean process (step 1610), depositing metallic cobalt material 1715 on substrate 1700 (step 1620), exposing substrate 1700 to an annealing process to form cobalt silicide material 1720 (step 1630), depositing metallic contact material 1740 on substrate 1700 (step 1640), and exposing substrate 1700 to a planarization process (step 1650).

In another embodiment, process 1900 includes exposing substrate 1700 to a preclean process (step 1910), depositing cobalt silicide material 1720 on substrate 1700 (step 1920), depositing metallic contact material 1740 on substrate 1700 (step 1930), and exposing substrate 1700 to a planarization process (step 1940).

FIG. 17A illustrates a cross-sectional view of substrate 1700 having contact aperture 1710 formed within silicon-containing layer 1702. Contact aperture 1710 has wall surfaces 1712 and bottom surface 1714. Silicon-containing layer 1702 may contain a dielectric material that includes silicon, polysilicon, amorphous silicon, epitaxial silicon, silicon dioxide and other silicon oxides, silicon on insulator (SOI), silicon oxynitride, doped variants thereof, fluorine-doped silicate glass (FSG), or carbon-doped silicon oxides, such as $SiO_xC_y$, for example, BLACK DIAMOND® low-k dielectric, available from Applied Materials, Inc., located in Santa Clara, Calif. Contact aperture 1710 may be formed in silicon-containing layer 1702 using conventional lithography and etching techniques to expose bottom surface 1714, such as a bit line layer. Alternatively, silicon-containing layer 1702 may be deposited on substrate 1700 forming contact aperture 1710 therein. Silicon-containing layer 1702 and bottom surface 1714 may contain pure silicon or a silicon-containing material that contains germanium, carbon, boron, phosphorous, arsenic, metals, or combinations thereof, among other dopants. For example, bottom surface 1714 may contain silicon, silicon carbide, silicon germanium, silicon germanium carbide, metal silicide, doped variants thereof, or combinations thereof. In one example, bottom surface 1714 is a MOS type source or a drain interface and is generally a doped (e.g., n+ or p+) silicon region of substrate 1700.

Native surface 1704 may contain an oxide layer, a contaminant, or combinations thereof disposed on substrate 1700. In one example, native surface 1704 contains a native oxide layer that is formed upon the oxidation of bottom surface 1714 during an exposure to air subsequent to etching and ashing processes used to form contact aperture 1710. Native surface 1704 may be a continuous layer or a discontinuous layer across bottom surface 1714 and include surface terminations of oxygen, hydrogen, hydroxide, halide, metals, or combinations thereof. Native surface 1704 may also contain various contaminants, such as organic and inorganic residues and particulate. Native surface 1704 formed on bottom surface 1714 generally contains a metastable lower quality oxide (e.g., $SiO_x$, where x is between 0 and 2) compared to the much more stable oxide materials that are typically used to form silicon-containing layer 1702 (e.g., $SiO_2$), such as thermal oxides. The metastable lower quality oxide (e.g., the "native oxide") is much easier to remove from bottom surface 1714 than silicon-containing layer 1702, probably due to a lower activation energy than the material of silicon-containing layer 1702.

Pre- and Post Treatment and Soak Processes

FIG. 17B illustrates substrate 1700 containing exposed surface 1706 of bottom surface 1714 subsequent to the removal of native surface 1704. Exposed surface 1706 may be formed by at least one pretreatment process during steps 1010, 1110, 1210, 1310, 1410, 1510, and 1610 of processes 1000-1600, as described by embodiments herein. In other embodiments, exposed surfaces (e.g., silicon-containing) on other substrates may be formed by at least one pre-treatment process or pre-soak process during steps 2210, 2410, 2430, 2450, 2610, and 2630, processes 2200, 2400, and 2600, as described herein. A preclean process may be used to remove native surface 1704 and reveal a silicon-containing surface of exposed surface 1706.

In one embodiment, the preclean process may be a wet clean process, such as a buffered oxide etch (BOE) process, a SC1 process, a SC2 process, or a HF-last process. Alternatively, the preclean process may be a dry clean process, such as a plasma etch process. For example, a plasma etch process that may be used during a preclean process is the SICONI™ preclean process, available from Applied Materials, Inc., located in Santa Clara, Calif. Pretreatment processes, such as a preclean process and an activation process for forming exposed surface 1706, are further described below. In another embodiment, substrate 1700 is exposed to reducing hydrogen plasma that chemically reduces native surface 1704 to a silicon-containing surface of exposed surface 1706.

Exposed surfaces, such as exposed surface 1706, may be a silicon-containing surface of an underlying material layer or of the actual substrate and include materials of silicon, silicon oxide, silicon germanium, silicon carbon, silicon germanium carbon, derivatives thereof, doped derivatives, or combinations thereof. The exposed surfaces may be crystalline, polycrystalline, or amorphous. In one example, an exposed surface may be a crystalline surface of the actual underlying silicon substrate. In another example, an exposed surface may be an epitaxially deposited silicon-containing material. In another example, an exposed surface may be a polycrystalline silicon-containing material. In another example, an exposed surface may be a silicon oxide or silicon oxynitride material.

Throughout the application, the terms "silicon-containing" materials, films, or layers should be construed to include a composition containing at least silicon and may contain germanium, carbon, oxygen, boron, arsenic, and/or phosphorus. Other elements, such as metals, halogens or hydrogen may be incorporated within a silicon-containing material, film or layer, usually as impurities.

Wet Clean Processes

In one embodiment, substrate 1700 may be exposed to a wet clean process to remove native surface 1704 and to form exposed surface 1714 during steps 1010, 1110, 1210, 1310, 1410, 1510, 1610, and 1910. In another embodiment, other substrates (not shown) may be exposed to a wet clean process to remove any native surfaces and to form exposed surfaces during steps 2210, 2410, and 2610 in processes 2200, 2400, and 2600. Substrate 1700 may be treated by wet clean processes, such as an acidic cleaning process (e.g., a solution containing hydrochloric acid and hydrogen peroxide held at elevated temperature, such as SC2 clean), a basic cleaning process (e.g., a solution containing ammonium hydroxide and hydrogen peroxide held at elevated temperature, such as SC1 clean), or a series of wet cleans containing both acidic and basic cleaning processes. In a preferred embodiment, substrate 1700 is exposed to a SC1 solution (e.g., TMAH and $H_2O_2$) to remove organic residues and other contaminants and subsequently, exposed to a BOE solution (e.g., 0.5 M of TEA-HF solution) to remove native oxides.

A wet clean process may include dispensing a wet clean solution across or sprayed on the surface of substrate 1700. The wet clean process may be an in situ process performed in the same processing cell as a subsequent electroless deposition process. Alternatively, substrate 1700 may be wet cleaned in a separate processing cell from the subsequent electroless deposition processing cell. A wet-clean pretreatment process may occur for about 10 minutes or less, such as within a range from about 5 seconds to about 5 minutes, preferably, from about 5 seconds to about 3 minutes, more preferably, from about 10 seconds to about 2 minutes, and more preferably, from about 15 seconds to about 1 minute. During the pretreatment process, the substrate is maintained at a temperature within a range from about 15° C. to about 50° C., preferably, about room temperature (e.g., 20° C.). The wet-clean process may be performed in a TEMPEST™ wet-clean system, available from Applied Materials, Inc., located in Santa Clara, Calif. Other examples of various wet-clean processes that may be used to remove native surface 1704 are further described in commonly assigned U.S. Ser. No. 11/385,484, filed Mar. 20, 2006, and published as US 2006-0251801, U.S. Ser. No. 11/385,344, filed Mar. 20, 2006, and published as US 2006-0251800, and U.S. Ser. No. 11/385, 290, filed Mar. 20, 2006, and published as US 2006-0252252, which are all incorporated by reference herein in their entirety.

In one embodiment, native surface 1704 may be removed by a HF-last solution to form exposed surface 1714 as a substantially oxide-free, silicon hydride surface. In one example, the wet-clean process utilizes an HF-last solution containing water, HF and optional additives including chelators, surfactants, reductants, other acids or combinations thereof. In one example, the hydrogen fluoride concentration of a wet-clean solution may be within a range from about 10 ppm to about 5 wt %, preferably, from about 50 ppm to about 2 wt %, and more preferably, from about 100 to about 1 wt %, for example, about 0.5 wt %. In another embodiment, native surface 1704 is removed during a liquid reduction process to form exposed surface 1714 as a substantially oxide-free, silicon-containing surface.

SC1 and SC2 Processes

In one embodiment, substrate 1700 containing native surface 1704 may be exposed to a SC1 clean solution to remove contaminants, such as organic and inorganic residues and particulates while forming exposed surface 1706 during steps 1010, 1110, 1210, 1310, 1410, 1510, and 1610. In another embodiment, other substrates (not shown) may be exposed to a SC1 clean solution to remove contaminants, such as organic and inorganic residues and particulates while forming exposed surface during steps 2210, 2410, and 2610. In one example, the SC1 clean solution contains hydrogen peroxide and at least one basic compound, such as ammonium hydroxide, tetramethylammonium hydroxide, ethanolamine, diethanolamine, triethanolamine, derivatives thereof, salts thereof, or combinations thereof. The substrate may be heated to a temperature within a range from about 50° C. to about 100° C., preferably, from about 70° C. to about 90° C.

In another embodiment, substrate 1700 containing native surface 1704 may be exposed to a SC2 clean solution during steps 1010, 1110, 1210, 1310, 1410, 1510, and 1610. In another embodiment, other substrates (not shown) may be exposed to a SC2 clean solution during steps 2210, 2410, and 2610. In one example, the SC2 clean solution contains hydrogen peroxide and hydrogen chloride. The substrate may be heated to a temperature within a range from about 50° C. to about 100° C., preferably, from about 70° C. to about 90° C.

BOE Processes and Solutions

In another embodiment of a preclean process, buffered oxide etch (BOE) solutions and processes may be used to selectively remove native oxides and other contaminants from substrate 1700 during steps 1010, 1110, 1210, 1310, 1410, 1510, 1610, and 1910. Also, other substrates may be used to selectively remove native oxides and other contaminants from the substrate during steps 2210, 2410, and 2610. The BOE solutions generally contain an alkylamine compound or an alkanolamine compound and an etchant, such as hydrogen fluoride. The alkanolamine compounds may include ethanolamine (EA), diethanolamine (DEA), triethanolamine (TEA), or derivatives thereof. In one example, native surface 1704 may be removed to form exposed surface 1714 by exposing substrate 1700 to a BOE solution containing about 0.5 M of TEA-HF solution for about 25 seconds at about 20° C. In another example, substrate 1700 may be exposed to a BOE solution containing about 0.5 M of EA-HF solution for about 20 seconds at about 20° C. In another example, substrate 1700 may be exposed to a BOE solution containing about 0.5 M of DEA-HF solution for about 30 seconds at about 20° C. Other examples of BOE wet-clean processes that may be used to remove native surface 1704 are further described in commonly assigned U.S. Ser. No. 11/385,041, filed Mar. 20, 2006, which is herein incorporated by reference in its entirety.

Plasma Etch Process

In another embodiment, substrate 1700 may be exposed to a plasma etch process or a plasma clean process remove native surface 1704 and to form exposed surface 1714 during steps 1010, 1110, 1210, 1310, 1410, 1510, 1610, and 1910. In another embodiment, other substrates may be exposed to a plasma etch process or a plasma clean process remove any native surfaces and to form an exposed surface during steps 2210, 2410, and 2610. Also, the plasma etch process may be used to remove native oxides and other contaminants formed on exposed contact surfaces prior to several processes described herein, such as an electroless deposition process. Surfaces exposed to the plasma etch process usually have an improve adhesion of subsequently deposited metal layers. The plasma etch process is performed in a chamber adapted to perform a chemical etch clean and in-situ anneal on substrates.

An exemplary plasma etch process for removing native oxides on a surface of the substrate using an ammonia ($NH_3$) and nitrogen trifluoride ($NF_3$) gas mixture performed within a plasma etch processing chamber will now be described. The plasma etch process begins by placing a substrate into a plasma etch processing chamber. During processing, the substrate may be cooled below 65° C., such as between 15° C. and 50° C. In another example, the substrate is maintained at a temperature of between 22° C. and 40° C. Typically, the substrate support is maintained below about 22° C. to reach the desired substrate temperatures.

The ammonia gas and nitrogen trifluoride gas are introduced into the dry etching chamber to form a cleaning gas mixture. The amount of each gas introduced into the chamber is variable and may be adjusted to accommodate, for example, the thickness of the oxide layer to be removed, the geometry of the substrate being cleaned, the volume capacity of the plasma and the volume capacity of the chamber body. In one aspect, the gases are added to provide a gas mixture having at least a 1:1 molar ratio of ammonia to nitrogen trifluoride. In another aspect, the molar ratio of the gas mixture is at least about 3 to about 1 (ammonia to nitrogen trifluoride). Preferably, the gases are introduced in the dry etching chamber at a molar ratio of from about 1:1 (ammonia to nitrogen trifluoride) to about 30:1, more preferably, from about 5:1 (ammonia to nitrogen trifluoride) to about 30:1. More preferably, the molar ratio of the gas mixture is of from about 5 to 1 (ammonia to nitrogen trifluoride) to about 10 to about 1. The molar ratio of the gas mixture may also fall between about 10:1 (ammonia to nitrogen trifluoride) and about 20:1. Alternatively, a pre-mixed gas mixture of the preferred molar ratio may be used during the plasma etch process.

A purge gas or carrier gas may also be added to the gas mixture. Any suitable purge/carrier gas may be used, such as argon, helium, hydrogen, nitrogen, forming gas, or mixtures thereof. Typically, the overall gas mixture by volume of ammonia and nitrogen trifluoride is within a range from about 0.05% to about 20%. The remainder of the process gas may be the carrier gas. In one embodiment, the purge or carrier gas is first introduced into the chamber body before the reactive gases to stabilize the pressure within the chamber body.

The operating pressure within the chamber body can be variable. The pressure may be maintained within a range from about 500 mTorr to about 30 Torr, preferably, from about 1 Torr to about 10 Torr, and more preferably, from about 3 Torr to about 6 Torr. An RF power within a range from about 5 watts to about 600 watts may be applied to ignite a plasma of the gas mixture within the plasma cavity. Preferably, the RF power is less than about 100 watts. More preferable is that the frequency at which the power is applied is very low, such as less than about 100 kHz, and more preferably, within a range from about 50 kHz to about 90 kHz.

The plasma energy dissociates the ammonia and nitrogen trifluoride gases into reactive species that combine to form a highly reactive ammonia fluoride ($NH_4F$) compound and/or ammonium hydrogen fluoride ($NH_4F$—HF) which reacts with the substrate surface. In one embodiment, the carrier gas is first introduced into the dry etch chamber, a plasma of the carrier gas is generated, and then the reactive gases, ammonia and nitrogen trifluoride, are added to the plasma.

Not wishing to be bound by theory, it is believed that the etchant gas, $NH_4F$ and/or $NH_4F$—HF, reacts with the native oxide surface to form ammonium hexafluorosilicate (($NH_4)_2SiF_6$), ammonia, and water. The ammonia and water are vapors at processing conditions and removed from the chamber by a vacuum pump attached to the chamber. A thin film of ammonium hexafluorosilicate is left behind on the substrate surface.

The thin film of ammonium hexafluorosilicate on the substrate surface may be removed during a vacuum sublimation process. The process chamber radiates heat to dissociate or sublimate the thin film of ammonium hexafluorosilicate into volatile $SiF_4$, $NH_3$, and HF products. These volatile products are then removed from the chamber by the vacuum pump attached to the system. In one example, a temperature of about 75° C. or higher is used to effectively sublimate and remove the thin film from the substrate. Preferably, a temperature of about 100° C. or higher is used, such a temperature within a range from about 115° C. to about 200° C. Once the film has been removed from the substrate, the chamber is purged and evacuated prior to removing the cleaned substrate.

A plasma cleaning processes may be performed using a vacuum preclean chamber, such as a SICONI™ Preclean chamber and process, both available from Applied Materials, Inc., located in Santa Clara, Calif. Further description of a plasma-assisted dry etch chamber and plasma etch process that may be used by embodiment herein is disclosed in commonly assigned U.S. Ser. No. 11/063,645, filed on Feb. 22, 2005, and published as US 2005-0230350, and U.S. Ser. No. 11/192,993, filed on Jul. 29, 2005, and published as US 2006-0033678 which are hereby incorporated by reference in their entirety to the extent not inconsistent with the claimed invention.

Inert Plasma Process

In another embodiment, substrate 1700 containing native surface 1704 may be exposed to an inert plasma process to remove contaminants, such as organic and inorganic residues and particulates while forming exposed surface 1706 during steps 1010, 1110, 1210, 1310, 1410, 1510, 1610, and 1910. In another embodiment, other substrates containing a native surface may be exposed to an inert plasma process to remove contaminants, such as organic and inorganic residues and particulates while forming an exposed surface during steps 2210, 2410, and 2610. In one example, the inert plasma preclean is the Ar+ Preclean Process, available from Applied Materials, Inc., located in Santa Clara, Calif. Substrate 1700 may be transferred into a plasma chamber, such as the CENTURA® DPN chamber, available from Applied Materials, Inc., located in Santa Clara, Calif. In one aspect, the plasma chamber is on the same cluster tool as the ALD chamber or the CVD chamber used to deposit cobalt silicide material 1720 or metallic cobalt material 1715 or 1730. Therefore, substrate 1700 may be exposed to an inert plasma process without being exposed to the ambient environment. During the inert plasma process, native surface 1704 is bombarded with ionic argon formed by flowing argon into the DPN chamber. Gases that may be used in an inert plasma process include argon, helium, neon, xenon, or combinations thereof.

The inert plasma process proceeds for a time period from about 10 seconds to about 5 minutes, preferably, from about 30 seconds to about 4 minutes, and more preferably, from about 1 minute to about 3 minutes. Also, the inert plasma process is conducted at a plasma power setting within a range from about 500 watts to about 3,000 watts, preferably from about 700 watts to about 2,500 watts, and more preferably from about 900 watts to about 1,800 watts. Generally, the plasma process is conducted with a duty cycle of about 50% to about 100% and a pulse frequency at about 10 kHz. The plasma chamber may have a pressure within a range from about 10 mTorr to about 80 mTorr. The inert gas may have a flow rate within a range from about 10 standard cubic centimeters per minute (sccm) to about 5 standard liters per minute (slm), preferably from about 50 sccm to about 750 sccm, and more preferably from about 100 sccm to about 500 sccm. In a preferred embodiment, the inert plasma process is a nitrogen free argon plasma produced in a plasma chamber.

Deposition of Cobalt-Containing Materials

FIGS. 17C-17E illustrate substrate 1700 having cobalt-containing materials deposited and/or formed thereon, as described by embodiments herein. The cobalt-containing materials include cobalt silicide material 1720, metallic cobalt material 1715, and/or metallic cobalt material 1730 and may be deposited or formed by an ALD process, a CVD process, a PVD process, an electroless deposition process, or combinations thereof.

In one embodiment, process 1000 includes depositing cobalt silicide material 1720 onto substrate 1700 (step 1020) and depositing metallic cobalt material 1730 onto substrate 1700 (step 1030), as depicted in FIGS. 17D and 17E. In one example, cobalt silicide material 1720 and metallic cobalt material 1730 are deposited in the same processing chamber, such as an ALD chamber, a CVD chamber, or a PVD chamber. In another example, cobalt silicide material 1720 and metallic cobalt material 1730 are deposited in the separate processing chambers, such as an ALD chamber, a CVD chamber, or a PVD chamber.

In another embodiment, process 1100 includes depositing cobalt silicide material 1720 onto substrate 1700 (step 1120), depositing metallic cobalt material 1730 onto substrate 1700 (step 1130), and exposing substrate 1700 to an annealing process (step 1140), as depicted in FIGS. 17D and 17E. In one example, cobalt silicide material 1720 and metallic cobalt material 1730 are deposited and the annealing process is conducted within the same processing chamber, such as an ALD chamber, a CVD chamber, or a PVD chamber. In another example, cobalt silicide material 1720 and metallic cobalt material 1730 are deposited in the same processing chamber and the annealing process is conducted in an annealing chamber. In another example, cobalt silicide material 1720 and metallic cobalt material 1730 are deposited in the separate processing chambers, such as an ALD chamber, a CVD chamber, or a PVD chamber and the annealing process is conducted in either of the processing chambers. In another example, cobalt silicide material 1720 and metallic cobalt material 1730 are deposited in the separate processing chambers, such as an ALD chamber, a CVD chamber, or a PVD chamber and the annealing process is conducted in an annealing chamber.

In another embodiment, process 1200 includes depositing cobalt silicide material 1720 onto substrate 1700 (step 1220), exposing substrate 1700 to an annealing process (step 1230), and depositing metallic cobalt material 1730 onto substrate 1700 (step 1240), as depicted in FIGS. 17D and 17E. In one example, cobalt silicide material 1720 and metallic cobalt material 1730 are deposited and the annealing process is conducted within the same processing chamber, such as an ALD chamber, a CVD chamber, or a PVD chamber. In another example, cobalt silicide material 1720 and metallic cobalt material 1730 are deposited in the same processing chamber and the annealing process is conducted in an annealing chamber. In another example, cobalt silicide material 1720 and metallic cobalt material 1730 are deposited in the separate processing chambers, such as an ALD chamber, a CVD chamber, or a PVD chamber and the annealing process is conducted in either of the processing chambers. In another example, cobalt silicide material 1720 and metallic cobalt material 1730 are deposited in the separate processing chambers, such as an ALD chamber, a CVD chamber, or a PVD chamber and the annealing process is conducted in an annealing chamber.

In another embodiment, process 1300 includes depositing cobalt silicide material 1720 onto substrate 1700 (step 1320), depositing metallic cobalt material 1730 onto substrate 1700 (step 1330), as depicted in FIGS. 17D and 17E. Subsequently, substrate 1700 is exposed to an annealing process (step 1360). In one example, cobalt silicide material 1720 and metallic cobalt material 1730 are deposited and the annealing process is conducted within the same processing chamber, such as an ALD chamber, a CVD chamber, or a PVD chamber. In another example, cobalt silicide material 1720 and metallic cobalt material 1730 are deposited in the same processing chamber and the annealing process is conducted in an annealing chamber. In another example, cobalt silicide material 1720 and metallic cobalt material 1730 are deposited in the separate processing chambers, such as an ALD chamber, a CVD chamber, or a PVD chamber and the annealing process is conducted in either of the processing chambers. In another example, cobalt silicide material 1720 and metallic cobalt material 1730 are deposited in the separate processing chambers, such as an ALD chamber, a CVD chamber, or a PVD chamber and the annealing process is conducted in an annealing chamber.

In another embodiment, process 1400 includes depositing cobalt silicide material 1720 onto substrate 1700 (step 1420), depositing metallic cobalt material 1730 onto substrate 1700 (step 1430), as depicted in FIGS. 17D and 17E. Subsequently, substrate 1700 is exposed to an annealing process (step 1450). In one example, cobalt silicide material 1720 and metallic cobalt material 1730 are deposited and the annealing process is conducted within the same processing chamber, such as an ALD chamber, a CVD chamber, or a PVD chamber. In another example, cobalt silicide material 1720 and metallic cobalt material 1730 are deposited in the same processing chamber and the annealing process is conducted in an annealing chamber. In another example, cobalt silicide material 1720 and metallic cobalt material 1730 are deposited in the separate processing chambers, such as an ALD chamber, a CVD chamber, or a PVD chamber and the annealing process is conducted in either of the processing chambers. In another example, cobalt silicide material 1720 and metallic cobalt material 1730 are deposited in the separate processing chambers, such as an ALD chamber, a CVD chamber, or a PVD chamber and the annealing process is conducted in an annealing chamber.

In another embodiment, process 1500 includes depositing metallic cobalt material 1715 onto substrate 1700 (step 1520) and exposed to an annealing process (step 1530) to form cobalt silicide material 1720 during a salicide process or a silicidation process, as depicted in FIGS. 17C and 17D. In one aspect, metallic cobalt material 1715 may be completely consumed to form cobalt silicide material 1720 during the salicide process or the silicidation process. Cobalt silicide material 1720 is formed from silicon atoms of the exposed surface 1706 and cobalt atoms of metallic cobalt material 1715. Thereafter, metallic cobalt material 1730 may be deposited onto substrate 1700 (step 1540), as depicted in FIG. 17E.

In another embodiment, process 1500 includes depositing metallic cobalt material 1715 onto substrate 1700 (step 1520) and exposed to an annealing process (step 1530) to form cobalt silicide material 1720 from only a portion of metallic cobalt material 1715 during a salicide or silicidation process, as depicted in FIGS. 17C and 17E. Metallic cobalt material 1715 is only partially consumed to form cobalt silicide material 1720 while the remaining portion stays metallic cobalt. Therefore, the remaining portion of metallic cobalt material 1715 after the salicide or silicidation process is metallic cobalt material 1730, as depicted in FIG. 17E. Optionally, additional metallic cobalt material 1730 may be deposited onto substrate 1700 (step 1540).

In one example, metallic cobalt material 1715 is deposited and the annealing process is conducted within the same processing chamber, such as an ALD chamber, a CVD chamber, or a PVD chamber. In another example, metallic cobalt material 1715 is deposited in a processing chamber and the annealing process is conducted in an annealing chamber. In another example, metallic cobalt material 1715 and metallic cobalt material 1730 are deposited in the separate processing chambers, such as an ALD chamber, a CVD chamber, or a PVD chamber and the annealing process is conducted in either of the processing chambers. In another example, metallic cobalt material 1715 and metallic cobalt material 1730 are deposited in the separate processing chambers, such as an ALD chamber, a CVD chamber, or a PVD chamber and the annealing process is conducted in an annealing chamber.

In another embodiment, process 1600 includes depositing metallic cobalt material 1715 onto substrate 1700 (step 1620) and exposed to an annealing process (step 1630) to form cobalt silicide material 1720 during a salicide or silicidation process, as depicted in FIGS. 17C and 17D. In one aspect, metallic cobalt material 1715 may be completely consumed to form cobalt silicide material 1720 during the salicide process or the silicidation process (FIG. 17D). In another aspect, metallic cobalt material 1715 is only partial consumed to form cobalt silicide material 1720 while the remaining portion of metallic cobalt material 1715 is depicted as metallic cobalt material 1730 (FIG. 17E). In one example, metallic cobalt material 1715 is deposited and the annealing process is conducted within the same processing chamber, such as an ALD chamber, a CVD chamber, or a PVD chamber. In another example, metallic cobalt material 1715 is deposited in a processing chamber and the annealing process is conducted in an annealing chamber.

In one embodiment, process 1900 includes depositing cobalt silicide material 1720 onto substrate 1700 (step 1920), as depicted in FIG. 17D. Cobalt silicide material 1720 may be deposited in an ALD chamber, a CVD chamber, or a PVD chamber.

Deposition of Cobalt Silicide and Metallic Cobalt Materials

Figure 18:
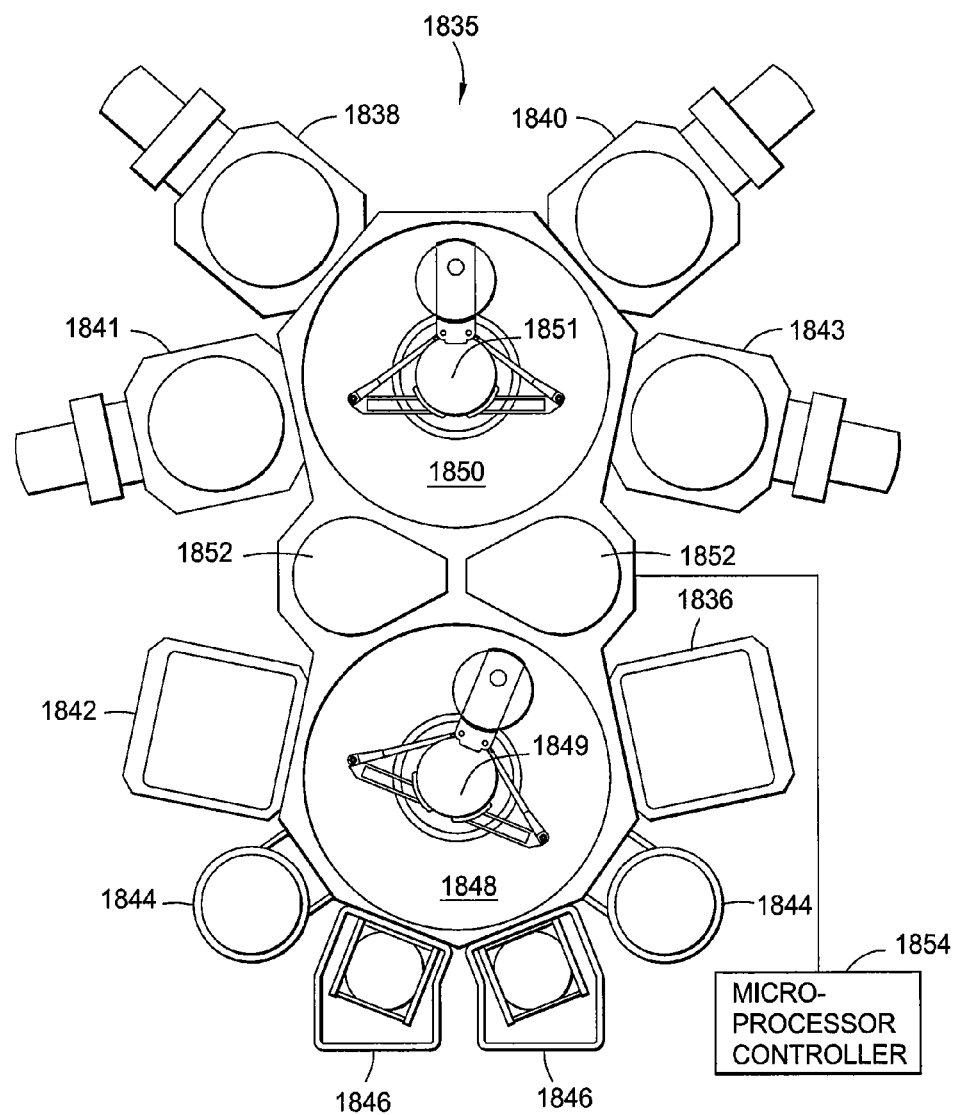
FIG. 18 illustrates a schematic top view of an integrated multi-chamber apparatus as described by embodiments herein.
Figure 19:
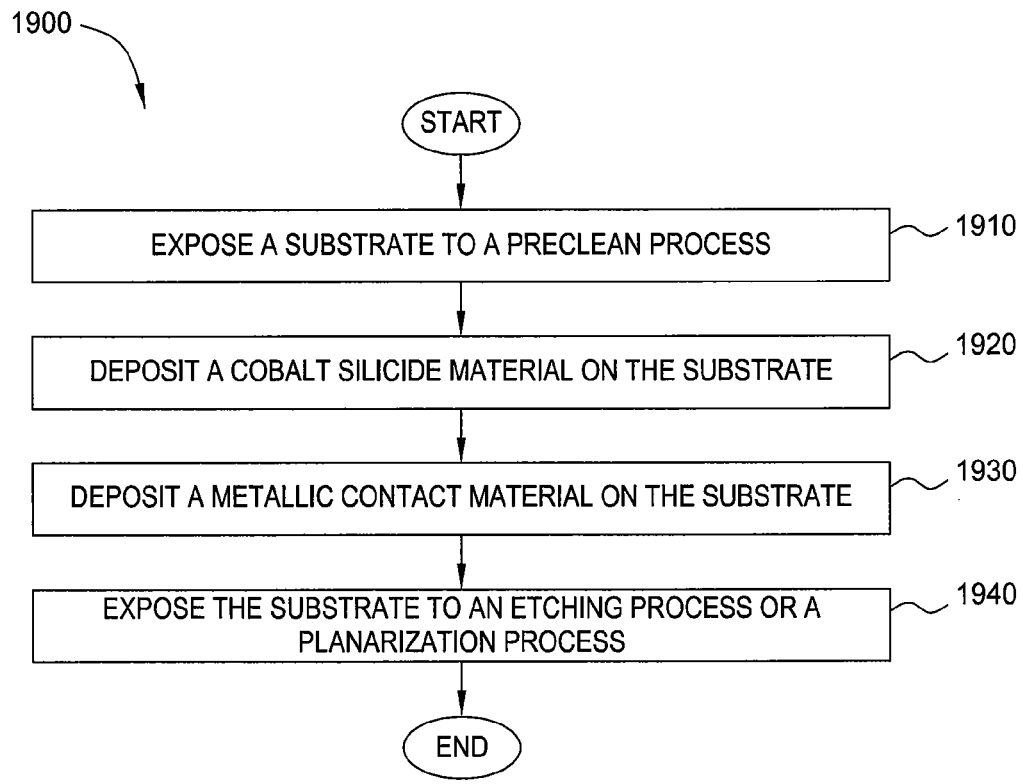
FIG. 19 shows a flow-chart of another integrated process described by embodiments herein.

FIG. 18 shows an integrated multi-chamber substrate processing system suitable for performing at least one embodiment of the deposition and annealing processes described herein. The preclean, deposition, and annealing processes may be performed in a multi-chamber processing system or cluster tool having at least one ALD chamber, at least one CVD chamber, at least one PVD chamber, or at least one annealing chamber disposed thereon. A processing platform that may be used to during processes described herein is an ENDURA® processing platform commercially available from Applied Materials, Inc., located in Santa Clara, Calif.

FIG. 18 is a schematic top view of one embodiment of a processing platform system 1835 including two transfer chambers 1848 and 1850, transfer robots 1849 and 1851, disposed within transfer chambers 1848 and 1850 respectfully, and a plurality of processing chambers 1836, 1838, 1840, 1841, 1842, and 1843, disposed on the two transfer chambers 1848 and 1850. The first transfer chamber 1848 and the second transfer chamber 1850 are separated by pass-through chambers 1852, which may comprise cool-down or pre-heating chambers. Pass-through chambers 1852 also may be pumped down or ventilated during substrate handling when the first transfer chamber 1848 and the second transfer chamber 1850 operate at different pressures. For example, the first transfer chamber 1848 may operate at a pressure within a range from about 100 milliTorr to about 5 Torr, such as about 400 milliTorr, and the second transfer chamber 1850 may operate at a pressure within a range from about $1\times10^{-8}$ Torr to about $1\times10^{-8}$ Torr, such as about $1\times10^{-7}$ Torr. Processing platform system 1835 is automated by programming a microprocessor controller 1854. The substrates may be transferred between various chambers within processing platform system 1835 without breaking a vacuum or exposing the substrates to other external environmental conditions.

The first transfer chamber 1848 may be coupled with two degas chambers 1844, two load lock chambers 1846, and pass-through chambers 1852. The first transfer chamber 1848 may also have reactive preclean chamber 1842 and chamber 1836, may be an ALD process chamber or a CVD chamber. The preclean chamber 1842 may be a PreClean II chamber, commercially available from Applied Materials, Inc., of Santa Clara, Calif. Substrates (not shown) are loaded into processing platform system 1835 through load-lock chambers 1846. Thereafter, the substrates are sequentially degassed and cleaned in degas chambers 1844 and the preclean chamber 1842, respectively. The transfer robot 1849 moves the substrate between the degas chambers 1844 and the preclean chamber 1842. The substrate may then be transferred into chamber 1836. In one embodiment, degas chambers 1844 may be used during the annealing processes described herein.

The second transfer chamber 1850 is coupled to a cluster of process chambers 1838, 1840, 1841, and 1843. In one example, chambers 1838 and 1840 may be ALD chambers for depositing materials, such as cobalt silicide, metallic cobalt, or tungsten, as desired by the operator. In another example, chambers 1838 and 1840 may be CVD chambers for depositing materials, such as tungsten, as desired by the operator. An example of a suitable CVD chamber includes WXZ™ chambers, commercially available from Applied Materials, Inc., located in Santa Clara, Calif. The CVD chambers may be adapted to deposit materials by ALD techniques as well as by conventional CVD techniques. Chambers 1841 and 1843 may be rapid thermal annealing (RTA) chambers, or rapid thermal process (RTP) chambers, that may be used to anneal substrates at low or extremely low pressures. An example of an RTA chamber is a RADIANCE® chamber, commercially available from Applied Materials, Inc., Santa Clara, Calif. Alternatively, the chambers 1841 and 1843 may be WXZ™ deposition chambers capable of performing high temperature CVD deposition, annealing processes, or in situ deposition and annealing processes. The PVD processed substrates are moved from transfer chamber 1848 into transfer chamber 1850 via pass-through chambers 1852. Thereafter, transfer robot 1851 moves the substrates between one or more of the process chambers 1838, 1840, 1841, and 1843 for material deposition and annealing as required for processing.

RTA chambers (not shown) may also be disposed on the first transfer chamber 1848 of processing platform system 1835 to provide post deposition annealing processes prior to substrate removal from processing platform system 1835 or transfer to the second transfer chamber 1850. In one example, the substrate may be transferred between chambers within processing platform system 1835 without a vacuum break.

While not shown, a plurality of vacuum pumps is disposed in fluid communication with each transfer chamber and each of the processing chambers to independently regulate pressures in the respective chambers. The pumps may establish a vacuum gradient of increasing pressure across the apparatus from the load lock chamber to the processing chambers.

Alternatively, a plasma etch chamber, such as a DPS® (decoupled plasma source) chamber manufactured by Applied Materials, Inc., of Santa Clara, Calif., may be coupled to processing platform system 1835 or in a separate processing system for etching the substrate surface to remove excess material after a vapor deposition process, annealing the deposited cobalt-containing material, or forming a silicide during a salicide process. For example in forming cobalt silicide from cobalt and silicon material by an annealing process, the etch chamber may be used to remove excess cobalt material from the substrate surface. Embodiments of the invention also contemplate the use of other etch processes and apparatus, such as a wet etch chamber, used in conjunction with the process and apparatus described herein.

In one embodiment, substrate 1700 may initially be exposed to a degassing process for about 5 minutes or less, for example, about 1 minute, while heating substrate 1700 to a temperature within a range from about 250° C. to about 400° C., for example, about 350° C. The degassing process may further include maintaining the substrate in a reduced vacuum at a pressure in the range from about $1 \times 10^{-7}$ Torr to about $1 \times 10^{-5}$ Torr, for example, about $5 \times 10^{-6}$ Torr. The degassing process removes volatile surface contaminants, such as water vapor, solvents or volatile organic compounds.

Cobalt silicide material 1720 may be formed using a CVD process, an ALD process, or combinations thereof, as described herein (FIG. 17D). Generally, a single cycle of the ALD process includes sequentially exposing substrate 1700 to a cobalt precursor and a silicon precursor to form cobalt silicide material 1720. The ALD cycle is repeated until cobalt silicide material 1720 has a desired thickness.

The thickness for cobalt silicide material 1720 is variable depending on the device structure to be fabricated. In one embodiment, the thickness of cobalt silicide material 1720 is less than about 300 Å, preferably, within a range from about 5 Å to about 200 Å, more preferably, from about 10 Å to about 100 Å, more preferably, from about 15 Å to about 50 Å, and more preferably, from about 25 Å to about 30 Å. Metallic cobalt materials 1715 or 1730 may have a film thickness within a range from about 5 Å to about 300 Å, preferably, from about 10 Å to about 100 Å, more preferably, from about 20 Å to about 70 Å, and more preferably, from about 40 Å to about 50 Å, for example, about 45 Å.

In one embodiment, the ALD chamber or substrate 1700 may be heated to a temperature of less than about 500° C., preferably within a range from about 100° C. to about 450° C., and more preferably, from about 150° C. to about 400° C., for example, about 300° C. The relatively low deposition temperature is highly advantageous since as mentioned previously, the risk of device damage, particularly where low-k materials are employed, rises significantly as temperatures are above about 400° C.

Cobalt-Containing Materials by CVD or ALD

Embodiments of the invention provide a method to deposit cobalt-containing materials on a substrate by various vapor deposition processes, such as ALD, plasma-enhanced ALD (PE-ALD), CVD, and plasma-enhanced CVD (PE-CVD). The plasma-enhanced processes may generate a plasma in situ or by a remote plasma source (RPS). Cobalt-containing materials include cobalt silicide material 1720 and metallic cobalt materials 1715 and 1730, as described herein. In one embodiment, the cobalt-containing material is deposited on a substrate by sequentially exposing the substrate to a reagent and a cobalt precursor during an ALD process. In one embodiment, a silicon precursor is used as the reagent to form cobalt silicide material 1720 as a cobalt-containing material. In another embodiment, at least one reducing agent is used as the reagent to form metallic cobalt materials 1715 and 1730 as a cobalt-containing material.

In one embodiment, a cobalt-containing material may be formed during a PE-ALD process containing a constant flow of a reagent gas while providing sequential pulses of a cobalt precursor and a plasma. In another embodiment, a cobalt-containing material may be formed during another PE-ALD process that provides sequential pulses of a cobalt precursor and a reagent plasma. In both of these embodiments, the reagent is generally ionized during the process. Also, the PE-ALD process provides that the plasma may be generated external from the process chamber, such as by a RPS system, or preferably, the plasma may be generated in situ a plasma capable ALD process chamber. During PE-ALD processes, a plasma may be generated from a microwave (MW) frequency generator or a radio frequency (RF) generator. In a preferred example, an in situ plasma is generated by a RF generator. In another embodiment, a cobalt-containing material may be formed during a thermal ALD process that provides sequential pulses of a cobalt precursor and a reagent.

An ALD process chamber used during embodiments described herein is available from Applied Materials, Inc., located in Santa Clara, Calif. A detailed description of an ALD process chamber may be found in commonly assigned U.S. Pat. Nos. 6,916,398 and 6,878,206, commonly assigned U.S. Ser. No. 10/281,079, filed on Oct. 25, 2002, and published as US 2003-0121608, and commonly assigned U.S. Ser. Nos. 11/556,745, 11/556,752, 11/556,756, 11/556,758, 11/556,763, each entitled "Apparatus and Process for Plasma-Enhanced Atomic Layer Deposition," and each filed Nov. 6, 2006, which are hereby incorporated by reference in their entirety. In another embodiment, a chamber configured to operate in both an ALD mode as well as a conventional CVD mode may be used to deposit cobalt-containing materials is described in commonly assigned U.S. Ser. No. 10/712, 690, filed on Nov. 13, 2003, and issued as U.S. Pat. No. 7,204,886, which is incorporated herein by reference in its entirety. A detailed description of an ALD process for forming cobalt-containing materials is further disclosed in commonly assigned U.S. Ser. No. 10/443,648, filed on May 22, 2003, and published as US 2005-0220998, and commonly assigned U.S. Ser. No. 10/634,662, filed Aug. 4, 2003, and published as US 2004-0105934, which are hereby incorporated by reference in their entirety. In other embodiments, a chamber configured to operate in both an ALD mode as well as a conventional CVD mode that may be used to deposit cobalt-containing materials is the TXZ showerhead and CVD chamber available from Applied Materials, Inc., located in Santa Clara, Calif.

The process chamber may be pressurized during the ALD process at a pressure within a range from about 0.1 Torr to about 80 Torr, preferably from about 0.5 Torr to about 10 Torr, and more preferably, from about 1 Torr to about 5 Torr. Also, the chamber or the substrate may be heated to a temperature of less than about 500° C., preferably within a range from about 100° C. to about 450° C., and more preferably, from about 150° C. to about 400° C., for example, about 300° C. During PE-ALD processes, a plasma is ignited within the process chamber for an in situ plasma process, or alternative, may be formed by an external source, such as a RPS system. A plasma may be generated a MW generator, but preferably by a RF generator. The RF generator may be set at a frequency within a range from about 100 kHz to about 60 MHz. In one example, a RF generator, with a frequency of 13.56 MHz, may be set to have a power output within a range from about 100 watts to about 1,000 watts, preferably, from about 250 watts to about 600 watts, and more preferably, from about 300 watts to about 500 watts. In one example, a RF generator, with a frequency of 400 kHz, may be set to have a power output within a range from about 200 watts to about 2,000 watts, preferably, from about 500 watts to about 1,500 watts. A surface of substrate may be exposed to a plasma having a power per surface area value within a range from about 0.01 watts/cm$^2$ to about 10.0 watts/cm$^2$, preferably, from about 0.05 watts/cm$^2$ to about 6.0 watts/cm$^2$.

The substrate may be for example, a silicon substrate having an interconnect pattern defined in one or more dielectric material layers formed thereon. In one example, the substrate contains a dielectric surface. The process chamber conditions such as, the temperature and pressure, are adjusted to enhance the adsorption of the process gases on the substrate so as to facilitate the reaction of the pyrrolyl cobalt precursors and the reagent gas.

In one embodiment, the substrate may be exposed to a reagent gas throughout the whole ALD cycle. The substrate may be exposed to a cobalt precursor gas formed by passing a carrier gas (e.g., nitrogen or argon) through an ampoule of a cobalt precursor. The ampoule may be heated depending on the cobalt precursor used during the process. In one example, an ampoule containing a cobalt carbonyl compound (e.g., $(CO)_x Co_y L_z$—where X, Y, Z, and L are described herein) or an amido cobalt compound (e.g., $(RR'N)_x Co$) may be heated to a temperature within a range from about 30° C. to about 500° C. The cobalt precursor gas usually has a flow rate within a range from about 100 sccm to about 2,000 sccm, preferably, from about 200 sccm to about 1,000 sccm, and more preferably, from about 300 sccm to about 700 sccm, for example, about 500 sccm. The cobalt precursor gas and the reagent gas may be combined to form a deposition gas. A reagent gas usually has a flow rate within a range from about 100 sccm to about 3,000 sccm, preferably, from about 200 sccm to about 2,000 sccm, and more preferably, from about 500 sccm to about 1,500 sccm. In one example, silane is used as a reagent gas with a flow rate of about 1,500 sccm. The substrate may be exposed to the cobalt precursor gas or the deposition gas containing the cobalt precursor and the reagent gas for a time period within a range from about 0.1 seconds to about 8 seconds, preferably, from about 1 second to about 5 seconds, and more preferably, from about 2 seconds to about 4 seconds. The flow of the cobalt precursor gas may be stopped once the cobalt precursor is adsorbed on the substrate. The cobalt precursor may be a discontinuous layer, continuous layer or even multiple layers.

The substrate and chamber may be exposed to a purge step after stopping the flow of the cobalt precursor gas. The flow rate of the reagent gas may be maintained or adjusted from the previous step during the purge step. Preferably, the flow of the reagent gas is maintained from the previous step. Optionally, a purge gas may be administered into the process chamber with a flow rate within a range from about 100 sccm to about 2,000 sccm, preferably, from about 200 sccm to about 1,000 sccm, and more preferably, from about 300 sccm to about 700 sccm, for example, about 500 sccm. The purge step removes any excess cobalt precursor and other contaminants within the process chamber. The purge step may be conducted for a time period within a range from about 0.1 seconds to about 8 seconds, preferably, from about 1 second to about 5 seconds, and more preferably, from about 2 seconds to about 4 seconds. The carrier gas, the purge gas and the process gas may contain nitrogen, hydrogen, argon, neon, helium, or combinations thereof. In a preferred embodiment, the carrier gas contains nitrogen.

Thereafter, the flow of the reagent gas may be maintained or adjusted before igniting a plasma. The substrate may be exposed to the plasma for a time period within a range from about 0.1 seconds to about 20 seconds, preferably, from about 1 second to about 10 seconds, and more preferably, from about 2 seconds to about 8 seconds. Thereafter, the plasma power was turned off. In one example, the reagent may be silane, nitrogen, hydrogen or a combination thereof to form a silane plasma, a nitrogen plasma, a hydrogen plasma, or a combined plasma. The reactant plasma reacts with the adsorbed cobalt precursor on the substrate to form a cobalt-containing material thereon. In one example, a reactant plasma (e.g., hydrogen) is used to form a metallic cobalt material. However, a variety of reactants may be used to form cobalt-containing materials having a wide range of compositions. In one example, a boron-containing reactant compound (e.g., diborane) is used to form a cobalt-containing material containing boride. In a preferred example, a silicon precursor (e.g., silane or disilane) is used to form a cobalt silicide material.

The process chamber was exposed to a second purge step to remove excess precursors or contaminants from the previous step. The flow rate of the reagent gas may be maintained or adjusted from the previous step during the purge step. An optional purge gas may be administered into the process chamber with a flow rate within a range from about 100 sccm to about 2,000 sccm, preferably, from about 200 sccm to about 1,000 sccm, and more preferably, from about 300 sccm to about 700 sccm, for example, about 500 sccm. The second purge step may be conducted for a time period within a range from about 0.1 seconds to about 8 seconds, preferably, from about 1 second to about 5 seconds, and more preferably, from about 2 seconds to about 4 seconds.

The ALD cycle may be repeated until a predetermined thickness of the cobalt-containing material is deposited on the substrate. In one example, a cobalt silicide layer has a thickness of about 5 Å and a metallic cobalt layer has a thickness of about 10 Å. In another example, a cobalt silicide layer has a thickness of about 30 Å and a metallic cobalt layer has a thickness of about 50 Å. The processes as described herein may deposit a cobalt-containing material at a rate of at least 0.15 Å/cycle, preferably, at least 0.25 Å/cycle, more preferably, at least 0.35 Å/cycle or faster. In another embodiment, the processes as described herein overcome shortcomings of the prior art relative as related to nucleation delay. There is no detectable nucleation delay during many, if not most, of the experiments to deposit the cobalt-containing materials.

In another embodiment, a cobalt-containing material may be formed during another PE-ALD process that provides sequentially exposing the substrate to pulses of a cobalt precursor and an active reagent, such as a reagent plasma. The substrate may be exposed to a cobalt precursor gas formed by passing a carrier gas through an ampoule containing a cobalt precursor, as described herein. The cobalt precursor gas usually has a flow rate within a range from about 100 sccm to about 2,000 sccm, preferably, from about 200 sccm to about 1,000 sccm, and more preferably, from about 300 sccm to about 700 sccm, for example, about 500 sccm. The substrate may be exposed to the deposition gas containing the cobalt precursor and the reagent gas for a time period within a range from about 0.1 seconds to about 8 seconds, preferably, from about 1 second to about 5 seconds, and more preferably from about 2 seconds to about 4 seconds. The flow of the cobalt precursor gas may be stopped once the cobalt precursor is adsorbed on the substrate. The cobalt precursor may be a discontinuous layer, continuous layer or even multiple layers.

Subsequently, the substrate and chamber are exposed to a purge step. A purge gas may be administered into the process chamber during the purge step. In one aspect, the purge gas is the reagent gas, such as ammonia, nitrogen or hydrogen. In another aspect, the purge gas may be a different gas than the reagent gas. For example, the reagent gas may be ammonia and the purge gas may be nitrogen, hydrogen or argon. The purge gas may have a flow rate within a range from about 100 sccm to about 2,000 sccm, preferably, from about 200 sccm to about 1,000 sccm, and more preferably, from about 300 sccm to about 700 sccm, for example, about 500 sccm. The purge step removes any excess cobalt precursor and other contaminants within the process chamber. The purge step may be conducted for a time period within a range from about 0.1 seconds to about 8 seconds, preferably, from about 1 second to about 5 seconds, and more preferably, from about 2 seconds to about 4 seconds. A carrier gas, a purge gas and a process gas may contain nitrogen, hydrogen, argon, neon, helium, or combinations thereof.

The substrate and the adsorbed cobalt precursor thereon may be exposed to the reagent gas during the next step of the ALD process. Optionally, a carrier gas may be administered at the same time as the reagent gas into the process chamber. The reagent gas may be ignited to form a plasma. The reagent gas usually has a flow rate within a range from about 100 sccm to about 3,000 sccm, preferably, from about 200 sccm to about 2,000 sccm, and more preferably, from about 500 sccm to about 1,500 sccm. In one example, silane is used as a reagent gas with a flow rate of about 1,500 sccm. The substrate may be exposed to the plasma for a time period within a range from about 0.1 seconds to about 20 seconds, preferably, from about 1 second to about 10 seconds, and more preferably, from about 2 seconds to about 8 seconds. Thereafter, the plasma power may be turned off. In one example, the reagent may be silane, disilane, nitrogen, hydrogen, or combinations thereof, while the plasma may be a silane plasma, a nitrogen plasma, a hydrogen plasma, or combinations thereof. The reactant plasma reacts with the adsorbed cobalt precursor on the substrate to form a cobalt-containing material thereon. Preferably, the reactant plasma is used to form cobalt silicide and metallic cobalt materials. However, a variety of reactants may be used to form cobalt-containing materials having a wide range of compositions, as described herein.

The process chamber may be exposed to a second purge step to remove excess precursors or contaminants from the process chamber. The flow of the reagent gas may have been stopped at the end of the previous step and started during the purge step, if the reagent gas is used as a purge gas. Alternative, a purge gas that is different than the reagent gas may be administered into the process chamber. The reagent gas or purge gas may have a flow rate within a range from about 100 sccm to about 2,000 sccm, preferably, from about 200 sccm to about 1,000 sccm, and more preferably, from about 300 sccm to about 700 sccm, for example, about 500 sccm. The second purge step may be conducted for a time period within a range from about 0.1 seconds to about 8 seconds, preferably, from about 1 second to about 5 seconds, and more preferably, from about 2 seconds to about 4 seconds.

The ALD cycle may be repeated until a predetermined thickness of the cobalt-containing material is deposited on the substrate. The cobalt-containing material may be deposited with a thickness less than 1,000 Å, preferably less than 500 Å and more preferably from about 10 Å to about 100 Å, for example, about 30 Å. The processes as described herein may deposit a cobalt-containing material at a rate of at least 0.15 Å/cycle, preferably, at least 0.25 Å/cycle, more preferably, at least 0.35 Å/cycle or faster. In another embodiment, the processes as described herein overcome shortcomings of the prior art relative as related to nucleation delay. There is no detectable nucleation delay during many, if not most, of the experiments to deposit the cobalt-containing materials.

An important precursor characteristic is to have a favorable vapor pressure. Deposition precursors may have gas, liquid or solid states at ambient temperature and pressure. However, within the CVD or ALD chamber, precursors are usually volatilized as gas or plasma. Precursors are usually heated prior to delivery into the process chamber. Although many variables affect the deposition rate during a CVD process or an ALD process to form cobalt-containing material, the size of the ligand on a cobalt precursor is an important consideration in order to achieve a predetermined deposition rate. The size of the ligand does contribute to determining the specific temperature and pressure required to vaporize the cobalt precursor. Furthermore, a cobalt precursor has a particular ligand steric hindrance proportional to the size of the ligands. In general, larger ligands provide more steric hindrance. Therefore, less molecules of a precursor more bulky ligands may be adsorbed on a surface during the half reaction while exposing the substrate to the precursor than if the precursor contained less bulky ligands. The steric hindrance effect limits the amount of adsorbed precursors on the surface. Therefore, a monolayer of a cobalt precursor may be formed to contain a more molecularly concentrated by decreasing the steric hindrance of the ligand(s). The overall deposition rate is proportionally related to the amount of adsorbed precursor on the surface, since an increased deposition rate is usually achieved by having more of the precursor adsorbed to the surface. Ligands that contain smaller functional groups (e.g., hydrogen or methyl) generally provide less steric hindrance than ligands that contain larger functional groups (e.g., aryl). Also, the position on the ligand motif may affect the steric hindrance of the precursor.

In some embodiments, the cobalt precursor and the reagent may be sequentially introduced into the process chamber during a thermal ALD process or a PE-ALD process. Alternatively, in other embodiments, the cobalt precursor and the reagent may be simultaneously introduced into the process chamber during a thermal CVD process, pulsed CVD process, a PE-CVD process, or a pulsed PE-CVD process. In other embodiments, the cobalt precursor may be introduced into the process chamber without a reagent and during a thermal CVD process, pulsed CVD process, a PE-CVD process, or a pulsed PE-CVD process.

In other embodiments, the substrate may be exposed to a deposition gas containing at least a cobalt precursor gas and a silicon precursor to form a cobalt silicide material during a CVD process, a PE-CVD process, or a pulsed PE-CVD process. The substrate may be exposed to a cobalt precursor gas formed by passing a carrier gas (e.g., nitrogen or argon) through an ampoule of a cobalt precursor. Similar, a silicon precursor gas may be formed by passing a carrier gas through an ampoule of a silicon precursor. The ampoule may be heated depending on the cobalt and silicon precursors used during the process. In one example, an ampoule containing a cobalt carbonyl compound (e.g., $(CO)_xCo_yL_z$) or an amido cobalt compound (e.g., $(R_2N)_xCo$) may be heated to a temperature within a range from about 30° C. to about 500° C. The cobalt precursor gas usually has a flow rate within a range from about 100 sccm to about 2,000 sccm, preferably, from about 200 sccm to about 1,000 sccm, and more preferably, from about 300 sccm to about 700 sccm, for example, about 500 sccm. The cobalt precursor gas and the silicon precursor gas are combined to form a deposition gas. The silicon precursor gas (e.g., $SiH_4$ or $Si_2H_6$) usually has a flow rate within a range from about 100 sccm to about 3,000 sccm, preferably, from about 200 sccm to about 2,000 sccm, and more preferably, from about 500 sccm to about 1,500 sccm. In one example, silane is used as a silicon precursor with a flow rate of about 1,500 sccm. In another example, disilane is used as a silicon precursor with a flow rate of about 1,200 sccm. The substrate may be exposed to the deposition gas containing the cobalt precursor gas and the silicon precursor gas for a time period within a range from about 0.1 seconds to about 120 seconds, preferably, from about 1 second to about 60 seconds, and more preferably, from about 5 seconds to about 30 seconds.

The process may be plasma-enhanced by igniting a plasma during the deposition process. The plasma source may be an in situ plasma source within the CVD chamber or a RPS positioned outside of the CVD chamber. The process gas containing the cobalt precursor gas and the silicon precursor gas may be pulsed sequentially with or without a purge gas into the CVD chamber during a pulsed CVD process. In one example, the substrate is heated to a predetermined temperature and the precursors react to form a cobalt silicide material during a thermal CVD process. In another example, a plasma may remain ignited while the process gas is pulsed into the process chamber and the substrate is exposed to pulses of the process gas. Alternatively, in another example, the ignition of the plasma may be pulsed while the process gas maintains a steady gas into the process chamber and the substrate is exposed to the flow of the process gas.

In other embodiments, the substrate may be simultaneously exposed to a cobalt precursor gas and a reducing agent to form a metallic cobalt material during a CVD process, a PE-CVD process, or a pulsed PE-CVD process. The substrate may be exposed to a cobalt precursor gas formed by passing a carrier gas (e.g., nitrogen or argon) through an ampoule of a cobalt precursor. Similar, a reducing agent gas may be formed by passing a carrier gas through an ampoule of a reducing agent. The ampoule may be heated depending on the cobalt and reducing agents used during the process. In one example, an ampoule containing a cobalt carbonyl compound (e.g., $(CO)_xCo_yL_z$) or an amido cobalt compound (e.g., $(R_2N)_x Co$) may be heated to a temperature within a range from about 30° C. to about 500° C. The cobalt precursor gas usually has a flow rate within a range from about 100 sccm to about 2,000 sccm, preferably, from about 200 sccm to about 1,000 sccm, and more preferably, from about 300 sccm to about 700 sccm, for example, about 500 sccm. The cobalt precursor gas and the reducing agent gas are combined to form a deposition gas. The reducing agent gas usually has a flow rate within a range from about 100 sccm to about 3,000 sccm, preferably, from about 200 sccm to about 2,000 sccm, and more preferably, from about 500 sccm to about 1,500 sccm. In one example, hydrogen is used as a reducing agent with a flow rate of about 2,000 sccm. In another example, diborane is used as a reducing agent with a flow rate of about 800 sccm. The substrate may be exposed to the deposition gas containing the cobalt precursor gas and the reducing agent gas for a time period within a range from about 0.1 seconds to about 120 seconds, preferably, from about 1 second to about 60 seconds, and more preferably, from about 5 seconds to about 30 seconds.

The process may be plasma-enhanced by igniting a plasma during the deposition process. The plasma source may be an in situ plasma source within the CVD chamber or a RPS positioned outside of the CVD chamber. The process gas containing the cobalt precursor gas and the reducing agent gas may be pulsed sequentially with or without a purge gas into the CVD chamber during a pulsed CVD process. In one example, the substrate is heated to a predetermined temperature and the precursors react to form a metallic cobalt material during a thermal CVD process. In another example, a plasma may remain ignited while the process gas is pulsed into the process chamber and the substrate is exposed to pulses of the process gas. Alternatively, in another example, the ignition of the plasma may be pulsed while the process gas maintains a steady gas into the process chamber and the substrate is exposed to the flow of the process gas.

In another embodiment, a cobalt silicide material is deposited on a silicon-containing substrate surface during a vapor deposition process and a metallic cobalt material is deposited thereon by another vapor deposition process. Preferably, the cobalt silicide material and the metallic cobalt material are deposited within the same CVD chamber. In one aspect, the cobalt silicide layer is deposited by co-flowing a cobalt precursor and a silicon precursor during a CVD process. Thereafter, the flow of silicon precursor into the CVD chamber is stopped while the flow of the cobalt precursor is continued and a metallic cobalt material is deposited on the cobalt silicide material. A reductant, such as hydrogen, may be co-flowed with the cobalt precursor. Alternatively, the cobalt precursor may be reduced by a thermal decomposition process or a plasma process during the CVD process.

Suitable cobalt precursors for forming cobalt-containing materials (e.g., cobalt silicide or metallic cobalt) by deposition processes (e.g., CVD or ALD) described herein include cobalt carbonyl complexes, cobalt amidinates compounds, cobaltocene compounds, cobalt dienyl complexes, cobalt nitrosyl complexes, derivatives thereof, complexes thereof, plasma thereof, or combinations thereof.

In one embodiment, cobalt carbonyl complexes may be a preferred cobalt precursor. Cobalt carbonyl complexes have the general chemical formula $(CO)_xCo_yL_z$, where X may be 1, 2, 3, 4, 5, 6, 7, 8, 9, 10, 11, or 12, Y may be 1, 2, 3, 4, or 5, and Z may be 1, 2, 3, 4, 5, 6, 7, or 8. The group L is absent, one ligand or multiple ligands, that may be the same ligand or different ligands, and include cyclopentadienyl, alkylcyclopentadienyl (e.g., methylcyclopentadienyl or pentamethylcyclopentadienyl), pentadienyl, alkylpentadienyl, cyclobutadienyl, butadienyl, ethylene, allyl (or propylene), alkenes, dialkenes, alkynes, acetylene, bytylacetylene, nitrosyl, ammonia, derivatives thereof, complexes thereof, plasma thereof, or combinations thereof. Some exemplary cobalt carbonyl complexes include cyclopentadienyl cobalt bis(carbonyl) ($CpCo(CO)_2$), tricarbonyl allyl cobalt (($CO)_3Co$ ($CH_2CH=CH_2$)), dicobalt hexacarbonyl bytylacetylene (CCTBA, $(CO)_6Co_2(HC\equiv C^tBu)$), dicobalt hexacarbonyl methylbytylacetylene (($CO)_6Co_2(MeC\equiv C^tBu)$), dicobalt hexacarbonyl phenylacetylene (($CO)_6Co_2(HC\equiv CPh)$), hexacarbonyl methylphenylacetylene (($CO)_6Co_2$ ($MeC\equiv CPh$)), dicobalt hexacarbonyl methylacetylene (($CO)_6Co_2(HC\equiv CMe)$), dicobalt hexacarbonyl dimethylacetylene (($CO)_6Co_2(MeC\equiv CMe)$), derivatives thereof, complexes thereof, plasma thereof, or combinations thereof.

In another embodiment, cobalt amidinates or cobalt amido complexes may be a preferred cobalt precursor. Cobalt amido complexes have the general chemical formula $(RR'N)_xCo$, where X may be 1, 2, or 3, and R and R' are independently hydrogen, methyl, ethyl, propyl, butyl, alkyl, silyl, alkylsilyl, derivatives thereof, or combinations thereof. Some exemplary cobalt amido complexes include bis(di(butyldimethylsilyl)amido) cobalt ($((BuMe_2Si)_2N)_2Co$), bis(di(ethyldimethylsilyl)amido) cobalt ($((EtMe_2Si)_2N)_2Co$), bis(di (propyldimethylsilyl)amido) cobalt ($((PrMe_2Si)_2N)_2Co$), bis(di(trimethylsilyl)amido) cobalt ($((Me_3Si)_2N)_2Co$), tris(di (trimethylsilyl)amido) cobalt ($((Me_3Si)_2N)_3Co$), derivatives thereof, complexes thereof, plasma thereof, or combinations thereof.

Other exemplary cobalt precursors include methylcyclopentadienyl cobalt bis(carbonyl) ($MeCpCo(CO)_2$), ethylcyclopentadienyl cobalt bis(carbonyl) ($EtCpCo(CO)_2$), pentamethylcyclopentadienyl cobalt bis(carbonyl) ($Me_5CpCo (CO)_2$), dicobalt octa(carbonyl) ($Co_2(CO)_5$), nitrosyl cobalt tris(carbonyl) (($ON)Co(CO)_3$), bis(cyclopentadienyl)cobalt, (cyclopentadienyl)cobalt (cyclohexadienyl), cyclopentadienyl cobalt (1,3-hexadienyl), (cyclobutadienyl)cobalt (cyclopentadienyl), bis(methylcyclopentadienyl)cobalt, (cyclopentadienyl)cobalt (5-methylcyclopentadienyl), bis(ethylene)

cobalt (pentamethylcyclopentadienyl), cobalt tetracarbonyl iodide, cobalt tetracarbonyl trichlorosilane, carbonyl chloride tris(trimethylphosphine) cobalt, cobalt tricarbonyl-hydrotributylphosphine, acetylene dicobalt hexacarbonyl, acetylene dicobalt pentacarbonyl triethylphosphine, derivatives thereof, complexes thereof, plasma thereof, or combinations thereof.

Suitable silicon precursors for forming cobalt-containing materials (e.g., cobalt silicide) by deposition processes (e.g., CVD or ALD) described herein include silane ($SiH_4$), disilane ($Si_2H_6$), trisilane ($Si_3H_8$), tetrasilane ($Si_4H_{10}$), dimethylsilane ($SiC_2H_8$), methyl silane ($SiCH_6$), ethylsilane ($SiC_2H_8$), chlorosilane ($ClSiH_3$), dichlorosilane ($Cl_2SiH_2$), tetrachlorosilane ($Cl_4Si$), hexachlorodisilane ($Si_2Cl_6$), plasmas thereof, derivatives thereof, or combinations thereof.

Other suitable reagents, including reductants, that are useful to form cobalt-containing materials (e.g., cobalt silicide or metallic cobalt) by processes described herein include hydrogen (e.g., $H_2$ or atomic-H), atomic-N, ammonia ($NH_3$), hydrazine ($N_2H_4$), borane ($BH_3$), diborane ($B_2H_6$), triborane, tetraborane, pentaborane, triethylborane ($Et_3B$), phosphine ($PH_3$), derivatives thereof, plasmas thereof, or combinations thereof.

The time interval for the pulse of the cobalt precursor is variable depending upon a number of factors such as, for example, the volume capacity of the process chamber employed, the vacuum system coupled thereto and the volatility/reactivity of the reactants used during the ALD process. For example, (1) a large-volume process chamber may lead to a longer time to stabilize the process conditions such as, for example, carrier/purge gas flow and temperature, requiring a longer pulse time; (2) a lower flow rate for the process gas may also lead to a longer time to stabilize the process conditions requiring a longer pulse time; and (3) a lower chamber pressure means that the process gas is evacuated from the process chamber more quickly requiring a longer pulse time. In general, the process conditions are advantageously selected so that a pulse of the cobalt precursor provides a sufficient amount of precursor so that at least a monolayer of the cobalt precursor is adsorbed on the substrate. Thereafter, excess cobalt precursor remaining in the chamber may be removed from the process chamber by the constant carrier gas stream in combination with the vacuum system.

The time interval for each of the pulses of the cobalt precursor and the reagent gas may have the same duration. That is, the duration of the pulse of the cobalt precursor may be identical to the duration of the pulse of the reagent gas. For such an embodiment, a time interval ($T_1$) for the pulse of the cobalt precursor is equal to a time interval ($T_2$) for the pulse of the reagent gas.

Alternatively, the time interval for each of the pulses of the cobalt precursor and the reagent gas may have different durations. That is, the duration of the pulse of the cobalt precursor may be shorter or longer than the duration of the pulse of the reagent gas. For such an embodiment, a time interval ($T_1$) for the pulse of the cobalt precursor is different than the time interval ($T_2$) for the pulse of the reagent gas.

In addition, the periods of non-pulsing between each of the pulses of the cobalt precursor and the reagent gas may have the same duration. That is, the duration of the period of non-pulsing between each pulse of the cobalt precursor and each pulse of the reagent gas is identical. For such an embodiment, a time interval ($T_3$) of non-pulsing between the pulse of the cobalt precursor and the pulse of the reagent gas is equal to a time interval ($T_4$) of non-pulsing between the pulse of the reagent gas and the pulse of the cobalt precursor. During the time periods of non-pulsing only the constant carrier gas stream is provided to the process chamber.

Alternatively, the periods of non-pulsing between each of the pulses of the cobalt precursor and the reagent gas may have different duration. That is, the duration of the period of non-pulsing between each pulse of the cobalt precursor and each pulse of the reagent gas may be shorter or longer than the duration of the period of non-pulsing between each pulse of the reagent gas and the cobalt precursor. For such an embodiment, a time interval ($T_3$) of non-pulsing between the pulse of the cobalt precursor and the pulse of the reagent gas is different from a time interval ($T_4$) of non-pulsing between the pulse of the reagent gas and the pulse of cobalt precursor. During the time periods of non-pulsing only the constant carrier gas stream is provided to the process chamber.

Additionally, the time intervals for each pulse of the cobalt precursor, the reagent gas and the periods of non-pulsing therebetween for each deposition cycle may have the same duration. For such an embodiment, a time interval ($T_1$) for the cobalt precursor, a time interval ($T_2$) for the reagent gas, a time interval ($T_3$) of non-pulsing between the pulse of the cobalt precursor and the pulse of the reagent gas and a time interval ($T_4$) of non-pulsing between the pulse of the reagent gas and the pulse of the cobalt precursor each have the same value for each deposition cycle. For example, in a first deposition cycle ($C_1$), a time interval ($T_1$) for the pulse of the cobalt precursor has the same duration as the time interval ($T_1$) for the pulse of the cobalt precursor in subsequent deposition cycles ($C_2 \ldots C_n$). Similarly, the duration of each pulse of the reagent gas and the periods of non-pulsing between the pulse of the cobalt precursor and the reagent gas in the first deposition cycle ($C_1$) is the same as the duration of each pulse of the reagent gas and the periods of non-pulsing between the pulse of the cobalt precursor and the reagent gas in subsequent deposition cycles ($C_2 \ldots C_n$), respectively.

Alternatively, the time intervals for at least one pulse of the cobalt precursor, the reagent gas and the periods of non-pulsing therebetween for one or more of the deposition cycles of the cobalt-containing material deposition process may have different durations. For such an embodiment, one or more of the time intervals ($T_1$) for the pulses of the cobalt precursor, the time intervals ($T_2$) for the pulses of the reagent gas, the time intervals ($T_3$) of non-pulsing between the pulse of the cobalt precursor and the reagent gas and the time intervals ($T_4$) of non-pulsing between the pulses of the reagent gas and the cobalt precursor may have different values for one or more deposition cycles of the cyclical deposition process. For example, in a first deposition cycle ($C_1$), the time interval ($T_1$) for the pulse of the cobalt precursor may be longer or shorter than one or more time interval ($T_1$) for the pulse of the cobalt precursor in subsequent deposition cycles ($C_2 \ldots C_n$). Similarly, the durations of the pulses of the reagent gas and the periods of non-pulsing between the pulse of the cobalt precursor and the reagent gas in the first deposition cycle ($C_1$) may be the same or different than the duration of each pulse of the reagent gas and the periods of non-pulsing between the pulse of the cobalt precursor and the reagent gas in subsequent deposition cycles ($C_2 \ldots C_n$).

In some embodiments, a constant flow of a carrier gas or a purge gas may be provided to the process chamber modulated by alternating periods of pulsing and non-pulsing where the periods of pulsing alternate between the cobalt precursor and the reagent gas along with the carrier/purge gas stream, while the periods of non-pulsing include only the carrier/purge gas stream.

Cobalt-Containing Materials by Cyclic Process Using CVD or ALD

In other embodiments, cobalt-containing materials may be formed by a cyclic process that sequentially exposes a substrate to a deposition process and a plasma treatment process. A soak process and purge steps may also be included in cyclic process. In one embodiment, a single cycle of the cyclic process may include exposing the substrate to a deposition gas, purging the process chamber, exposing the substrate to a plasma treatment, optionally purging the process chamber, exposing the substrate to a soak process, and purging the process chamber. In another embodiment, a single cycle of the cyclic process may include exposing the substrate to a deposition gas, purging the process chamber, exposing the substrate to a plasma treatment, and purging the process chamber. The cycle process may be stopped after one cycle, but usually is conducted multiple times until a predetermined thickness of the cobalt-containing material is deposited on the substrate.

Figure 20:
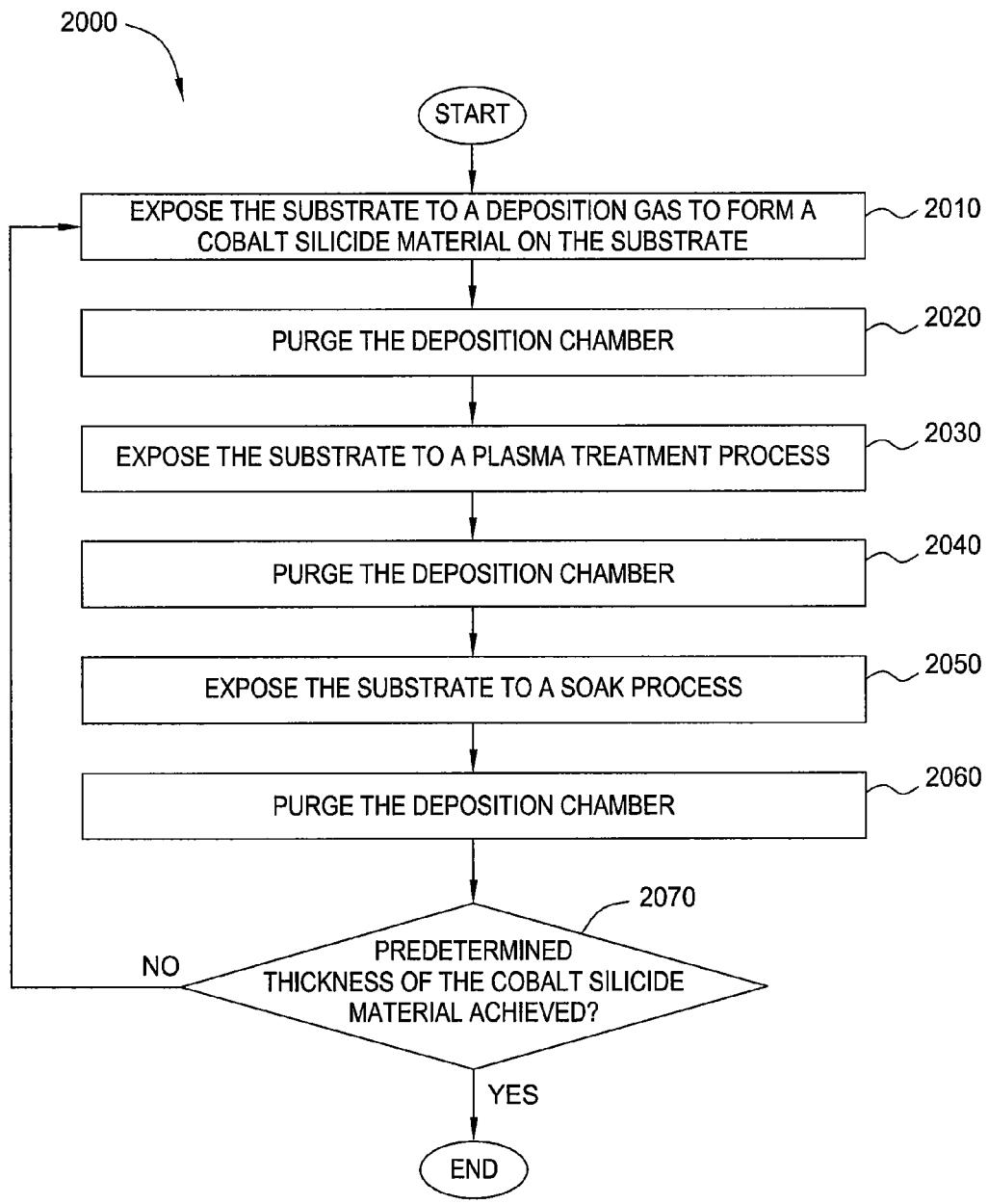
FIG. 20 shows a flow-chart of an integrated process described by another embodiment herein.

FIG. 20 depicts a flow chart of process 2000 which may be used to form cobalt-containing materials, such as a cobalt silicide material. In one embodiment, process 2000 includes exposing a substrate to a deposition gas to form a cobalt silicide material (step 2010), purging the deposition chamber (step 2020), exposing the substrate to a plasma treatment process (step 2030), optionally purging the deposition chamber (step 2040), exposing the substrate to a soak process (step 2050), purging the deposition chamber (step 2060), and determining if a predetermined thickness of the cobalt silicide material has been formed on the substrate (step 2070). The cycle of steps 2010-2070 may be repeated if the cobalt silicide material has not been formed having the predetermined thickness. Alternately, process 2000 may be stopped once the cobalt silicide material has been formed having the predetermined thickness.

Figure 21:
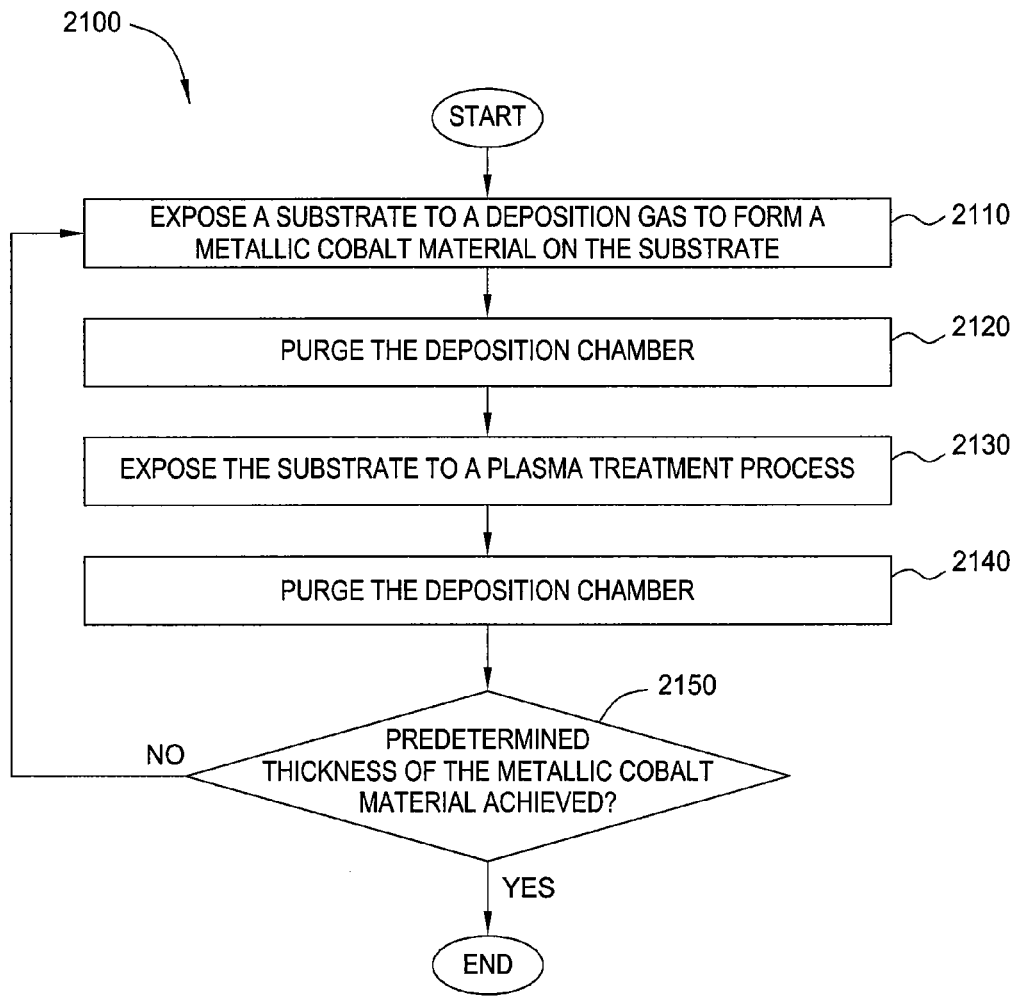
FIG. 21 shows a flow-chart of another integrated process described by embodiments herein.

FIG. 21 depicts a flow chart of process 2100 which may be used to form cobalt-containing materials, such as a metallic cobalt material. In one embodiment, process 2100 includes exposing a substrate to a deposition gas to form a metallic cobalt material (step 2110), purging the deposition chamber (step 2120), exposing the substrate to a plasma treatment process (step 2130), purging the deposition chamber (step 2140), and determining if a predetermined thickness of the metallic cobalt material has been formed on the substrate (step 2150). The cycle of steps 2110-2150 may be repeated if the metallic cobalt material has not been formed having the predetermined thickness. Alternately, process 2100 may be stopped once the metallic cobalt material has been formed having the predetermined thickness.

Figure 22:
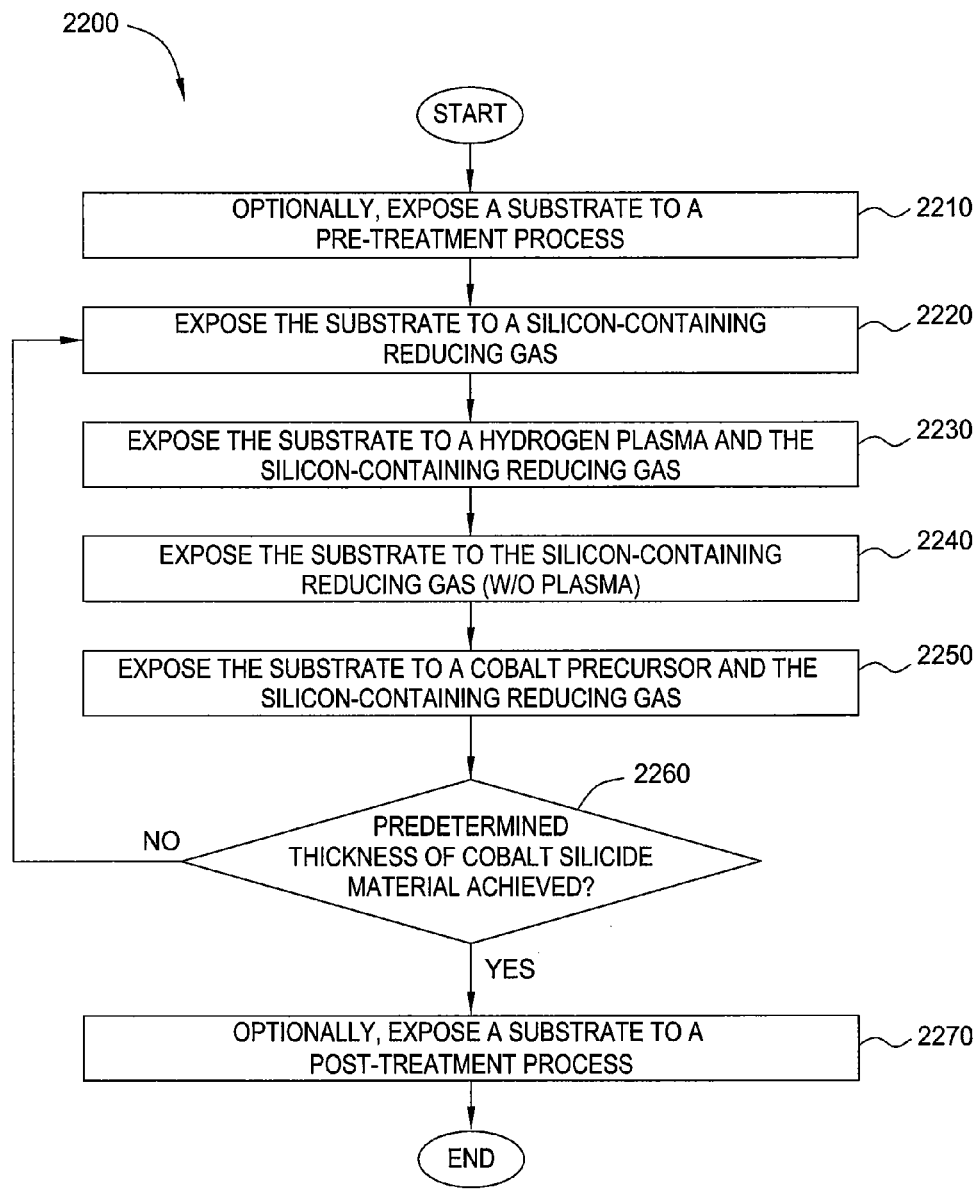
FIG. 22 shows a flow-chart of a cobalt silicide deposition process described by an embodiment herein.

FIG. 22 depicts a flow chart of process 2200 which may be used to form cobalt-containing materials, such as a cobalt silicide material. In one embodiment, process 2200 includes optionally exposing a substrate to a pre-treatment process (2210), exposing a substrate to a silicon-containing reducing gas (step 2220), exposing the substrate to a hydrogen plasma and the silicon-containing reducing gas (step 2230), exposing the substrate to the silicon-containing reducing gas without the plasma (step 2240), exposing the substrate to a cobalt precursor and the silicon-containing reducing gas (step 2250), and determining if a predetermined thickness of the cobalt silicide material has been formed on the substrate (step 2260). The cycle of steps 2210-2260 may be repeated if the cobalt silicide material has not been formed having the predetermined thickness. Alternately, process 2200 may be stopped once the cobalt silicide material has been formed having the predetermined thickness. In one embodiment, the substrate may be optionally exposed to a post-treatment, such as a thermal annealing process or a plasma process, during step 2270.

Figure 23:
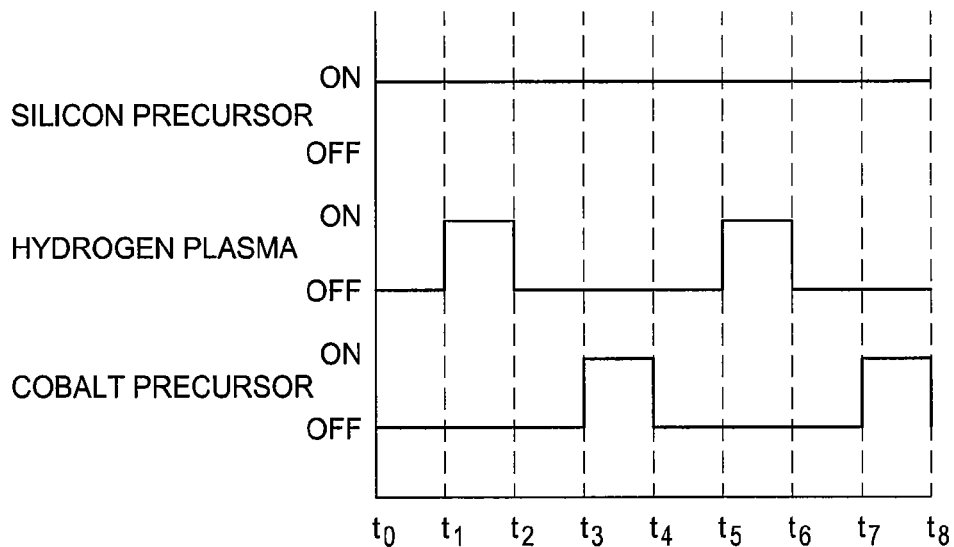
FIG. 23 shows a graph of chemical precursor sequences for a cobalt silicide deposition process described by an embodiment herein.

In one embodiment of process 2200, the silicon-containing reducing gas may be continuously flowed into the process chamber while the hydrogen plasma and the cobalt precursor are sequentially pulsed into the process chamber. In one example, FIG. 23 shows a graph of the timing sequences for various chemical species or chemical precursors during a cobalt silicide deposition process, such as process 2200. The silicon-containing reducing gas, which contains a silicon precursor and may contain a carrier gas (e.g., $H_2$ or Ar), is shown to remain on during the time period from the initial time ($t_0$) of the deposition cycle to the final time ($t_4$) of the first deposition cycle and to the final time ($t_8$) of the second deposition cycle. The silicon-containing reducing gas may be used as a purge gas as well as a soak gas. While the substrate is exposed to the silicon-containing reducing gas, a hydrogen plasma and a cobalt precursor are sequentially pulsed into the process chamber and exposed to the substrate. For example, the substrate is exposed to only the silicon-containing reducing gas between $t_0$-$t_1$, $t_2$-$t_3$, $t_4$-$t_8$, and $t_6$-$t_7$, exposed to a hydrogen plasma between $t_1$-$t_2$ and $t_5$-$t_6$, and exposed to a cobalt precursor between $t_3$-$t_4$ and $t_7$-$t_8$.

The substrate may be exposed to the silicon-containing reducing gas during the time ranges of $t_0$-$t_1$, $t_2$-$t_3$, $t_4$-$t_5$, or $t_6$-$t_7$, where each of the time ranges may last for a time period within a range from about 0.5 seconds to about 10 seconds, preferably, from about 1 second to about 5 seconds, and more preferably, from about 2 seconds to about 4 seconds. The substrate may be exposed to the hydrogen plasma during the time ranges of $t_1$-$t_2$ or $t_5$-$t_6$, where each of the time ranges may last for a time period within a range from about 0.5 seconds to about 10 seconds, preferably, from about 1 second to about 5 seconds, and more preferably, from about 2 seconds to about 3 seconds. The substrate may be exposed to the cobalt precursor during the time ranges of between $t_3$-$t_4$ and $t_7$-$t_8$, where each of the time ranges may last for a time period within a range from about 0.5 seconds to about 10 seconds, preferably, from about 1 second to about 5 seconds, and more preferably, from about 2 seconds to about 3 seconds.

In one embodiment, a method for forming a cobalt-containing material on a substrate is provided which includes heating a substrate to a predetermined temperature within a processing chamber, forming a cobalt silicide material on the substrate by conducting a deposition cycle to deposit a cobalt silicide layer, and repeating the deposition cycle to form a plurality of the cobalt silicide layers. In one aspect, the deposition cycle includes exposing the substrate to a silicon-containing reducing gas while sequentially exposing the substrate to a cobalt precursor and a plasma. In another aspect, the deposition cycle includes exposing the substrate to a gas flow comprising a silicon-containing reducing gas, and exposing the substrate sequentially to a cobalt precursor and a plasma, wherein the cobalt precursor is added into the gas flow comprising the silicon-containing reducing gas while alternately igniting the plasma. In another aspect, the deposition cycle includes exposing the substrate to a silicon-containing reducing gas, igniting a plasma and exposing the substrate to the plasma and the silicon-containing reducing gas, extinguishing the plasma and exposing the substrate to the silicon-containing reducing gas, exposing the substrate to a cobalt precursor and the silicon-containing reducing gas and ceasing the exposure of the cobalt precursor and exposing the substrate to a silicon-containing reducing gas.

For example, the substrate may be exposed to the silicon-containing reducing gas and the cobalt precursor during a first time period ($t_3$-$t_4$ or $t_7$-$t_8$) within a range from about 1 second to about 10 seconds, preferably, from about 2 seconds to about 5 seconds. The substrate may be exposed to the silicon-containing reducing gas and the plasma during a second time period ($t_1$-$t_2$ or $t_5$-$t_6$) within a range from about 1 second to about 10 seconds, preferably, from about 2 seconds to about 5 seconds. The substrate may be exposed to the silicon-containing reducing gas after the cobalt precursor exposure and prior to the plasma exposure during a third time period ($t_0$-$t_1$ or $t_4$-$t_5$) within a range from about 1 second to about 10 seconds, preferably, from about 2 seconds to about 4 seconds. Also, the substrate may be exposed to the silicon-containing reducing gas after the plasma exposure and prior to the cobalt precursor exposure during a fourth time period ($t_2$-$t_3$ or $t_6$-$t_7$) within a range from about 1 second to about 10 seconds, preferably, from about 2 seconds to about 4 seconds.

Figure 25A:
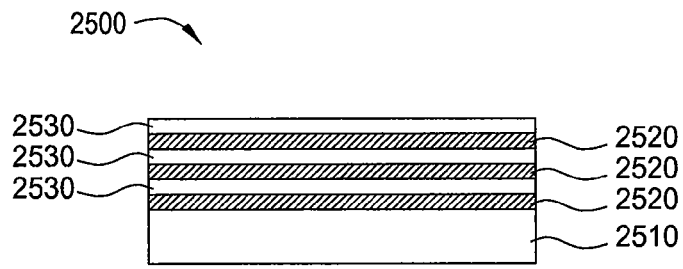
FIGS. 25A-25B depict schematic cross-sectional views of a substrate during different stages during a cobalt silicide deposition process described by an embodiment herein.
Figure 25B:
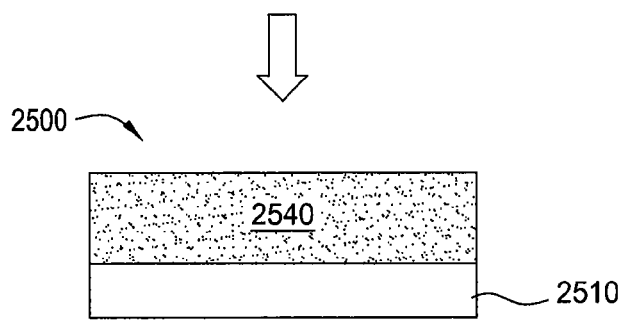

FIGS. 25A-25B depict schematic cross-sectional views of substrate 2500 during different stages of a cobalt silicide deposition process, as described by embodiments herein. Substrate 2500 contains multiple cobalt-silicon layers 2520 and silyl layers 2530 alternately stacked over surface 2510 (FIG. 25A). Surface 2510 may be the surface of a variety of different materials, including dielectric materials, barrier materials, conductive materials, but preferably is a silicon-containing surface, such as a substrate surface. Subsequent a thermal annealing process, cobalt silicide layers 2520 and silyl layers 2530 are transformed into cobalt silicide material 2540 formed on substrate 2500 (FIG. 25B).

The alternately stacked layers of cobalt silicide layers 2520 and silyl layers 2530 may be formed by an ALD process or a CVD process as described herein. Cobalt silicide layers 2520 may be formed by exposing the substrate sequentially to a cobalt precursor and a silicon precursor during an ALD process or a PE-ALD process. Alternately, cobalt silicide layers 2520 may be formed by exposing the substrate simultaneously to a cobalt precursor and a silicon precursor during a CVD process or a PE-CVD process.

In one embodiment, cobalt silicide layers 2520 may contain a silicon/cobalt atomic ratio of greater than about 0.5, preferably, greater than about 1, and more preferably, within a range from about 1 to about 2. Therefore, cobalt silicide layers 2520 may contain cobalt silicide having the chemical formula of $CoSi_x$, wherein X may be within a range from about 0.5 to about 2, preferably, from about 1 to about 2. However, in another embodiment, cobalt silicide layers 2520 contains a silicon/cobalt atomic ratio of about 1 or less, such as within a range from about 0.1 to about 1, preferably, from about 0.5 to about 1. Therefore, cobalt silicide layers 2520 may contain cobalt silicide having the chemical formula of $CoSi_x$, wherein X may be within a range from about 0.1 to about 1, preferably, from about 0.5 to about 1.

It is believed that due to the thermodynamic properties of cobalt silicide, a silicon/cobalt atomic ratio of about 1 or less is favored until the cobalt silicide is heated to a predetermined temperature and time and is exposed to an available silicon source. Thereafter, a silicon/cobalt atomic ratio of greater than about 1, such as up to about 2, is obtained for the cobalt silicide material.

Silyl layers 2530 may be formed prior to, during, or subsequent to an ALD process or a CVD process. Silyl layer 2530 may be formed by exposing the substrate to a silicon-containing reducing gas during a soak process or a treatment process. The silyl layers 2530 contain silicon hydrogen bonds.

Substrate 2500 may be exposed to a thermal annealing process, a plasma process, or both while forming cobalt silicide material 2540. In one embodiment, cobalt silicide material 2540 may be formed by exposing substrate 2500 to an annealing process, such as an RTP, at a temperature of about 500° C. or greater, preferably, at about 550° C. or greater, such as within a range from about 650° C. to about 750° C. or greater. During the annealing process, the RTP chamber may contain nitrogen gas, argon, hydrogen, or combinations thereof. In another embodiment, cobalt silicide material 2540 may be formed by exposing substrate 2500 to a hydrogen plasma for a time period of about 5 seconds or greater, preferably, for about 10 seconds or greater, and more preferably, for about 20 seconds or greater. The plasma may have a power within a range from about 800 watts to about 1,200 watts. In one example, substrate 2500 is exposed to a hydrogen plasma having a power setting of about 1,000 watts for about 20 seconds. The hydrogen plasma contains hydrogen gas ($H_2$) and may also contain nitrogen gas ($N_2$), argon, or mixtures thereof.

In one embodiment, cobalt silicide material 2540 may contain a silicon/cobalt atomic ratio of greater than about 0.5, preferably, greater than about 1, and more preferably, within a range from about 1 to about 2. Therefore, cobalt silicide material 2540 may contain cobalt silicide having the chemical formula of $CoSi_x$, wherein X may be within a range from about 0.5 to about 2, preferably, from about 1 to about 2.

One advantage realized by several of the processes described herein, including process 2200, is a reduction of silicon erosion from silicon-containing materials, such as the substrate or other silicon surfaces. Silicon erosion, especially from the substrate, can cause junction leakage and ultimately device failure due to the formed voids within the silicon-containing material. In some embodiments, cobalt silicide layers 2520 may have the chemical formula of $CoSi_x$, wherein X may be within a range from about 0.1 to about 1. Due to the availability of the silicon source between each of cobalt silicide layers 2520, namely silyl layers 2530, during the formation of cobalt silicide material 2540, silicon atoms are consumed from silyl layers 2530 instead of a silicon surface, such as surface 2510. Therefore, a silicon-rich cobalt silicide material 2530 (e.g., $CoSi_x$, wherein X may be within a range from about 1 to about 2) may be formed while very little or no silicon is pulled from surface 2510.

The thickness for the cobalt-containing material is variable depending on the device structure to be fabricated. The cobalt-containing material may be formed on the substrate until a predetermined thickness is achieved per steps 2070, 2150, and 2260. The cyclic process may form or deposit a cobalt-containing material on the substrate at a rate within a range from about 2 Å/cycle to about 50 Å/cycle, preferably, from about 3 Å/cycle to about 30 Å/cycle, more preferably, from about 5 Å/cycle to about 20 Å/cycle, for example, about 8 Å/cycle. In one embodiment, the thickness of the cobalt silicide material is less than about 300 Å, preferably, within a range from about 5 Å to about 200 Å, more preferably, from about 10 Å to about 100 Å, more preferably, from about 15 Å to about 50 Å, and more preferably, from about 25 Å to about 30 Å. Metallic cobalt material may have a film thickness within a range from about 5 Å to about 300 Å, preferably, from about 10 Å to about 100 Å, more preferably, from about 20 Å to about 70 Å, and more preferably, from about 40 Å to about 50 Å, for example, about 45 Å.

Generally, the substrate may be exposed to the deposition gas for a time period of about 1 second to about 60 seconds, preferably, from about 2 seconds to about 20 seconds, more preferably, from about 3 seconds to about 10 seconds, for example, about 5 seconds.

A plasma may be generated external from the process chamber, such as by a RPS system, or preferably, the plasma may be generated in situ a plasma capable deposition chamber, such as a PE-CVD chamber during a plasma treatment process, such as in steps 2030, 2130, 2230, 2410, 2430, 2450, 2610, or 2630. The substrate may be exposed to the plasma treatment process for a time period of about 5 seconds to about 120 seconds, preferably, from about 10 seconds to about 90 seconds, more preferably, from about 15 seconds to about 60 seconds, for example, about 30 seconds. The plasma may be generated from a microwave (MW) frequency generator or a radio frequency (RF) generator. In a preferred example, an in situ plasma is generated by a RF generator. The deposition chamber may be pressurized during the plasma treatment process at a pressure within a range from about 0.1 Torr to about 80 Torr, preferably from about 0.5 Torr to about 10 Torr, and more preferably, from about 1 Torr to about 5 Torr. Also, the chamber or the substrate may be heated to a temperature of less than about 500° C., preferably within a range from about 100° C. to about 450° C., and more preferably, from about 150° C. to about 400° C., for example, about 300° C.

During PE-ALD processes, a plasma may be ignited within the deposition chamber for an in situ plasma process, or alternative, may be formed by an external source, such as a RPS system. The RF generator may be set at a frequency within a range from about 100 kHz to about 60 MHz. In one example, a RF generator, with a frequency of 13.56 MHz, may be set to have a power output within a range from about 100 watts to about 1,000 watts, preferably, from about 250 watts to about 600 watts, and more preferably, from about 300 watts to about 500 watts. In one example, a RF generator, with a frequency of 350 kHz, may be set to have a power output within a range from about 200 watts to about 2,000 watts, preferably, from about 500 watts to about 1,500 watts, and more preferably, from about 800 watts to about 1,200 watts, for example, about 1,000 watts. A surface of substrate may be exposed to a plasma having a power per surface area value within a range from about 0.01 watts/cm$^2$ to about 10.0 watts/cm$^2$, preferably, from about 0.05 watts/cm$^2$ to about 6.0 watts/cm$^2$.

In one embodiment, the substrate may be exposed to a soak process gas during a soak process (step 2050), a pre-treatment process (steps 2210 or 2610), post-treatment process (step 2270), treatment processes (steps 2410, 2430, or 2450). A soak process gas may contain at least one reducing gas and a carrier gas. In one example, a soak process gas contains at least one reducing gas, hydrogen gas (H$_2$), and a carrier gas. In another example, the substrate may be exposed to a silicon soak process to form a thin silicon-containing layer on the cobalt-containing material prior to ending process 2000. In one embodiment, a plasma may be ignited while the substrate is being exposed to a soak process gas. The silicon soak process may be performed in situ within the same chamber as the cobalt-containing material deposition (step 2010). The substrate may be exposed to the soak process for a time period of about 1 second to about 60 seconds, preferably, from about 2 seconds to about 30 seconds, more preferably, from about 3 seconds to about 20 seconds, for example, about 5 seconds. In one example, a substrate containing cobalt silicide is exposed to a hydrogen-plasma (e.g., H$_2$ or H$_2$/Ar) for about 20 seconds.

Suitable silicon-reducing gases that may be exposed to the substrate during a soak process (including pre- and post-soak), treatment process (including pre- and post-treatment), or deposition process as described herein include silane (SiH$_4$), disilane (Si$_2$H$_6$), trisilane (Si$_3$H$_8$), tetrasilane (Si$_4$H$_{10}$), dimethylsilane (SiC$_2$H$_8$), methyl silane (SiCH$_6$), ethylsilane (SiC$_2$H$_6$), chlorosilane (ClSiH$_3$), dichlorosilane (Cl$_2$SiH$_2$), tetrachlorosilane (Cl$_4$Si), hexachlorodisilane (Si$_2$Cl$_6$), plasmas thereof, derivatives thereof, or combinations thereof. In one embodiment, silane or disilane are preferably used as silicon-reducing gases during a soak process, treatment process, or deposition process. Other reducing gases that may be contained in a soak process gas and exposed to the substrate during a soak process as described herein include hydrogen (e.g., H$_2$ or atomic-H), atomic-N, ammonia (NH$_3$), hydrazine (N$_2$H$_4$), borane (BH$_3$), diborane (B$_2$H$_6$), triborane, tetraborane, pentaborane, triethylborane (Et$_3$B), phosphine (PH$_3$), derivatives thereof, plasmas thereof, or combinations thereof. A carrier gas may be combined with a silicon-reducing gas either in situ or ex situ the deposition chamber. The carrier gas may be hydrogen, argon, nitrogen, helium, or mixtures thereof.

A reducing gas, such as a silicon-reducing gas, may be introduced into the deposition chamber having a flow rate within a range from about 500 sccm to about 2,500 sccm, preferably, from about 700 sccm to about 2,000 sccm, and more preferably, from about 800 sccm to about 1,500 sccm, for example, about 1,000 sccm during the soak process. Hydrogen gas may be introduced into the deposition chamber having a flow rate within a range from about 500 sccm to about 5,000 sccm, preferably, from about 1,000 sccm to about 4,000 sccm, and more preferably, from about 2,000 sccm to about 3,500 sccm, for example, about 3,000 sccm during the soak process. A carrier gas, such as argon, nitrogen, or helium, may be introduced into the deposition chamber having a flow rate within a range from about 500 sccm to about 2,500 sccm, preferably, from about 700 sccm to about 2,000 sccm, and more preferably, from about 800 sccm to about 1,500 sccm, for example, about 1,000 sccm during the soak process. The deposition chamber may have a chamber pressure within a range from about 100 milliTorr and about 300 Torr. The deposition chamber or the substrate may be heated to a temperature of less than about 500° C., preferably within a range from about 100° C. to about 450° C., and more preferably, from about 150° C. to about 400° C., for example, about 300° C. during the soak process.

The deposition chamber may be purged with and the substrate may be exposed to a purge gas or a carrier gas during a purge process prior to or subsequent to the deposition process, the plasma treatment process, or the soak process during optional purge steps 2020, 2040, 2060, 2120, and 2140. Any one of purge steps 2020, 2040, 2060, 2120, and 2140 may be included or excluded during processes 2000 and 2100. In an alternative embodiment, deposition chamber may be purged with and the substrate may be exposed to silicon-containing reducing gas (e.g., SiH$_4$ or Si$_2$H$_6$) during a purge process prior to or subsequent to the deposition process, the plasma treatment process, or the soak process during optional purge steps 2220 and 2240. The purge gas or carrier gas may include argon, nitrogen, hydrogen, helium, forming gas, or combinations thereof. The purge gas introduced into the deposition chamber may contain one gas or a mixture of gases and may be introduced in a single step or in several steps. For example, the deposition chamber may be purged with a gas mixture of argon and hydrogen during a first time period and then purged with hydrogen during a second time period. Each step of the purge process may last for a time period of about 0.1 seconds to about 30 seconds, preferably, from about 0.5 seconds to about 10 seconds, more preferably, from about 1 second to about 5 seconds, for example, about 2 seconds. The purge gas or carrier gas may be introduced into the deposition chamber having a flow rate within a range from about 500 sccm to about 5,000 sccm, preferably, from about 1,000 sccm to about 4,000 sccm, and more preferably, from about 2,000 sccm to about 3,500 sccm, for example, about 3,000 sccm during the purge process. In one example, the deposition chamber may be purged with a gas mixture of argon having a flow rate of about 500 sccm and hydrogen gas having a flow rate of about 3,000 sccm for about 2 seconds. Thereafter, the deposition chamber may be purged with hydrogen gas having a flow rate of about 3,000 sccm for about 2 seconds.

Figure 24:
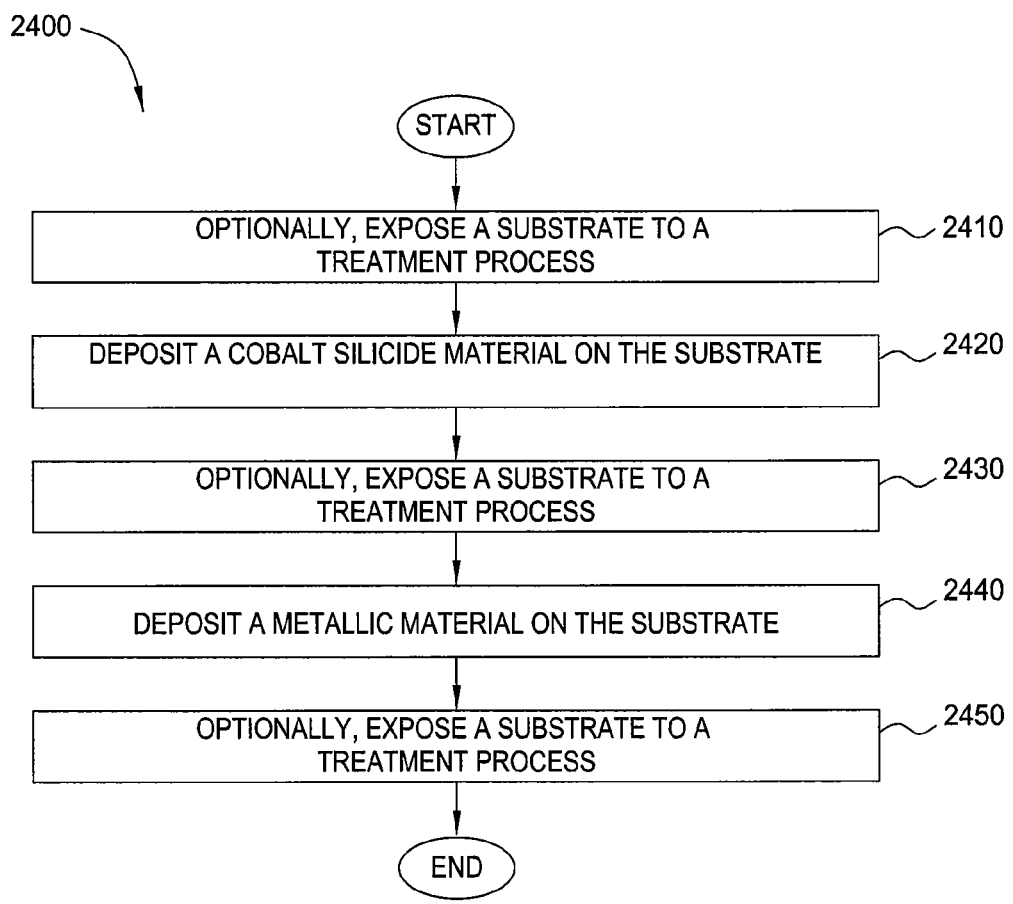
FIG. 24 shows a flow-chart of an integrated process described by another embodiment herein.

In another embodiment, FIG. 24 depicts a flow chart of process 2400 which includes optionally exposing a substrate to a treatment or a preclean process (step 2410), depositing a cobalt silicide material on the substrate (step 2420), optionally exposing a substrate to a treatment (step 2430), depositing a metallic material on the substrate (step 2440), and optionally exposing a substrate to a treatment (step 2450). The metallic material may contain at least one element of cobalt, nickel, platinum, palladium, rhodium, alloys thereof, or combinations thereof, and may be formed or deposited in one or in multiple deposition processes including ALD, PE-ALD, CVD, PE-CVD, pulsed-CVD, PVD, ECP, electroless plating, or derivatives thereof. The metallic material may be exposed to a silicon-containing reducing gas during a pre-soak process or a post-soak process. In some examples, the metallic material may be exposed to a plasma treatment during the pre-soak process or the post-soak process.

Figure 26:
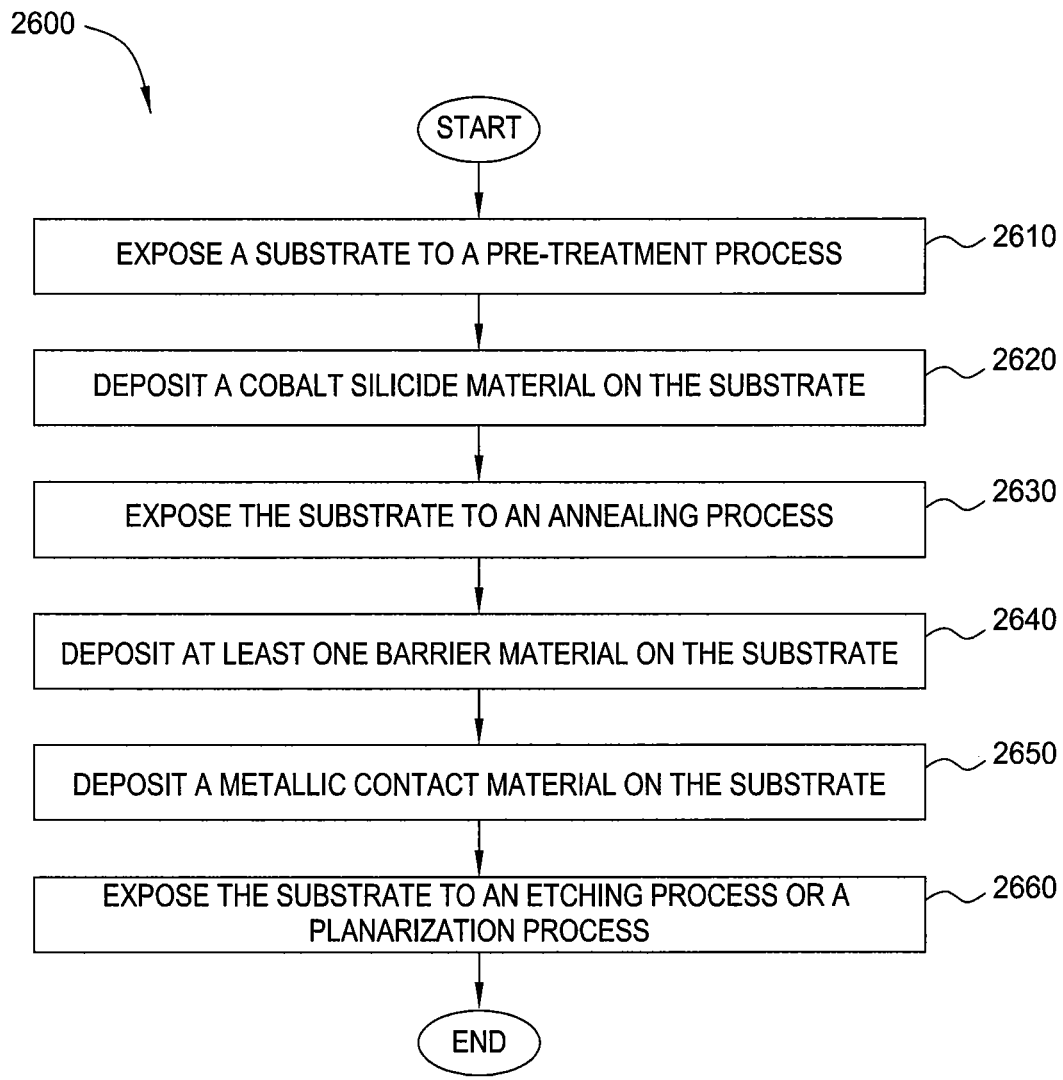
FIG. 26 shows a flow-chart of an integrated process described by another embodiment herein.

In another embodiment, FIG. 26 depicts a flow chart of process 2600 which includes exposing a substrate to a pre-treatment or a preclean process (step 2610), depositing a cobalt silicide material on the substrate (step 2620), exposing the substrate to an annealing process (step 2630), depositing at least one barrier material on the substrate (step 2640), depositing a metallic contact material on the substrate (step 2650), and exposing the substrate to etching process or a planarization process. The barrier material may contain cobalt, tantalum, tantalum nitride, titanium, titanium nitride, tungsten, tungsten nitride, alloys thereof, or derivatives thereof. Also, the barrier material may contain multiple layers of barrier layers or adhesion layers, such as Ti/TiN, Ta/TaN, or W/WN. The barrier material may be exposed to a silicon-containing reducing gas during a pre-soak process or a post-soak process. In some examples, the barrier material may be exposed to a plasma treatment during the pre-soak process or the post-soak process.

In an alternative embodiment, a method for forming a metallic silicide containing material on a substrate is provided which includes exposing a substrate to at least one preclean process to expose a silicon-containing surface, depositing a metallic silicide material on the silicon-containing surface during a chemical vapor deposition process or an atomic layer deposition process, expose the substrate to an annealing process, depositing a barrier material on the metallic silicide material, and depositing a tungsten contact material on the barrier material. The metallic silicide material may contain at least one element of cobalt, nickel, platinum, palladium, rhodium, alloys thereof, or combinations thereof. The examples provide that the substrate, the metallic silicide material, or the barrier material may be exposed to a silicon-containing reducing gas during a pre-soak process or a post-soak process. In some examples, the substrate may be exposed to a plasma treatment during the pre-soak process or the post-soak process. In one example, a substrate may be optionally exposed to a treatment or a preclean process, a metallic silicide material is deposited on the substrate, the substrate may be optionally exposed to a treatment, a metallic material or a barrier material may be deposited over the metallic silicide material, and the substrate may be optionally exposed to a treatment.

Example 1

Cobalt Silicide Material

In one example, a cobalt silicide material may be deposited by a thermal CVD process. Purge gas may be flowed through different portions of the deposition chamber. At least one purge gas may be flowed throughout the deposition chamber, such as a bottom purge flowing a purge gas across the bottom the deposition chamber and an edge purge flowing another purge gas across the edge ring. For example, a bottom purge may flow argon having a flow rate of about 1,000 sccm across the bottom the deposition chamber and an edge purge may flow argon having a flow rate of about 100 sccm across the edge ring.

The substrate may be heated to a temperature within a range from about 350° C. to about 550° C. and the ampoule containing the cobalt precursor may be heated to a temperature of about 30° C. The substrate may be exposed to a deposition gas containing a cobalt precursor, a silicon precursor, hydrogen, and a carrier gas. The cobalt precursor may be a cobalt carbonyl compound (e.g., $CpCo(CO)_2$ or CCTBA), the silicon precursor may be silane or disilane, and the carrier gas may be argon, nitrogen, hydrogen, or combinations thereof.

The substrate was heated in a deposition chamber to about 400° C. and an ampoule containing cobalt precursor $CpCo(CO)_2$ was heated to about 30° C. An argon carrier gas having a flow rate of about 500 sccm was passed through the cobalt precursor to form a cobalt precursor gas. A deposition gas was formed by combining the cobalt precursor gas with hydrogen gas having a flow rate of about 3,000 sccm and a silicon precursor gas containing silane having a flow rate of about 1,000 sccm and an argon carrier gas having a flow rate of about 1,000 sccm. The substrate was exposed to the deposition gas for about 5 seconds to form a cobalt silicide layer on the substrate.

The deposition chamber was purged with a gas mixture of argon having a flow rate of about 500 sccm and hydrogen gas having a flow rate of about 3,000 sccm for about 2 seconds. Thereafter, the deposition chamber was purged with hydrogen gas having a flow rate of about 3,000 sccm for about 2 seconds.

The substrate was exposed to a hydrogen plasma for about 30 seconds. The hydrogen plasma was formed by flowing hydrogen gas having a flow rate of about 3,000 sccm into the deposition chamber and igniting the plasma. The plasma was ignited by a RF generator having a frequency of 350 kHz set with a power output of about 1,200 watts.

The substrate was exposed to a silicon-reducing gas for about 10 seconds during a soak process. The silicon-reducing gas contained silane having a flow rate of about 1,000 sccm, argon having a flow rate of about 1,000 sccm, and hydrogen having a flow rate of about 3,000 sccm.

Subsequently, the deposition chamber was purged with hydrogen gas having a flow rate of about 3,000 sccm and argon having a flow rate of about 1,000 sccm for about 2 seconds to complete a first cycle. The deposited cobalt silicide layer was about 8 Å thick. The deposition cycle was repeated 5 additional times to form a deposited cobalt silicide material having a thickness of about 50 Å thick.

Example 2

Metallic Cobalt Material

In another example, a metallic cobalt material may be deposited by a thermal CVD process. Purge gas may be flowed through different portions of the deposition chamber. At least one purge gas may be flowed throughout the deposition chamber, such as a bottom purge flowing a purge gas across the bottom the deposition chamber and an edge purge flowing another purge gas across the edge ring. For example, a bottom purge may flow argon having a flow rate of about 1,000 sccm across the bottom the deposition chamber and an edge purge may flow argon having a flow rate of about 100 sccm across the edge ring.

The substrate may be heated to a temperature within a range from about 350° C. to about 550° C. and the ampoule containing the cobalt precursor may be heated to a temperature of about 30° C. The substrate may be exposed to a deposition gas containing a cobalt precursor, hydrogen, and a carrier gas. The cobalt precursor may be a cobalt carbonyl compound (e.g., $CpCo(CO)_2$ or CCTBA) and the carrier gas may be argon, nitrogen, hydrogen, or combinations thereof.

The substrate was heated in a deposition chamber to about 400° C. and an ampoule containing cobalt precursor CpCo $(CO)_2$ was heated to about 30° C. An argon carrier gas having a flow rate of about 500 sccm was passed through the cobalt precursor to form a cobalt precursor gas. A deposition gas was formed by combining the cobalt precursor gas, hydrogen gas having a flow rate of about 3,000 sccm, and argon having a flow rate of about 1,000 sccm. The substrate was exposed to the deposition gas for about 5 seconds to form a metallic cobalt layer on the substrate.

The deposition chamber was purged with a gas mixture of argon having a flow rate of about 500 sccm and hydrogen gas having a flow rate of about 3,000 sccm for about 2 seconds. Thereafter, the deposition chamber was purged with hydrogen gas having a flow rate of about 3,000 sccm for about 2 seconds.

The substrate was exposed to a hydrogen plasma for about 30 seconds. The hydrogen plasma was formed by flowing hydrogen gas having a flow rate of about 3,000 sccm into the deposition chamber and igniting the plasma. The plasma was ignited by a RF generator having a frequency of 350 kHz set with a power output of about 1,200 watts.

Subsequently, the deposition chamber was purged with hydrogen gas having a flow rate of about 3,000 sccm and argon having a flow rate of about 1,000 sccm for about 2 seconds to complete a first cycle. The deposited metallic cobalt layer was about 10 Å thick. The deposition cycle was repeated 5 additional times to form a deposited metallic cobalt material having a thickness of about 60 Å thick.

Deposition of Metallic Contact Material

FIGS. 17F and 17H illustrate substrate 1700 having contact aperture 1710 filled with metallic contact material 1740. Metallic contact material 1740 may be deposited during one deposition process or multiple processes within steps 1040, 1150, 1250, 1340, 1440, 1550, 1640, or 1930. In another embodiment, a metallic contact material may be deposited during one deposition process or multiple processes within steps 2440 or 2650. Metallic contact material 1740 may contain copper, tungsten, aluminum, or an alloy thereof and may be formed using one or more suitable deposition processes. In one embodiment, for example, metallic contact material 1740 may contain a seed layer and a bulk layer formed on cobalt silicide material 1720 or metallic cobalt material 1730 by using one or more deposition process that include a CVD process, an ALD process, a PVD process, an electroless deposition process, an electrochemical plating (ECP) process, a derivative thereof or a combination thereof. Substrate 1700 may be exposed to pretreatment process, such as a soaking process, prior to depositing cobalt silicide material 1720 or metallic cobalt material 1730, as well as prior to depositing metallic contact material 1740, including a pre-nucleation soak process to cobalt silicide material 1720 or metallic cobalt material 1730 and a post-nucleation soak process to a seed layer. Further disclosure of processes for depositing a tungsten material on a transition metal seed layer is further described in commonly assigned and co-pending U.S. Ser. No. 11/009,331, filed Dec. 10, 2004, and published as US 2006-0128150, which is herein incorporated by reference in its entirety.

In one embodiment, metallic contact material 1740 preferably contains copper or a copper alloy. For example, a copper seed layer may be formed on cobalt silicide material 1720 or metallic cobalt material 1730 by a CVD process and thereafter, bulk copper is deposited to fill the interconnect by an ECP process. In another example, a copper seed layer may be formed on cobalt silicide material 1720 or metallic cobalt material 1730 by a PVD process and thereafter, bulk copper is deposited to fill the interconnect by an ECP process. In another example, a copper seed layer may be formed on cobalt silicide material 1720 or metallic cobalt material 1730 by an electroless process and thereafter, bulk copper is deposited to fill the interconnect by an ECP process. In another example, cobalt silicide material 1720 or metallic cobalt material 1730 serves as a seed layer to which a copper bulk fill is directly deposited by an ECP process or an electroless deposition process.

In another embodiment, metallic contact material 1740 preferably contains tungsten or a tungsten alloy. For example, a tungsten seed layer may be formed on cobalt silicide material 1720 or metallic cobalt material 1730 by an ALD process and thereafter, bulk tungsten is deposited to fill the interconnect by a CVD process or a pulsed-CVD process. In another example, a tungsten seed layer may be formed on cobalt silicide material 1720 or metallic cobalt material 1730 by a PVD process and thereafter, bulk tungsten is deposited to fill the interconnect by a CVD process or a pulsed-CVD process. In another example, a tungsten seed layer may be formed on cobalt silicide material 1720 or metallic cobalt material 1730 by an ALD process and thereafter, bulk tungsten is deposited to fill the interconnect by an ECP process. In another example, cobalt silicide material 1720 or metallic cobalt material 1730 serves as a seed layer to which a tungsten bulk fill is directly deposited by a CVD process or a pulsed-CVD process.

In another embodiment, metallic contact material 1740 preferably contains a tungsten nitride material and a metallic tungsten material or a tungsten alloy. A tungsten nitride layer may be deposited on cobalt silicide material 1720 or metallic cobalt material 1730, thereafter, at least one tungsten material may be deposited on the tungsten nitride layer, such as a tungsten seed layer and a bulk tungsten layer. For example, a tungsten nitride layer may be formed on cobalt silicide material 1720 or metallic cobalt material 1730 by an ALD process, a tungsten seed layer may be formed on the tungsten nitride layer by an ALD process, and thereafter, bulk tungsten is deposited to fill the interconnect by a CVD process or a pulsed-CVD process. In another example, a tungsten nitride layer may be formed on cobalt silicide material 1720 or metallic cobalt material 1730 by a PVD process, a tungsten seed layer may be formed on the tungsten nitride layer by an ALD process, and thereafter, bulk tungsten is deposited to fill the interconnect by a CVD process or a pulsed-CVD process. In another example, a tungsten nitride layer may be formed on cobalt silicide material 1720 or metallic cobalt material 1730 by an ALD process, a tungsten seed layer may be formed on the tungsten nitride layer by a PVD process, and thereafter, bulk tungsten is deposited to fill the interconnect by a CVD process or a pulsed-CVD process.

In another example, a tungsten nitride layer may be formed on cobalt silicide material 1720 or metallic cobalt material 1730 by a PVD process, a tungsten seed layer may be formed on the tungsten nitride layer by an ALD process, and thereafter, bulk tungsten is deposited to fill the interconnect by an ECP process. In another example, a tungsten nitride layer may be formed on cobalt silicide material 1720 or metallic cobalt material 1730 by an ALD process, a tungsten seed layer may be formed on the tungsten nitride layer by a PVD process, and thereafter, bulk tungsten is deposited to fill the interconnect by an ECP process. In another example, the tungsten nitride layer may be deposited by an ALD process or a PVD process and a tungsten bulk fill is directly deposited to the tungsten nitride layer by a CVD process or a pulsed-CVD process.

In one embodiment, processing platform system 1835 contains a plurality of processing chambers 1836, 1838, 1840, 1841, 1842, and 1843, disposed on transfer chambers 1848 and 1850, as depicted in FIG. 18. In one example, processing chamber 1836 is a CVD chamber for depositing a cobalt silicide material, processing chamber 1838 is a CVD chamber for depositing a metallic cobalt material, processing chamber 1840 is an ALD chamber for depositing a barrier layer (e.g., Ta/TaN), processing chamber 1841 is an ALD chamber for depositing a tungsten nucleation layer, processing chamber 1842 is a preclean chamber, processing chamber 1843 is a CVD chamber for depositing a tungsten bulk layer. An annealing process may be done in any of processing chambers 1836, 1838, 1840, 1841, 1842, or 1843. The substrates may be transferred between processing chambers 1836, 1838, 1840, 1841, 1842, and 1843 within processing platform system 1835 without breaking a vacuum or exposing the substrates to other external environmental conditions.

In another example, processing chamber 1836 is an annealing chamber for annealing the substrate, processing chamber 1838 is a CVD chamber for depositing a cobalt silicide material and a metallic cobalt material, processing chamber 1840 is a PVD chamber for depositing a barrier layer (e.g., Ti/TiN), processing chamber 1841 is an ALD chamber for depositing a tungsten nucleation layer, processing chamber 1842 is a preclean chamber, processing chamber 1843 is a CVD chamber for depositing a tungsten bulk layer. An annealing process may be done in any of processing chambers 1836, 1838, 1840, 1841, 1842, or 1843.

In another example, processing chamber 1836 is an annealing chamber for annealing the substrate, processing chamber 1838 is a CVD chamber for depositing a cobalt silicide material and a metallic cobalt material, processing chamber 1840 is a PVD chamber for depositing a barrier layer (e.g., Ta/TaN), processing chamber 1841 is a PVD chamber for depositing a copper nucleation layer, processing chamber 1842 is a preclean chamber, processing chamber 1843 is an electroless deposition chamber for depositing a copper bulk layer. An annealing process may be done in any of processing chambers 1836, 1838, 1840, 1841, 1842, or 1843.

In another example, processing chamber 1836 is an annealing chamber for annealing the substrate, processing chamber 1838 is a CVD chamber for depositing a cobalt silicide material and a metallic cobalt material, processing chamber 1840 is an ALD chamber for depositing a barrier layer (e.g., Ta/TaN), processing chamber 1841 is an ALD chamber for depositing a ruthenium nucleation layer, processing chamber 1842 is a preclean chamber, processing chamber 1843 is an electroless deposition chamber for depositing a copper bulk layer. An annealing process may be done in any of processing chambers 1836, 1838, 1840, 1841, 1842, or 1843.

In another example, processing chamber 1836 is an ALD chamber for depositing a cobalt silicide material, processing chamber 1838 is a CVD chamber for depositing a metallic cobalt material, processing chamber 1840 is an ALD chamber for depositing a barrier layer (e.g., Ta/TaN), processing chamber 1841 is an ALD chamber for depositing a ruthenium nucleation layer, processing chamber 1842 is a preclean chamber, processing chamber 1843 is an electroless deposition chamber for depositing a copper bulk layer. An annealing process may be done in any of processing chambers 1836, 1838, 1840, 1841, 1842, or 1843.

Annealing Process

In one embodiment, substrate 1700 or other substrates may be exposed to at least one annealing process during steps 1140, 1230, 1360, 1450, 1530, 1630, or 2630. In other embodiments, substrate 1700 may be exposed an annealing process prior to, during, or subsequently to the deposition of cobalt silicide materials, metallic cobalt materials, other cobalt containing materials, or metallic contact materials. In one embodiment, substrate 1700 may be transferred to an annealing chamber, such as the CENTURA® RADIANCE® RTP chamber or a rapid thermal annealing (RTA) chamber, both available from Applied Materials, Inc., located in Santa Clara, Calif., and exposed to the thermal annealing process. The annealing chamber may be on the same cluster tool as the deposition chamber and/or the nitridation chamber, such that substrate 1700 may be annealed without being exposed to the ambient environment. In one embodiment, degas chambers 1844 may be used during the annealing processes. In another embodiment, chambers 1836 and 1842 may be used during the annealing processes.

Substrate 1700 may be heated to a temperature within a range from about 600° C. to about 1,200° C., preferably, from about 700° C. to about 1,150° C., and more preferably, from about 800° C. to about 1,000° C. The thermal annealing process may last for a time period within a range from about 1 second to about 120 seconds, preferably, from about 2 seconds to about 60 seconds, and more preferably, from about 5 seconds to about 30 seconds. Generally, the chamber atmosphere contains at least one annealing gas, such as nitrogen, hydrogen, argon, helium, forming gas, derivatives thereof, or combinations thereof. The process chamber may have a pressure within a range from about 5 Torr to about 100 Torr, for example, about 10 Torr. In one example of a thermal annealing process, substrate 1700 is heated to a temperature of about 1,050° C. for about 15 seconds within an inert atmosphere. In another example, substrate 1700 is heated to a temperature of about 1,100° C. for about 25 seconds within an inert atmosphere.

In one embodiment, the thermal annealing process converts metallic cobalt material 1715 to cobalt silicide material 1720, as depicted in FIGS. 17C-17D. In one example, a cobalt silicide material may have a film thickness within a range from about 1 Å to about 200 Å, preferably from about 3 Å to about 80 Å, and more preferably from about 5 Å to about 30 Å. In another example, a metallic cobalt material may have a film thickness within a range from about 1 Å to about 300 Å, preferably, from about 5 Å to about 100 Å, and more preferably, from about 10 Å to about 50 Å.

In another embodiment, substrate 1700 may be exposed to at least one plasma annealing process during steps 1140, 1230, 1360, 1450, 1530, or 1630. In other embodiments, substrate 1700 may be exposed a plasma annealing process prior to, during, or subsequently to the deposition of cobalt silicide materials, metallic cobalt materials, other cobalt containing materials, or metallic contact materials. The plasma may be generated in situ the processing chamber or may be generated remotely and delivered into the processing, such as by a RPS. The plasma chamber may be on the same cluster tool as the deposition chamber and/or the nitridation chamber, such that substrate 1700 may be annealed without being exposed to the ambient environment. In one embodiment, chambers 1836 and 1842 may be used during the plasma annealing processes.

Etching or Planarization Process

In one embodiment, substrate 1700 may be exposed to at least one etching process or planarization process during steps 1050, 1160, 1260, 1350, 1460, 1560, 1650, 1940, or 2660 to remove materials from substrate field 1745 of substrate 1700, as depicted in FIG. 17G. A portion of the deposited material of cobalt silicide material 1720, metallic cobalt material 1730, metallic contact material 1740, other cobalt containing materials, or metallic contact materials. Etching processes include wet or dry etching processes, such as etchback processes available from Applied Materials, Inc., located in Santa Clara, Calif. Planarization processes may include mechanical polishing, chemical mechanical polishing (CMP), electro-CMP (ECMP), reactive ion etching (RIE), or other known techniques used to planarize substrates. Specific processes and compositions are predetermined and may vary based on the composition of metallic contact material 1740 (e.g., Cu, W, Al, or alloys thereof). A further description of planarization processes that may be used during embodiments herein are further disclosed in commonly assigned U.S. Ser. No. 10/948,958, filed Sep. 24, 2004, and published as US-2006-0021974, and commonly assigned U.S. Ser. No. 11/130,032, filed May 16, 2005, and published as US 2005-0233578, which are herein incorporated by reference in their entirety.

Barrier Layer Deposition

In an alternative embodiment, a barrier layer may be formed on metallic cobalt material 1730 prior to depositing metallic contact material 1740. The barrier layer may be deposited after step 1030 and before step 1040 of process 1000, after step 1130 and before step 1150 of process 1100, after step 1240 and before step 1250 of process 1200, after step 1330 and before step 1340 of process 1300, after step 1430 and before step 1440 of process 1400, after step 1540 and before step 1550 of process 1500, after step 1620 and before step 1640 of process 1600. In another alternative embodiment, a barrier layer may be formed on cobalt silicide material 1720 prior to depositing metallic contact material 1740. In another embodiment, the barrier layer may be deposited after step 1920 and before step 1930 during process 1900. In another embodiment, the barrier layer may be deposited in step 2640 during process 2600.

The barrier layer may include one or more barrier materials such as, for example, tantalum, tantalum nitride, tantalum silicon nitride, titanium, titanium nitride, titanium silicon nitride, tungsten, tungsten nitride, silicon nitride, ruthenium, derivatives thereof, alloys thereof, or combinations thereof. In some embodiments, the barrier material may contain cobalt or cobalt silicide. The barrier layer may be formed/deposited using a suitable deposition process, such as ALD, CVD, PVD, or electroless deposition. For example, tantalum nitride may be deposited using a CVD process or an ALD process wherein tantalum-containing compound or tantalum precursor (e.g., PDMAT) and nitrogen-containing compound or nitrogen precursor (e.g., ammonia) are reacted. In one embodiment, tantalum and/or tantalum nitride is deposited as a barrier layer by an ALD process as described in commonly assigned U.S. Ser. No. 10/281,079, entitled "Gas Delivery Apparatus for Atomic Layer Deposition," filed Oct. 25, 2002, and published as US 2003-0121608, which is herein incorporated by reference. In one example, a Ta/TaN bilayer may be deposited as a barrier layer material, such as a metallic tantalum layer and a tantalum nitride layer that are independently deposited by ALD, CVD, and/or PVD processes, one layer on top of the other layer, in either order. In another example, a Ti/TiN bilayer may be deposited as a barrier layer material, such as a metallic titanium layer and a titanium nitride layer that are independently deposited by ALD, CVD, and/or PVD processes, one layer on top of the other layer, in either order. In another example, a W/WN bilayer may be deposited as a barrier layer material, such as a metallic tungsten layer and a tungsten nitride layer that are independently deposited by ALD, CVD, and/or PVD processes, one layer on top of the other layer, in either order.

"Substrate surface" or "substrate," as used herein, refers to any substrate or material surface formed on a substrate upon which film processing is performed during a fabrication process. For example, a substrate surface on which processing may be performed include materials such as monocrystalline, polycrystalline or amorphous silicon, strained silicon, silicon on insulator (SOI), doped silicon, silicon germanium, germanium, gallium arsenide, glass, sapphire, silicon oxide, silicon nitride, silicon oxynitride, and/or carbon doped silicon oxides, such as $SiO_xC_y$, for example, BLACK DIAMOND® low-k dielectric, available from Applied Materials, Inc., located in Santa Clara, Calif. Substrates may have various dimensions, such as 200 mm or 300 mm diameter wafers, as well as, rectangular or square panes. Unless otherwise noted, embodiments and examples described herein are preferably conducted on substrates with a 200 mm diameter or a 300 mm diameter, more preferably, a 300 mm diameter. Embodiments of the processes described herein deposit cobalt silicide materials, metallic cobalt materials, and other cobalt-containing materials on many substrates and surfaces, especially, silicon-containing dielectric materials. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, and patterned or non-patterned wafers. Substrates may be exposed to a pretreatment process to polish, etch, reduce, oxidize, hydroxylate, anneal, and/or bake the substrate surface.

"Atomic layer deposition" or "cyclical deposition" as used herein refers to the sequential introduction of two or more reactive compounds to deposit a layer of material on a substrate surface. The two, three or more reactive compounds may alternatively be introduced into a reaction zone of a process chamber. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as nitrogen, is introduced into the process chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. In alternative embodiments, the purge gas may also be a reducing agent, such as hydrogen or silane. The reactive compounds are alternatively pulsed until a desired film or film thickness is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness. In another embodiment, a first precursor containing compound A, a second precursor containing compound B, and a third precursor containing compound C are each separately and alternatively pulsed into the process chamber. Alternatively, a first precursor containing compound A and a second precursor containing compound B are each separately and alternatively pulsed into the process chamber while, and a third precursor containing compound C is continuously flowed into the process chamber. Alternatively, a pulse of a first precursor may overlap in time with a pulse of a second precursor while a pulse of a third precursor does not overlap in time with either pulse of the first and second precursors.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the process chamber employed, the vacuum system coupled thereto, and the volatility/reactivity of the particular compound itself. A "half-reaction" as used herein to refer to a pulse of a precursor followed by a purge step.

While the foregoing is directed to embodiments of the invention, other and further embodiments of the invention may be devised without departing from the basic scope thereof, and the scope thereof is determined by the claims that follow.

The invention claimed is:

1. A method of forming a copper material on a substrate, sequentially comprising:
    exposing the substrate to a plasma cleaning process comprising argon;
    depositing a tantalum nitride layer over the substrate by a vapor deposition process;
    depositing a cobalt layer having a thickness within a range from about 10 angstroms to about 100 angstroms over the substrate during a chemical vapor deposition process, wherein the substrate is sequentially exposed to a reducing agent and either dicobalt hexacarbonyl butylacetylene or cyclopentadienyl cobalt bis(carbonyl) during the chemical vapor deposition process;
    exposing the cobalt layer to a plasma; and
    depositing a copper layer over the substrate during an electrochemical plating process.

2. The method of claim 1, further comprising performing an etching process after the depositing a copper layer.

3. The method of claim 1, wherein the plasma cleaning process is generated at a power setting between about 500 watts and about 2000 watts.

4. The method of claim 3, wherein the cobalt layer has a thickness within a range from about 40 angstroms to about 50 angstroms.

5. The method of claim 1, further comprising depositing a tantalum layer prior to depositing the tantalum nitride layer.

6. The method of claim 5, wherein the depositing a copper layer comprises:
    depositing a copper seed layer by physical vapor deposition; and
    depositing a copper bulk layer on the copper seed layer by electrochemical plating.

7. The method of claim 1, wherein the exposing the substrate to the plasma cleaning process comprises cyclically generating a plasma from argon and purging the argon from a process chamber.

8. The method of claim 1, further comprising exposing the tantalum nitride layer to a plasma comprising argon and hydrogen during a plasma treatment process.

9. The method of claim 1, wherein exposing the cobalt layer to a plasma comprises exposing the cobalt layer to argon, hydrogen or combinations thereof.

10. The method of claim 1, wherein the vapor deposition process is one selected from the group consisting of physical vapor deposition, atomic layer deposition and chemical vapor deposition.

* * * * *

UNITED STATES PATENT AND TRADEMARK OFFICE
CERTIFICATE OF CORRECTION

PATENT NO. : 8,815,724 B2
APPLICATION NO. : 13/452237
DATED : August 26, 2014
INVENTOR(S) : Ganguli et al.

It is certified that error appears in the above-identified patent and that said Letters Patent is hereby corrected as shown below:

Title Page, item (75) Inventors:

Please delete "Sang-ho" and insert --Sang-Ho-- therefor;

In the Specification:

Column 24, Line 28, please delete "17A-171" and insert --17A-17I-- therefor;

Column 24, Line 29, please delete "17A-171" and insert --17A-17I-- therefor.

Signed and Sealed this
Twenty-third Day of December, 2014

Michelle K. Lee
*Deputy Director of the United States Patent and Trademark Office*